(12) United States Patent
Asano et al.

(10) Patent No.: US 6,426,255 B1
(45) Date of Patent: Jul. 30, 2002

(54) PROCESS FOR MAKING A SEMICONDUCTOR INTEGRATED CIRCUIT DEVICE HAVING A DYNAMIC RANDOM ACCESS MEMORY

(75) Inventors: Isamu Asano, Iruma; Yoshitaka Nakamura, Ome; Yuzuru Ohji, Hinode; Tatsuyuki Saito, Ome; Takashi Yunogami, Niiza, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/549,085

(22) Filed: Apr. 13, 2000

(30) Foreign Application Priority Data

Apr. 30, 1999 (JP) .................................... 11-123927

(51) Int. Cl.$^7$ .......................................... H01L 21/8242
(52) U.S. Cl. .................. 438/253; 257/306; 257/295; 438/197
(58) Field of Search ................. 438/253, 197, 438/396; 257/295, 306

(56) References Cited

U.S. PATENT DOCUMENTS 6,064,469 A * 4/2000 Yamazaki et al. .......... 257/306
6,144,053 A * 11/2000 Tsunemine .................. 257/295
6,201,271 B1 * 3/2001 Okutoh et al. .............. 257/295

FOREIGN PATENT DOCUMENTS

| JP | H.9-95791 | * | 4/1997 |
| JP | 10289985 | | 10/1998 |

* cited by examiner

Primary Examiner—David Nelms
Assistant Examiner—Thao P Le
(74) Attorney, Agent, or Firm—Antonelli, Terry, Stout & Kraus, LLP

(57) ABSTRACT

After formation of a groove in a silicon oxide film, a Pt film is formed inside of the groove by electroplating using a conductive underlying film, which has been formed in advance below the silicon oxide film, as a cathode electrode. The silicon oxide film is then removed by etching, followed by dry etching of the conductive underlying film with the Pt film as a mask, whereby a lower electrode of a capacitor is formed from the Pt film and the conductive underlying film which has remained below the Pt film.

38 Claims, 59 Drawing Sheets

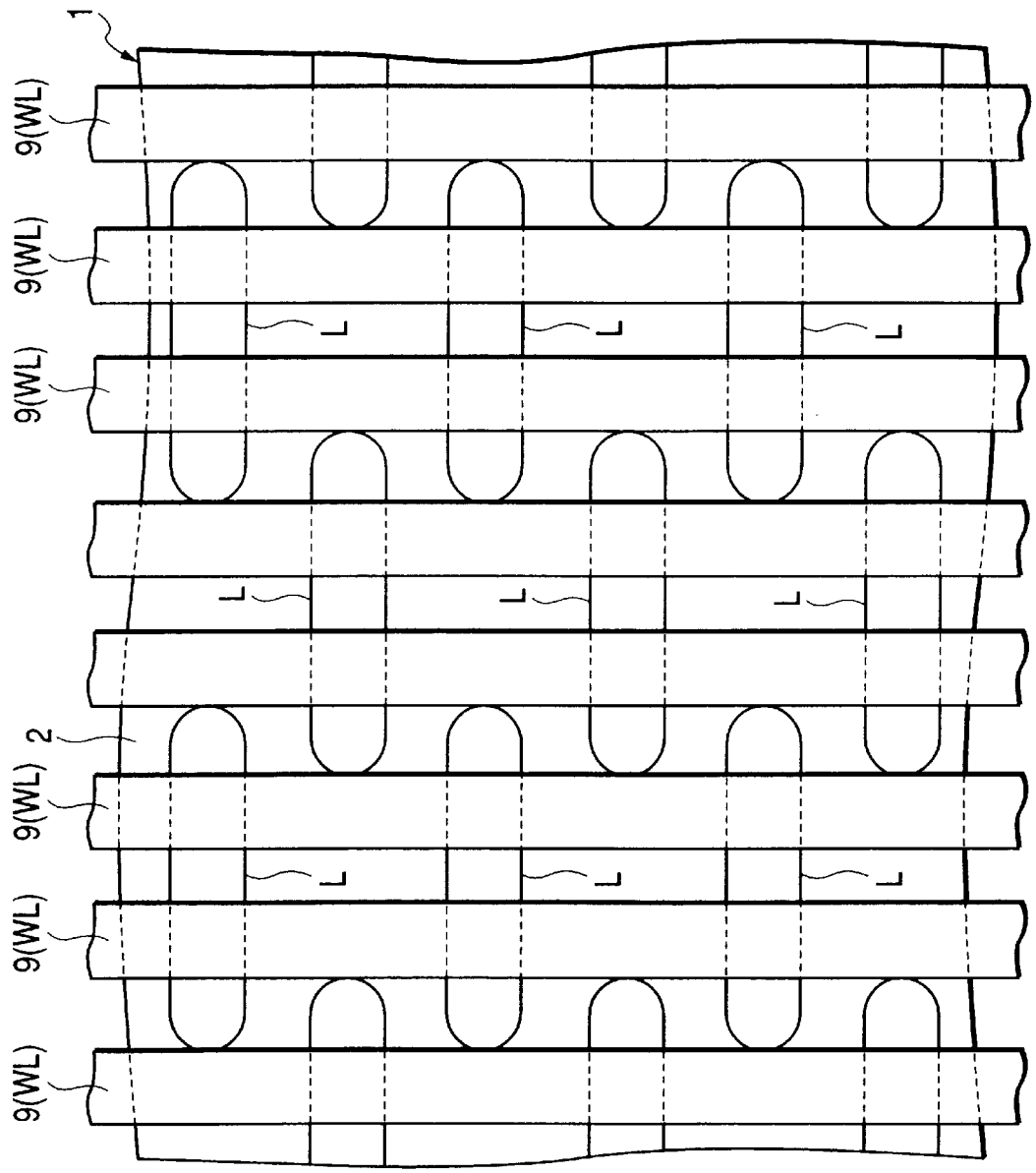

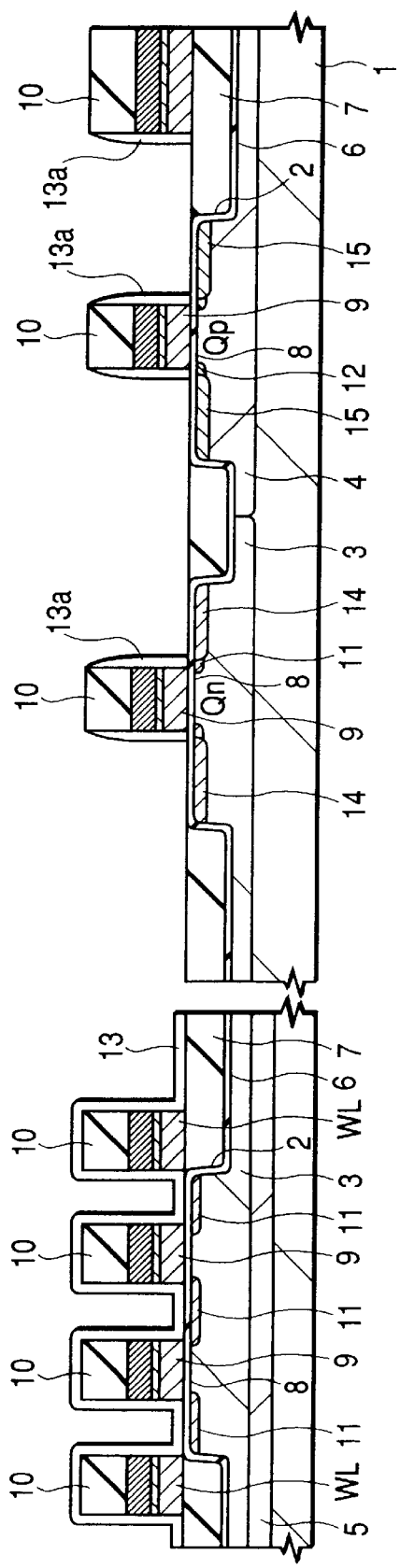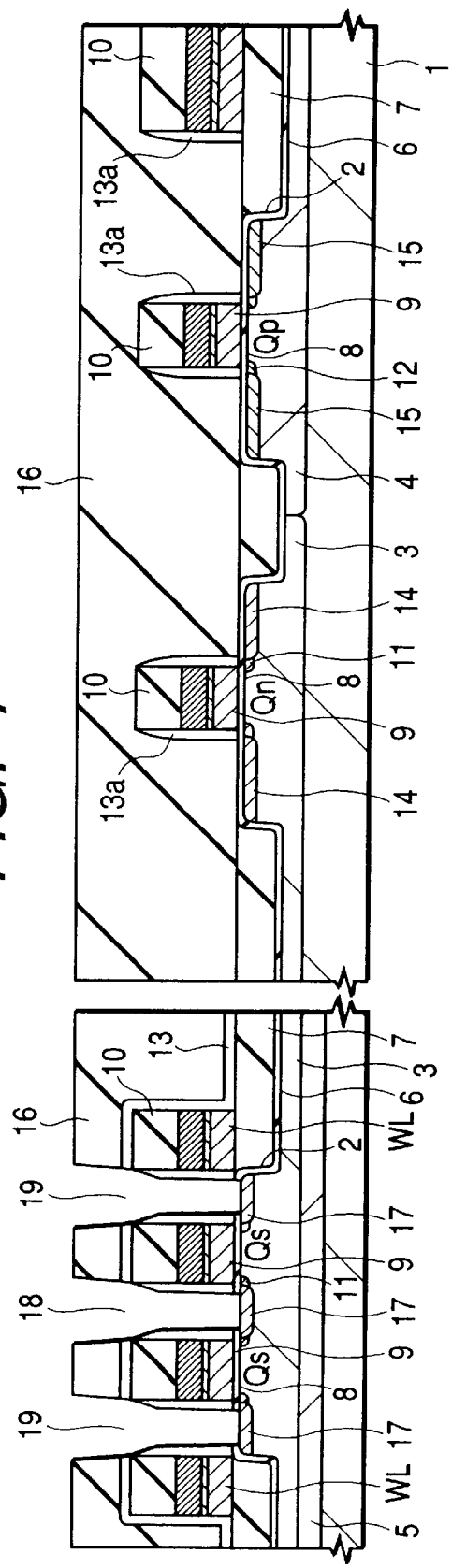

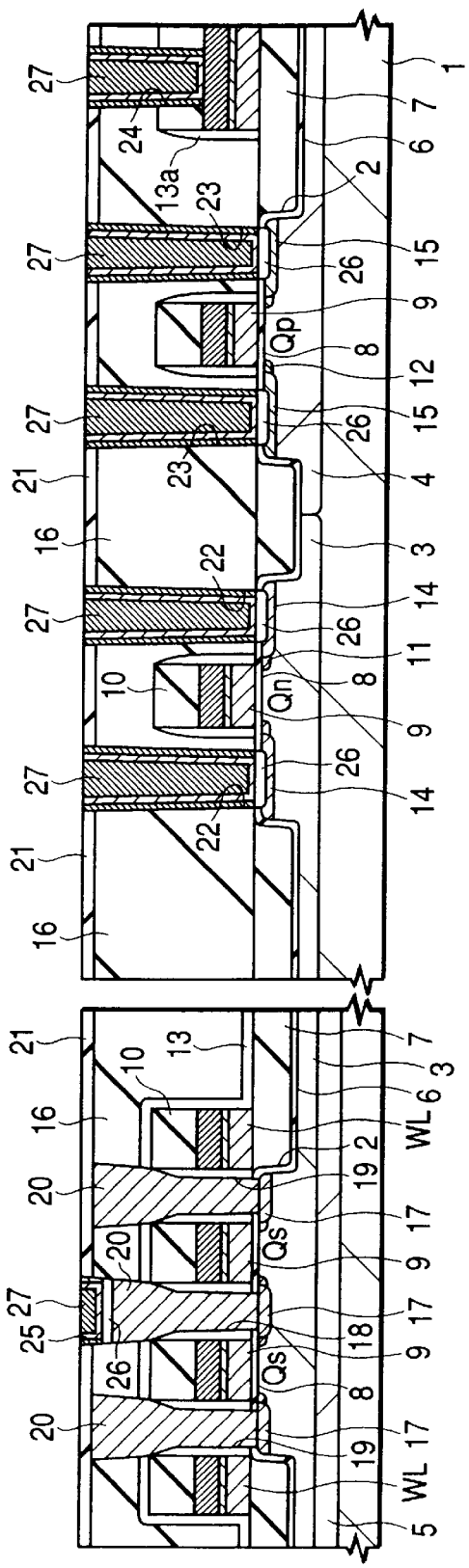
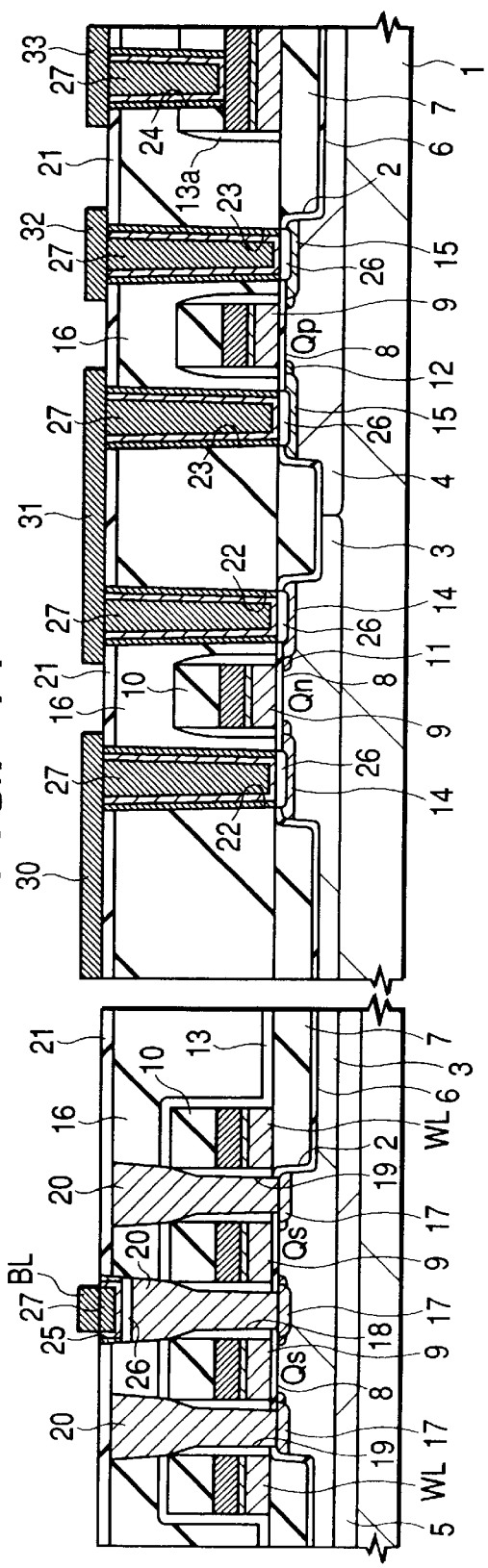

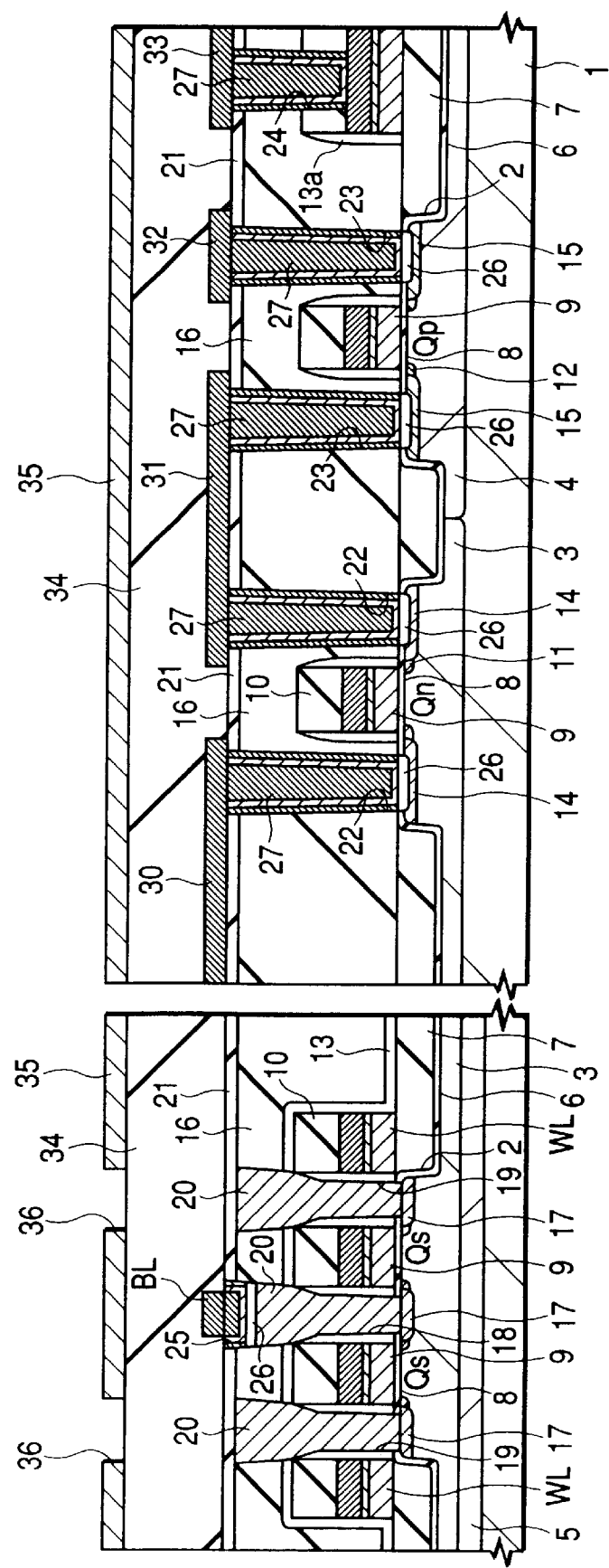

FIG. 29
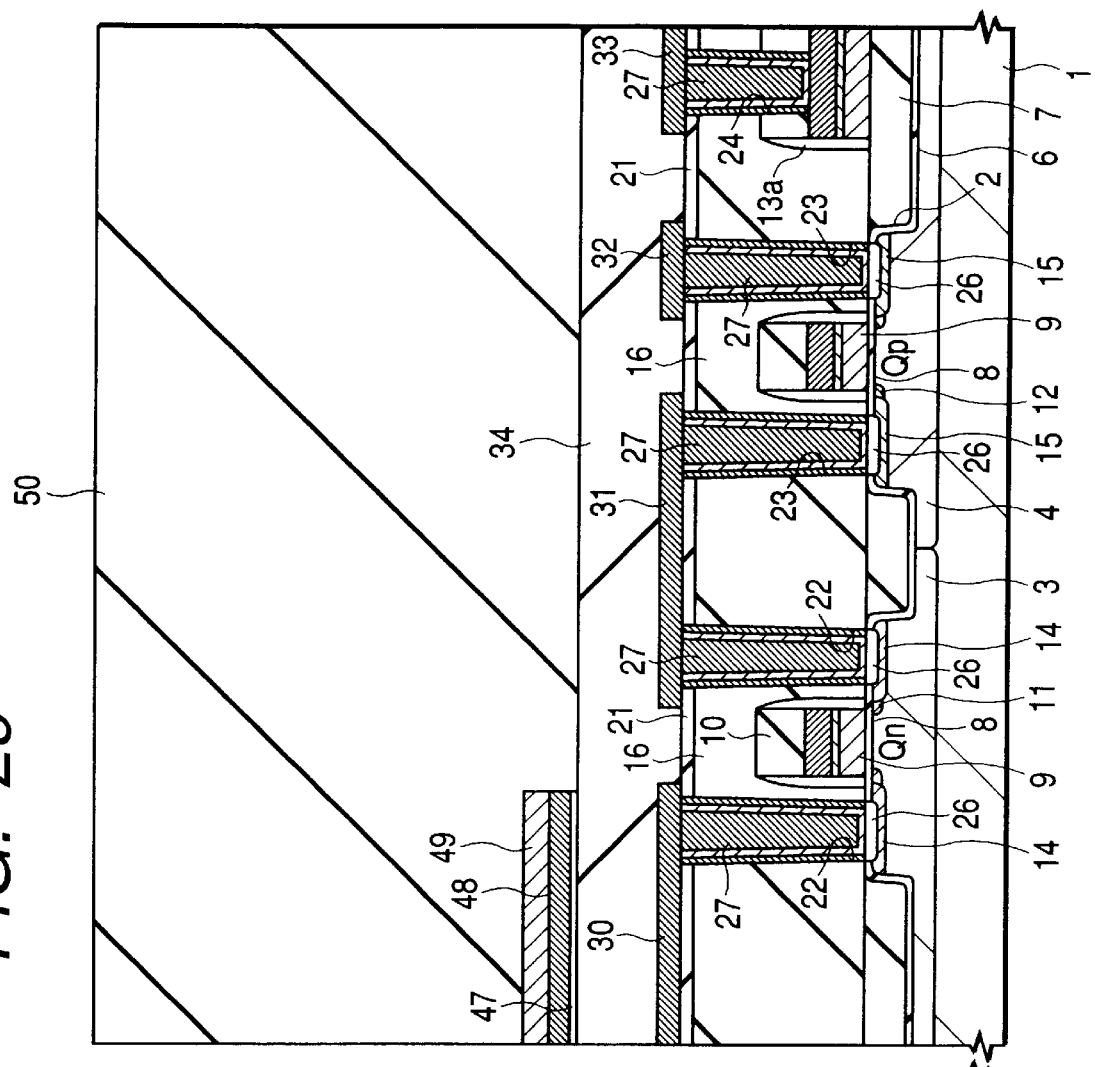
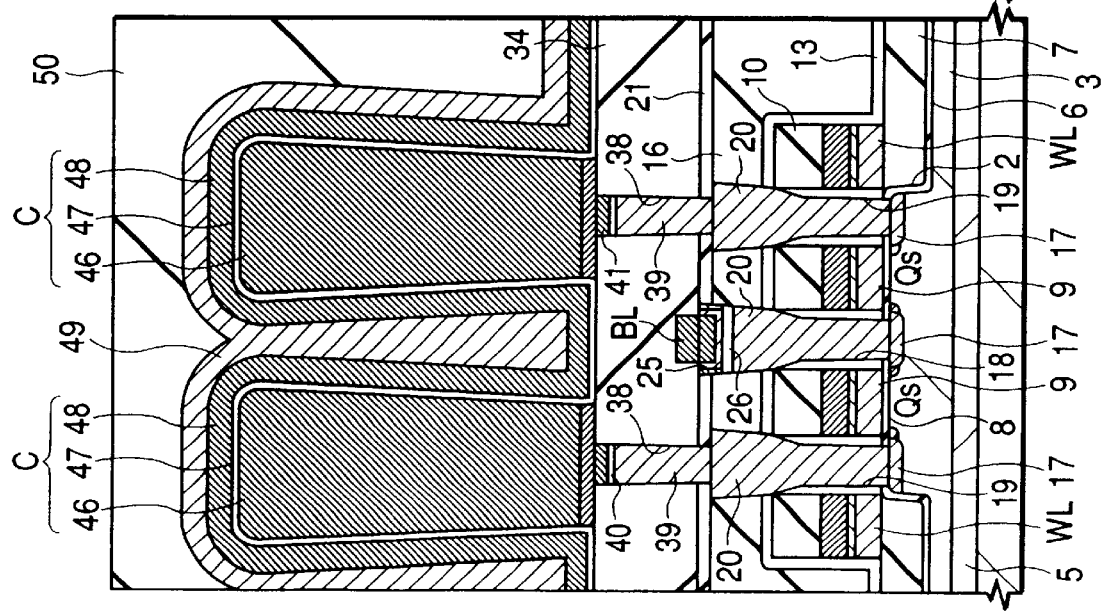

FIG. 60

FIG. 63
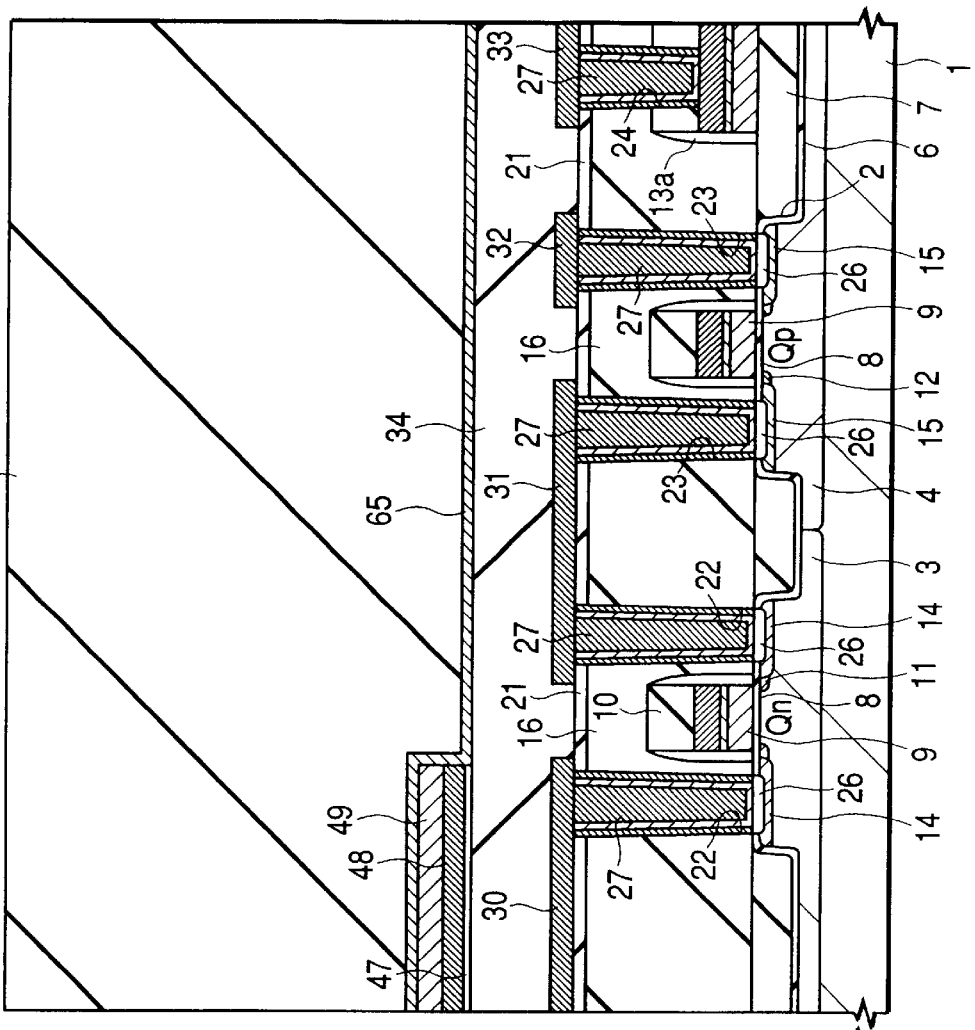
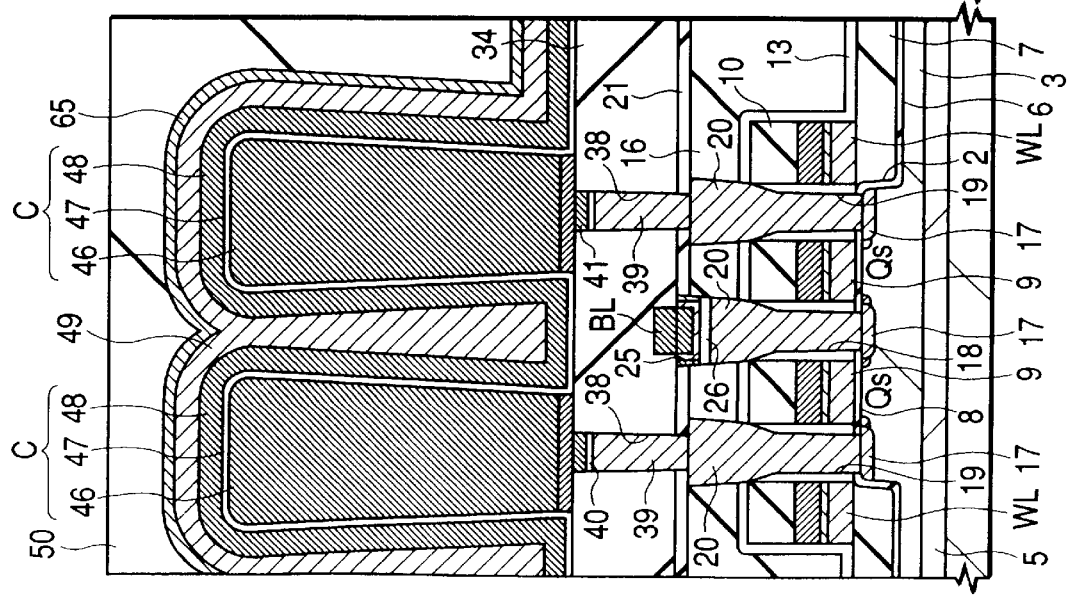

PROCESS FOR MAKING A SEMICONDUCTOR INTEGRATED CIRCUIT DEVICE HAVING A DYNAMIC RANDOM ACCESS MEMORY

BACKGROUND OF THE INVENTION

The present invention relates in general to a semiconductor integrated circuit device and a technique for manufacturing the same; and, more particularly, the invention relates to a technique which effective for use in a semiconductor integrated circuit device having a DRAM (Dynamic Random Access Memory).

Recently, with a view toward compensating for a decrease in the accumulative amount of charge in an information storing capacitor which occurs as a result of miniaturization of a memory cell, a so-called stacked capacitor structure, wherein an information storing capacitor-(capacitor) is disposed above a memory-cell selecting MISFET, has been adopted for the DRAM.

In the most up-to-date DRAM that has been miniaturized and integrated highly, however, it has come to be difficult to maintain a sufficient amount of accumulative charge simply by increasing the surface area of the information storing capacitor only by forming it in three dimensions. As a capacitative insulating film which constitutes a part of the information storing capacitor, the use of a high dielectric film or a ferroelectric film, such as PZT ($PbZr_xTi_{1-x}O_3$), PLT($PbLa_xTi_{1-x}O_3$), PLZT, $PbTiO_3$, $SrTiO_3$, $BaTiO_3$, BST ($Ba_xSr_{1-x}TiO_3$) or SBT($SrBi_2Ta_2O_9$) is therefore under investigation.

It is known, however, that since such a high dielectric film (ferroelectric film) contains a large amount of oxygen rich in reactivity, its properties tend to be deteriorated, for example, by the heat which occurs during processing, leading to a lowering of the production yield or deterioration of the retention properties (data retention properties).

When the above-described high dielectric film (or ferroelectric film) is employed for the capacitative insulating film of a capacitor, the conductive material used as an electrode material is composed mainly of a platinum metal, such as Pt (platinum), Ru (ruthenium) or Ir (iridium) or an oxide thereof.

It is the common practice to use anisotropic etching such as RIE (Reactive Ion Etching) for the patterning of a thin film made of the above-described platinum metal or oxide thereof to form an electrode. Upon anisotropic etching, a halogen gas, such as chlorine ($Cl_2$) or a mixture thereof, with an inert gas, such as Ar (argon), is used as an etching gas.

However, the patterning of a thin film made of a platinum metal or an oxide thereof by dry etching is known to have an inherent problem in that it is difficult to obtain a desired pattern with good precision, because a large amount of reaction products having a low vapor pressure are deposited onto the side walls of a pattern. Various countermeasures to overcome this problem have been proposed.

For example, as a method to prevent deterioration of the pattern accuracy, which otherwise occurs in response to deposition of reaction products having a low vapor pressure onto side walls of the pattern upon dry etching of a Pt film and a PZT film by an Ar-added chlorine gas, a method has been proposed which comprises etching with a photoresist film, which has a round outer periphery at the top portion, as a mask, carrying out an appropriate amount of over-etching and then completely removing the side-wall deposited film which has remained on the side surfaces of the pattern. The above-described photoresist film having a round outer periphery at the top portion is formed by exposing a benzophenone novolac resist to light, developing it and then thermosetting while exposing it to ultraviolet rays as needed.

SUMMARY OF THE INVENTION

As described above, when a thin-film made of a platinum metal or oxide thereof which has a poor chemical reactivity is dry-etched with a photoresist film as a mask, a large amount of a reaction product is deposited on the side walls of the resist owing to a low vapor pressure of the reaction product. The reaction product deposited on the side walls of the resist during etching is not easily removed by ions, resulting in the problem that a pattern with a desired accuracy is not obtainable by etching with a resist mask and a wet rinsing is required subsequent to the etching in order to remove the reaction product.

An object of the present invention, therefore is to provide a technique for promoting miniaturization of a DRAM having a capacitor which uses, as an electrode material, a film composed mainly of a platinum metal, platinum alloy or conductive oxide of a platinum metal.

The above-described object and the other objects, and novel features of the present invention will become apparent from the description in this specification and the drawings attached thereto.

Among the features disclosed in the present application, typical ones will be summarized as follows.

(1) The semiconductor integrated circuit device according to the present invention has a memory cell comprising a memory-cell selecting MISFET formed on the main surface of a semiconductor substrate, and a capacitor formed of a first electrode electrically connected to one of a source and a drain of the memory-cell selecting MISFET and a second electrode formed over the first electrode through a capacitative insulating film, wherein the first electrode of the capacitor is formed of a laminate film of a first conductive connector and a first conductor film formed thereover, each of the first conductive connector and the first conductor film is formed of a film composed mainly of a platinum metal, platinum alloy or conductive oxide of a platinum metal and the first conductor film is thicker than the first conductive connector.

(2) In the semiconductor integrated circuit device of the present invention according to paragraph (1), a diameter of the lower end portion of the first conductive connector constituting a part of the first electrode is not less than that of its upper end portion and the diameter of the lower end portion of the first conductor film constituting another part of the first electrode is not greater than that of its upper end portion.

(3) In the semiconductor integrated circuit device of the present invention according to paragraph (1), the first conductive connector is formed of plural conductor films.

(4) In the semiconductor integrated circuit device of the present invention according to paragraphs (1) or (3), the first conductive connector constituting a part of the first electrode is formed of a conductive film formed by CVD or sputtering, while the first conductor film constituting another part of the first electrode is formed of a conductive film formed by plating.

(5) In the semiconductor integrated circuit device of the present invention according to paragraph (1), the capacitative insulating film of the capacitor is formed on the upper surface and side surfaces of the first electrode.

(6) In the semiconductor integrated circuit device of the present invention according to any one of paragraphs (1), (2), (3) and (5), the capacitative insulating film of the capacitor is composed mainly of a high dielectric film or ferroelectric fill having a perovskite or complex perovskite crystal structure.

(7) In the semiconductor integrated circuit device of the present invention according to paragraph (6), the second electrode of the capacitor is formed of a second conductor film composed mainly of a platinum metal, platinum alloy or conductive oxide of a platinum metal.

(8) In the semiconductor integrated circuit device of the present invention according to paragraph (6), a silicon oxide insulating film and a metal interconnection are formed over the capacitor through a hydrogen-sparingly-permeable insulating film.

(9) A process for manufacturing the semiconductor integrated circuit device of the present invention comprises the following steps (a) to (f):

(a) forming a memory-selecting MISFET on the main surface of a semiconductor substrate and then forming thereover a first insulating film;

(b) forming a first connecting hole in the first insulating film and then forming, inside of the first connecting hole, a first conductive connector to be electrically connected with one of a source and a drain of the MISFET;

(c) forming a first conductive underlying film over the first insulating film and then forming thereover a second insulating film;

(d) forming a groove in the second insulating film above the first conductive connector and then forming a first conductor film over the conductive underlying film exposed at the bottom portion of the groove, thereby embedding the first conductor film inside of the groove;

(e) removing the second insulating film, and then removing the first conductive underlying film by etching with the first conductor film as a mask, thereby forming a first electrode which is formed of the first conductor film and the first conductive underlying film thereunder and is to be electrically connected with one of the source and drain of the MISFET through the first conductive connector; and (f) forming a capacitative insulating film over the first electrode to cover the upper surface and side surfaces thereof and then forming, over the capacitative insulating film, a second electrode formed of a second conductor film, thereby forming a capacitor formed of the first electrode, the capacitative insulating film and second electrode.

(10) In the process of the present invention according to paragraph (9), prior to the step of forming the groove in the second insulating film above the first conductive connector and then forming the first conductor film over the conductive underlying film exposed at the bottom portion of the groove, the first conductive underlying film exposed at the bottom portion of the groove is etched by sputtering in order to re-precipitate a portion of the first conductive underlying film on the side walls of the groove.

(11) In the process of the present invention according to paragraph (9), the shoulder portion of the lower electrode is rounded upon formation of the lower electrode by removing the first conductive underlying film by etching with the first conductor film as a mask.

(12) A process for manufacturing the semiconductor integrated circuit device of the present invention comprises the following steps (a) to (g):

(a) forming a memory-selecting MISFET on the main surface of a semiconductor substrate and then forming thereover a first insulating film;

(b) forming a first connecting hole in the first insulating film and then forming, inside of the first connecting hole, a first conductive connector to be electrically connected with one of a source and a drain of the MISFET;

(c) forming a second insulating film over the first insulating film and then forming a groove in the second insulating film above the first conductive connector;

(d) forming a first conductive underlying film over the second insulating film including the inside of the groove and then forming a first conductor film over the first conductive underlying film, thereby embedding the first conductor film inside of the groove;

(e) removing the first conductor film and first conductive underlying film over the second insulating film, thereby leaving the first conductor film and first conductive underlying film inside of the groove;

(f) removing the second insulating film, thereby forming a first electrode which is formed of the first conductor film and the first conductive underlying film formed on the bottom and side surfaces thereof and is to be electrically connected with one of a source and a drain of the MISFET through the first conductive connector, and (g) forming a capacitative insulating film over the first electrode to cover the upper surface and side surfaces thereof and then forming, over the capacitative insulating film, a second electrode formed of a second conductor film, thereby forming a capacitor formed of the first electrode, the capacitative insulating film and second electrode.

(13) In the process of the present invention according to paragraph (12), the removal of the second insulating film in the step (f) is carried out except for a portion of the second insulating film in a peripheral circuit region.

(14) In the process of the present invention according to paragraph (12), a portion of the second insulating film in a peripheral circuit region is removed upon removal of the second insulating film in the step (f).

(15) In the process of the present invention according to paragraph (12), when the second insulating film is formed of a silicon nitride insulating film and a silicon oxide insulating film formed thereover and the groove is formed in the second insulating film, the silicon oxide insulating film is etched with the silicon nitride insulating film as a stopper for etching, followed by etching of the silicon nitride insulating film.

(16) In the process of the present invention according to paragraphs (9) or (12), the first conductive underlying film is formed of a platinum metal, a platinum alloy or a conductive oxide of a platinum metal.

(17) A process for manufacturing the semiconductor integrated circuit device of the present invention comprises the following steps (a) to (h):

(a) forming a memory-selecting MISFET on the main surface of a semiconductor substrate and then forming thereover a first insulating film;

(b) forming a first connecting hole in the first insulating film and then forming, inside of the first connecting hole, a first conductive connector to be electrically connected with one of a source and a drain of the MISFET;

(c) forming a first conductive underlying film over the first insulating film and then forming thereover a second insulating film;

(d) forming a groove in the second insulating film above the first conductive connector and then forming a second conductive underlying film over the second insulating film including the inside of the groove, (e) forming a first conductor film over the second conductive underlying film, thereby embedding the first conductor film inside of the groove, (f) removing the first conductor film and second conductive underlying film over the second insulating film, thereby leaving the first conductor film and second conductive underlying film inside of the groove, (g) removing the second insulating film and then removing the first conductive underlying film by etching with the first conductor film and the second conductive underlying film as a mask, thereby forming a first electrode which is formed of the first conductor film, second conductive underlying film and the first conductive underlying film thereunder and is to be electrically connected with one of the source and drain of the MISFET through the first conductive connector; and (h) forming a capacitative insulating film over the first electrode to cover the upper surface and side surfaces thereof and then forming, over the capacitative insulating film, a second electrode formed of a second conductor film, thereby forming a capacitor formed of the first electrode, the capacitative insulating film and the second electrode.

(18) In the process of the present invention according to paragraph (17), when the lower electrode is formed by removing the first conductive underlying film by etching with the first conductor film and the second conductive underlying film as a mask, the shoulder portion of the lower electrode is rounded.

(19) In the process of the present invention according to paragraph (17), the first conductor film is formed any one of electroplating using the second conductive underlying film as a cathode electrode, electroless plating using the second conductive underlying film as a catalyst and selective CVD.

(20) In the process of the present invention according to paragraph (19), upon formation of the first conductor film by electroplating, the second conductive underlying film exposed at the end portion of the wafer is connected with a terminal on the side of a negative electrode.

(21) In the process of the present invention according to paragraph (17), the total thickness of the first conductor film and the second conductive underlying film are greater than the thickness of the first conductive underlying film.

(22) In the process of the present invention according to paragraph (17), the first conductive underlying film and the second conductive underlying film are each made of a film composed mainly of a platinum metal, a platinum alloy or a conductive oxide of a platinum metal.

(23) In the process of the present invention according to any one of paragraphs (9), (12) and (17), the step of embedding the first conductor film inside of the groove comprises two sub-steps, that is, forming the first conductor film to have a thickness not less than the depth of the groove and then polishing back the first conductor film by chemical mechanical polishing or etching it back by dry etching, thereby making the surface height of the first conductor film substantially same with that of the second insulating film.

(24) A process for manufacturing the semiconductor integrated circuit device of the present invention comprises the following steps (a) to (j):

(a) forming a memory-selecting MISFET on the main surface of a semiconductor substrate and then forming thereover a first insulating film;

(b) forming a first connecting hole in the first insulating film and then forming, inside of the first connecting hole, a first conductive connector to be electrically connected with one of a source and a drain of the MISFET;

(c) forming a first conductive underlying film over the first insulating film and then forming thereover a second insulating film;

(d) forming a groove in the second insulating film above the first conductive connector and then etching a portion of the conductive underlying film exposed at the bottom portion of the groove by sputtering, thereby re-precipitating a portion of the first conductive underlying film on the side walls of the groove;

(e) forming a first conductor film on the surface of each of the first conductive underlying film exposed at the bottom portion of the groove and the first conductive underlying film re-precipitated on the side walls of the groove;

(f) forming, over the second insulating film including the inside of the groove, a third insulating film different in an etching rate from the second insulating film and then removing the third insulating film and the first conductor film over the second insulating film, thereby leaving the third insulating film and the first conductor film inside of the groove;

(g) removing the second insulating film selectively by etching making use of the difference in an etching rate between the second insulating film and the third insulating film;

(h) by etching with the first conductive underlying film re-precipitated on the side-walls of the groove, the first conductor film formed on the surface of the first conductive underlying film and the third insulating film inside of the groove as masks, removing the first conductive underlying film over the first insulating film;

(i) removing the third insulating film, thereby forming a first electrode which is formed of the first conductor film and the first conductive underlying film and is to be electrically connected with one of the source and drain of the MISFET through the first conductive connector; and (j) forming a capacitative insulating film over the first electrode to cover the upper surface and side surfaces thereof and then forming, over the capacitative insulating film, a second electrode formed of a second conductor film, thereby forming a capacitor formed of the first electrode, the capacitative insulating film and the second electrode.

(25) In the process of the present invention according to paragraph (24), the second insulating film is formed of a silicon oxide insulating film and a silicon nitride insulating film formed thereover and the groove is formed in the second insulating film by etching the silicon nitride insulating film with a photoresist film as a mask, removing the photoresist film and then etching the silicon oxide insulating film with the silicon nitride insulating film as a mask.

(26) In the process of the present invention according to paragraph (24), one of the second insulating film and the third insulating film is formed of a silicon oxide insulating film containing at least one of boron and phosphorus, while the other one of the second insulating film and the third insulating film is formed of a silicon oxide insulating film free of boron and phosphorus.

(27) In the process of the present invention according to paragraph (26), the first insulating film is formed of a silicon oxide insulating film and a silicon nitride insulating film formed thereover and upon removal of the third insulating film in the step (i), the third insulating film is etched with the silicon nitride insulating film as a stopper.

(28) In the process of the present invention according to paragraphs (9) or (24), the first conductor film is formed by a film formation method wherein the film forming rate over the first conductive underlying film is higher than that over the second insulating film.

(29) In the process of the present invention according to any one of paragraphs (9), (12) and (24), the thickness of the first conductor film is greater than that of the first conductive underlying film.

(30) In the process of the present invention according to any one of paragraphs (9), (12) and (24), the first conductor film is formed by any one of electroplating with the first conductive underlying film as a cathode electrode, electroless plating using the first conductive underlying film as a catalyst and selective CVD.

(31) In the process of the present invention according to paragraphs (30), the first conductive underlying film exposed at the end portion of the wafer is connected with a terminal on the side of a negative electrode upon formation, of the first conductor film by electroplating.

(32) In the process of the present invention according to any one of paragraphs (9), (17) and (24), the first conductive underlying film is etched by anisotropic etching wherein an etching rate in the direction vertical to the main surface of the semiconductor substrate is greater than that in the horizontal direction.

(33) In the process of the present invention according to any one of paragraphs (9), (17) and (24), the groove is formed in the second insulating film by dry etching with the first conductive underlying film as a stopper.

(34) In the process of the present invention according to any one of paragraphs (9), (12), (17) and (24), the planar pattern of the first electrode is defined by the planar pattern of the groove formed in the second insulating film.

(35) In the process of the present invention according to any one of paragraphs (9), (12), (17) and (24), the inner diameter of the groove is larger at its upper end portion than at its bottom portion.

(36) In the process of the present invention according to any one of paragraphs (9), (12), (17) and (24), a barrier metal film is formed between the first conductive connector and the first conductive underlying film in order to prevent oxidation of the first conductive connector.

(37) The process of the present invention according to any one of paragraphs (9), (12), (17) and (24) further comprising forming a fourth insulating film over the capacitor, forming a connecting hole in the fourth insulating film, thereby exposing the upper electrode of the capacitor at the bottom portion of the connecting hole, forming a second conductive connector inside of the connecting hole, and forming an upper interconnection layer over the fourth insulating film, thereby electrically connecting the upper interconnection and the upper electrode through the connecting hole.

(38) In the process of the present invention according to paragraph (37), a barrier metal film is formed between the capacitor and the second conductive connector to prevent the oxidation of the second conductive connector.

(39) In the process of the present invention according to paragraph (37), the fourth insulating film over the capacitor is formed of a hydrogen sparingly-permeable insulating film and a silicon oxide insulating film formed thereover.

(40) A process for manufacturing the semiconductor integrated circuit device of the present invention comprises the following steps (a) to (h):

(a) forming a memory-selecting MISFET on the main surface of a semiconductor substrate and then forming thereover a first insulating film;

(b) forming a first connecting hole in the first insulating film and then forming, inside of the first connecting hole, a first conductive connector to be electrically connected with one of a source and a drain of the MISFET;

(c) forming a first conductive underlying film over the first insulating film and then forming thereover a second insulating film;

(d) forming a groove in the second insulating film above the first conductive connector and then forming a first conductor film over the first conductive underlying film exposed at the bottom portion of the groove, thereby embedding the first conductor film inside of the groove so that the surface height of the first conductor film becomes lower than that of the second insulating film;

(e) forming an etching barrier film on the first conductor film inside of the groove, (f) etching and selectively removing the second insulating film by making use of a difference in the etching rate among the etching barrier film, second insulating film, first conductor film and first conductive underlying film, removing the first conductive underlying film by etching with the etching barrier film as a mask, and then selectively removing the etching barrier film, thereby forming a first electrode which is formed of the first conductor film and the first conductive underlying film and is to be electrically connected with one of the source and drain of the MISFET through the first conductive connector; and (g) forming a capacitative insulating film over the first electrode to cover the upper surface and side surfaces thereof and then forming, over the capacitative insulating film, a second electrode formed of a second conductor film, thereby forming a capacitor formed of the first electrode, the capacitative insulating film and second electrode.

(41) In the process of the present invention according to any one of paragraphs (9), (12), (17), (24) and (40), the first conductive underlying film is made of at least one of platinum metals such as Pt, Ru and Ir and alloys containing the platinum metal, or $RuO_2$ or $IrO_2$.

(42) In the process of the present invention according to any one of paragraphs (9), (12), (17), (24) and (40), the first conductor film is made of at least one of platinum metals such as Pt, Ru and Ir and alloys containing the platinum metal, or $RuO_2$ or $IrO_2$.

(43) In the process of the present invention according to any one of paragraphs (9), (12), (17), (24) and (40), the capacitative insulating film is composed mainly of a high dielectric film or ferroelectric film having a perovskite or complex perovskite crystal structure,

(44) In the process of the present invention according to any one of paragraphs (9), (12), (17), (24) and (40), the capacitative insulating film is formed of a film composed mainly of any one of PZT, PLT, PLZT, $PbTiO_3$, $SrTiO_3$, $BaTiO_3$, BST, SBT and $Ta_2O_5$.

(45) In the process of the present invention according to any one of paragraphs (9), (12), (17), (24) and (40), the second conductor film is made of at least one of platinum metals such as Pt, Ru and Ir and alloys containing the platinum metal, or $RuO_2$ or $IrO_2$.

(46) A process for manufacturing the semiconductor integrated circuit device of the present invention comprises the following steps (a) to (e):

(a) forming a memory-selecting MISFET on the main surface of a semiconductor substrate and then forming thereover a first insulating film;

(b) forming a first connecting hole in the first insulating film and then forming, inside of the first connecting hole, a first conductive connector to be electrically connected with one of a source and a drain of the MISFET;

(c) forming a second insulating film over the first insulating film and then forming a groove in the second insulating film above the first conductive connector;

(d) forming a first conductor film inside of the groove by plating or selective CVD and then removing the second insulating film, thereby forming a first electrode which is formed of the first conductor film and is to be electrically connected with one of the source and drain of the MISFET through the first conductive connector; and (e) forming a capacitative insulating film over the first electrode to cover the upper surface and side surface thereof and then forming, over the capacitative insulating film, a second electrode formed of a second conductor film, thereby forming a capacitor formed of the first electrode, the capacitative insulating film and the second electrode.

(47) In the process of the present invention according to paragraph (46), the first conductor film and the second conductor film are each composed mainly of a platinum metal, a platinum alloy or a conductive oxide of a platinum metal.

(48) In the process of the present invention according to paragraph (46), the capacitative insulating film is formed mainly of a high dielectric film or ferroelectric film having a perovskite or complex perovskite crystal structure.

(49) In the process of the present invention according to paragraph (9), etching in the step (e) is carried out by a method wherein the etching rate of a material forming the first conductive underlying film becomes greater than that of a material constituting the first conductor film.

(50) In the process of the present invention according to paragraph (9), etching in the step (g) is carried out by a method wherein the etching rate of a material constituting the first conductive underlying film becomes greater than that of a material constituting the first conductor film.

(51) A semiconductor integrated circuit device according to the present invention comprises a capacitor formed of a first electrode formed on the main surface of a semiconductor substrate and a second electrode formed, thorough a capacitative insulating film, on the upper surface and sidewall surfaces of the first electrode, wherein the first electrode of the capacitor is composed mainly of a platinum metal, a platinum alloy or a conductive oxide of a platinum metal.

(52) The semiconductor integrated circuit device of the present invention according to paragraph (51) further comprises, on the main surface of the semiconductor substrate, a capacitor-selecting switching element electrically connected with the first electrode of the capacitor.

(53) In the semiconductor integrated circuit device of the present invention according to paragraph (51), the capacitative insulating film of the capacitor is composed mainly of a high dielectric film or ferroelectric film having a perovskite or complex perovskite crystal structure.

(54) In the process of the present invention according to any one of paragraphs (9), (12) and (17), the second insulating film comprises a silicon oxide film.

(55) In the process of the present invention according to paragraph (9), the step (d) comprises forming the first conductor film having a thickness greater than the depth of the groove and removing the first conductor film formed outside the groove by planarizing treatment on the main surface of the wafer.

(56) In the process of the present invention according to paragraph (9), the step (d) comprises forming the first conductor film having a thickness greater than the depth of the groove and removing the first conductor film formed outside the groove by either one of chemical mechanical polishing or dry etching.

(57) In the process of the present invention according to paragraph (9), the capacitative insulating film of the capacitor is formed to cover the side wall portions of the first conductive underlying film formed by etching in the step (e).

BRIEF DESCRIPTION OF THE DRAWINGS

FIG. 5 is a fragmentary plane view of a substrate illustrating the process for manufacturing a DRAM according to Embodiment 1 of the present invention;

FIG. 6 is a fragmentary cross-sectional view of a substrate illustrating the process for manufacturing a DRAM according to Embodiment 1 of the present invention;

FIG. 7 is a fragmentary cross-sectional view of a substrate illustrating the process for manufacturing a DRAM according to Embodiment 1 of the present invention;

FIG. 10 is a fragmentary cross-sectional view of a substrate illustrating the process for manufacturing a DRAM according to Embodiment 1 of the present invention;

FIG. 11 is a fragmentary cross-sectional view of a substrate illustrating the process for manufacturing DRAM according to Embodiment 1 of the present invention;

FIG. 12 is a fragmentary cross-sectional view of a substrate illustrating the process for manufacturing a DRAM according to Embodiment 1 of the present invention;

FIG. 29 is a fragmentary cross-sectional view of a substrate illustrating the process for manufacturing a DRAM according to Embodiment 1 of the present invention;

FIG. 60 is a fragmentary cross-sectional view of a substrate illustrating the process for manufacturing a DRAM according to Embodiment 5 of the present invention;

FIG. 63 is a fragmentary cross-sectional view of a substrate illustrating the process for manufacturing a DRAM according to Embodiment 6 of the present invention.

DETAILED DESCRIPTION OF THE PREFERRED EMBODIMENTS

Figure 1:
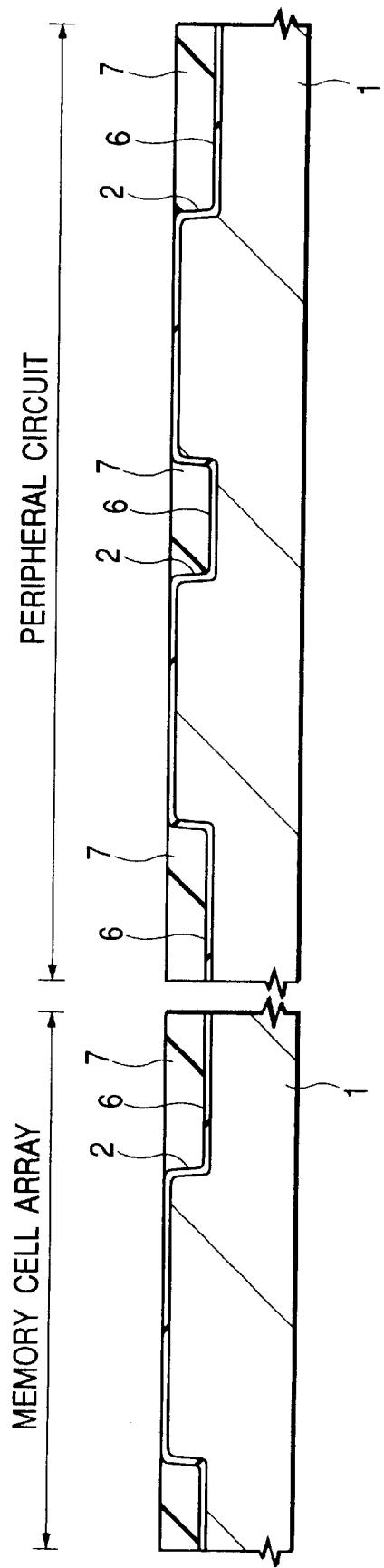
FIG. 1 is a fragmentary cross-sectional view of a substrate illustrating a process for manufacturing a DRAM according to Embodiment 1 of the present invention.
Figure 2:
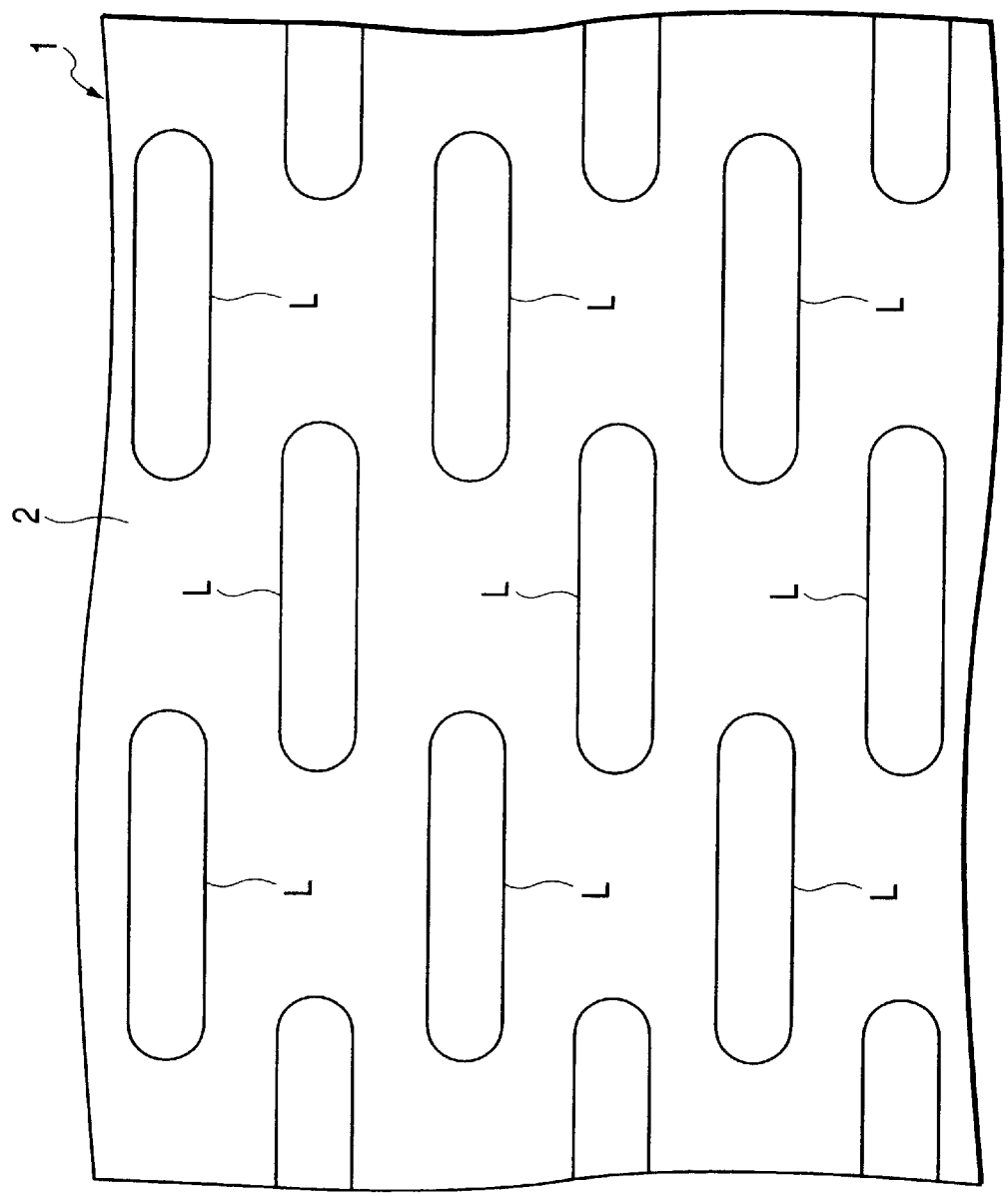
FIG. 2 is a fragmentary plane view of a substrate illustrating the process for manufacturing a DRAM according to Embodiment 1 of the present invention.

Various embodiments of the present invention will be described specifically based on the accompanying drawings. In all the drawings illustrating the embodiments, like members having the function will be identified by like reference numerals and overlapping descriptions thereof will be omitted.

(Embodiment 1)

The process for manufacturing a DRAM according to Embodiment 1 of the present invention will hereinafter be described with reference to FIGS. 1 to 31 in the order of its steps. The following description will apply to the case where a DRAM of 64 Mbit to 256 Mbit is manufactured using a design rule of 0.18 $\mu$m.

First, as illustrated in FIG. 1, an element isolation groove 2 is formed in a semiconductor substrate (which will hereinafter simply be called a "substrate") which is, for example, made of p-type single crystal silicon having a specific resistance of about 1 to 10 $\Omega$cm. In the drawing, a region (memory cell array) in which a memory cell is to be formed is illustrated on the left side, while a peripheral circuit region is illustrated on the right side.

The element isolation groove 2 is formed as follows: the substrate 1 of the element isolation region is etched to form a groove of about 350 nm deep, and, then, the substrate 1 is subjected to thermal oxidation at about 1000° C. to form a silicon oxide film 6 as thin as about 10 nm on the inner wall of the groove. This silicon oxide film 6 is formed in order to recover from the damage which has appeared on the inner wall of the groove by dry etching and at the same time to relax the stress formed on the interface between the substrate 1 and a silicon oxide film 7 which is to be embedded inside of the groove in a subsequent step.

The silicon oxide film 7 is then deposited on the substrate 1 including the inside of the groove to a thickness of about 600=by CVD. After thermal oxidation of the substrate 1 at about 1150° C. for densification to improve the film quality of the silicon oxide film 7, the silicon oxide film 7 over the groove is polished back by chemical mechanical polishing, whereby the surface is flattened.

By forming the element isolation grooves 2 in the substrate 1 by the above-described process, a large number of active regions (L) are formed in the memory cell array as studded islands surrounded by the element isolation groove 2. These active regions (L) are each constituted of a substantially T plane pattern, more specifically, a pattern extending narrowly in the horizontal direction and having a center protruding upwards in the drawing in the convex form. The size of the active region (L) in the horizontal direction and the distance between two adjacent active regions (L) are each formed to be the minimum size (0.18 $\mu$m) which depends on the resolution limit of photolithography.

Figure 3:
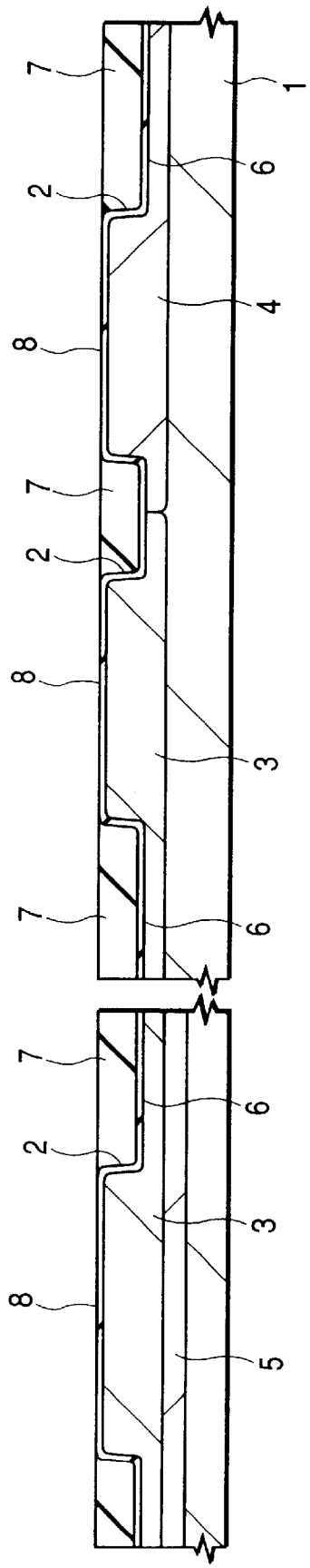
FIG. 3 is a fragmentary cross-sectional view of a substrate illustrating the process for manufacturing a DRAM according to Embodiment 1 of the present invention.

As illustrated in FIG. 3, after ion implantation of p-type impurities (boron) and n-type impurities (ex. phosphorus) to the substrate 1, these impurities are diffused by thermal treatment at about 1000° C., whereby a p-type well 3 and an n-type well 5 are formed on the substrate of the memory cell array, and a p-type well 3 and an n-type well 4 are formed on the substrate 1 of the peripheral circuit region. The n-type well 5 of the memory cell array surrounding the p-type well 3 is formed for preventing the invasion, thorough the substrate 1, of noise into this p-type well 3 from an unillustrated input/output circuit or the like.

Figure 4:
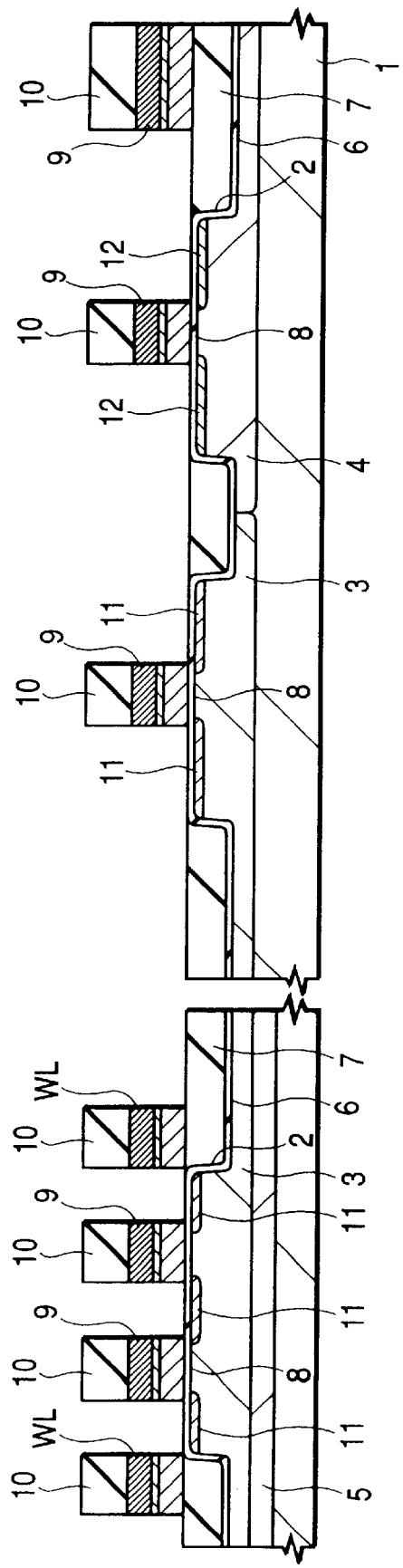
FIG. 4 is a fragmentary cross-sectional view of a substrate illustrating the process for manufacturing a DRAM according to Embodiment 1 of the present invention.

The surface of the substrate 1 (p-type well 3, n-type well 4) is then washed by wet etching with hydrofluoric acid, followed by thermal oxidation at about 800° C. to form a clean gate oxide film 8 about 6=thick on each of the surfaces of the p-type well 3 and n-type well 4. Alternatively, the gate oxide film 8 may be formed from a silicon oxynitride film partially containing silicon nitride. The silicon oxynitride film makes it possible to improve hot carrier resistance of the gate oxide film 8 because, compared with a silicon oxide film, it is highly effective for suppressing the occurrence of an interface state in the film or reducing electron traps. The silicon oxynitride film can be formed, for example, by thermal oxidation of the substrate 1 in a nitrogen-containing gas atmosphere such as NO or $NO_2$ As illustrated in FIGS. 4 and 5 (plan views of the memory cell array), a gate electrode 9 (word line WL) is formed over the gate oxide film 8, followed by ion implantation of n-type impurities (phosphorus or arsenic) into the p-type well 3 on both sides of the gate electrode 9 and ion implantation of p-type impurities (boron) into the n-type well 4, whereby n-type semiconductor region 11 and p-type semiconductor region 12 are formed, respectively.

The above-described gate electrode 9 (word line WL) is formed, for example, by depositing a phosphorus-doped (P-doped), low-resistance polycrystalline silicon film of about 50=thick over the gate oxide film 8 by CVD, depositing over the polycrystalline silicon film a WN film of about 5=thick and a W film of about 100 nm thick by sputtering, depositing thereover a silicon nitride film 10 of about 150=thick by CVD and then patterning these films by dry etching with a photoresist film (not illustrated) as a mask. The width (gate length) of the gate electrode 9 (word line WL) formed in the memory cell array and distance between two adjacent gate electrodes 9 are each adjusted to the minimum size (0.18 $\mu$m) which is determined depending on the resolution limit of photolithography.

As illustrated in FIG. 6, a silicon nitride film 13 is then deposited on the substrate 1 to a thickness of about 50 nm by CVD. While the upper portion of the substrate 1 of the memory cell array is covered with a photoresist film (not illustrated), the silicon nitride film 13 of the peripheral circuit region is subjected to anisotropic etching, whereby a side wall spacer 13 a is formed on the side walls of the gate electrode 9 of the peripheral circuit region.

Then, n$^+$type semiconductor regions 14 (source, drain) are formed by ion implantation of n-type impurities (phosphorus or arsenic) into the p-type well 3 of the peripheral circuit region, while p-type semiconductor regions 15 (source, drain) are formed by ion implantation of p-type impurities (boron) into the n-type well 4. Through these steps so far described, a n-channel type MISFETQn and a p-channel type MISFETQp each having a source and a-drain of an LDD (Lightly Doped Drain) structure are formed in the peripheral circuit region.

As illustrated in FIG. 7, after deposition of a silicon oxide film 16 of about 600 nm thick over the silicon nitride film 13 by CVD, the surface of the silicon oxide film 16 is flattened by polishing back by CMP. Alternatively, after application of an SOG (spin-on-glass) film (not illustrated) of about 300= thick onto the substrate 1, the substrate 1 is thermally treated at about 800° C. for densification of the SOG film.

Then, a silicon oxide film 16 is deposited to a thickness of about 300 nm over the SOG film by CVD, followed by flattening of the surface of the silicon oxide film 16 through polishing back by CMP. The SOG film has high reflow properties compared with the silicon oxide film deposited by CVD and is therefore has excellent filling properties for a gap between minute interconnections so that the space between two adjacent gate electrodes 9 (word lines L), which has been miniaturized to the minimum size determined by the resolution limit of photolithography can be embedded well.

The silicon oxide film 16 of the memory cell array is dry etched with a photoresist (not illustrated) a mask, followed by dry etching of the silicon nitride film 13 lying below the silicon oxide film 16, whereby contact holes 18, 19 are formed over the n-type semiconductor region 11.

The silicon oxide film 16 is etched under the conditions whereby the etching rate of silicon oxide would become larger than that of silicon nitride, the silicon nitride film 13 is not removed completely. The silicon nitride film 13 is, on the other hand, etched under the conditions whereby the etching rate of silicon nitride would become larger than that of silicon (substrate) or silicon oxide, so that neither the substrate 1 nor the silicon oxide film 7 are etched deeply. In addition, the silicon nitride film 13 is etched under the conditions whereby the silicon nitride film 13 can be etched anisotropically, so that the silicon nitride film 13 would remain on the side walls of the gate electrode 9 (Word Line WL). By etching under the above-described conditions, contact holes 18, 19 having a more minute diameter than the minimum size determined by the resolution limit of photolithography can be formed in self alignment against the gate electrode 9 (Word Line WL).

Then, $n^+$type semiconductor regions 17 (source, drain) are formed by ion implantation of n-type impurities (phosphorus or arsenic) into the p-type well 3 (n-type semiconductor region 11) of the memory cell array through the contact holes 18,19. By the steps so far described, a memory selecting MISFETQs constituted of n-channel type is formed in the memory cell array.

Figure 8:
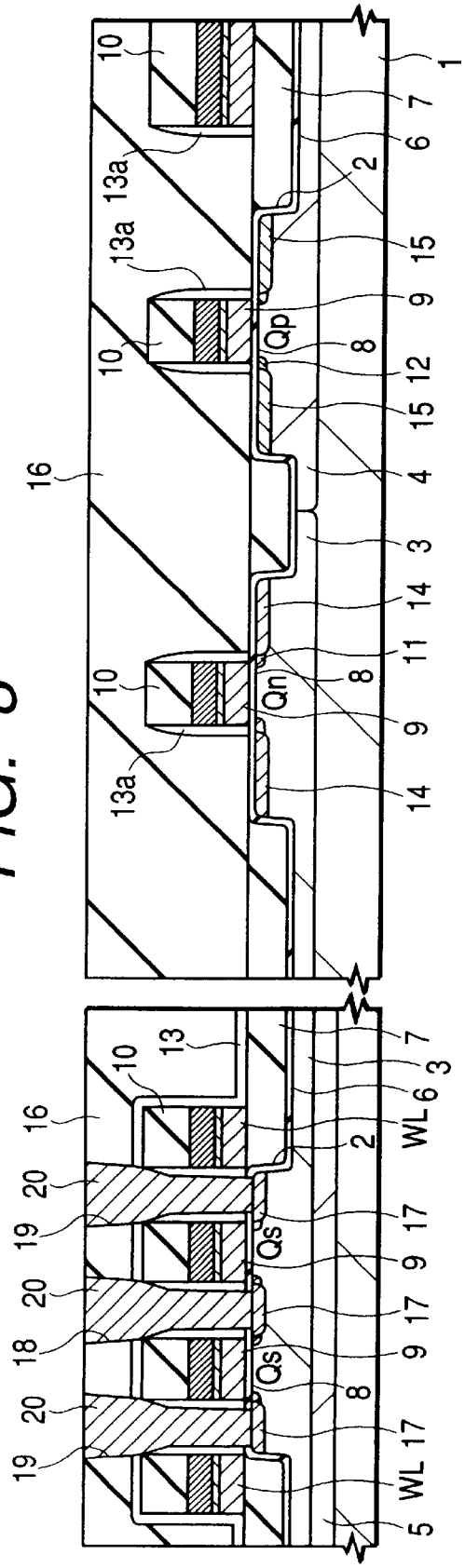
FIG. 8 is a fragmentary cross-sectional view of a substrate illustrating the process for manufacturing a DRAM according to Embodiment 1 of the present invention.

As illustrated in FIG. 8, a plug 20 is formed inside of each of the contact holes 18,19. This plug 20 is formed by depositing, by CVD, a low-resistance polycrystalline silicon film, which has been doped with n-type impurities such as phosphorus (P), over the silicon oxide film 16 including the inside of each of the contact holes 18,19 and then leaving this polycrystalline silicon film only inside of each of the contact holes 18,19 by etching back (or polishing back by CMP).

Figure 9:
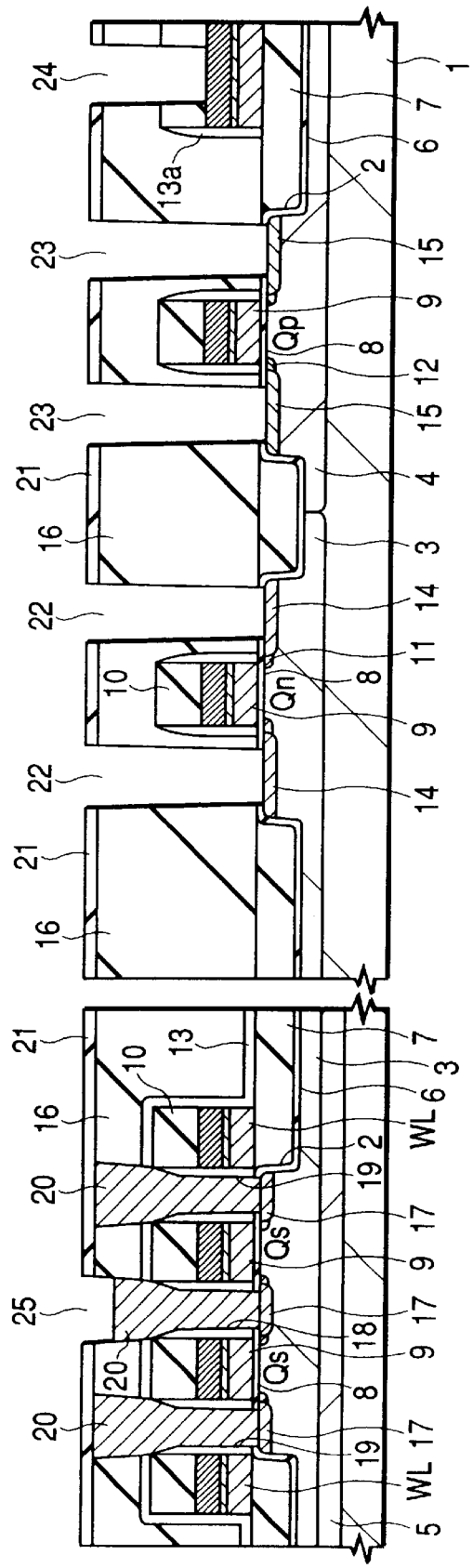
FIG. 9 is a fragmentary cross-sectional view of a substrate illustrating the process for manufacturing a DRAM according to Embodiment 1 of the present invention.

As illustrated in FIG. 9 after deposition of a silicon oxide film 21 of about 20 nm thick over the silicon oxide film 16 by CVD, the silicon oxide film 21 and the silicon oxide film 16 lying therebelow, both in the peripheral circuit region, are dry etched with a photoresist film (not illustrated) as a mask, whereby contact holes 22 are formed over the source and drain ($n^+$type semiconductor regions 14) of the n-channel type MISFETQn and contact holes 23 are formed over the source and drain ($p^+$type semiconductor regions 15) of the p-channel type MISFETQp. Simultaneously, a contact hole 24 is formed over the gate electrode 9 of the p-channel-type MISFETQp of the peripheral circuit region (and the gate electrode 9 of an unillustrated region of the n-channel type MISFETQp), while a connecting hole 25 is formed over the contact hole 18 of the memory cell array.

As illustrated in FIG. 10, after formation of a silicide film 26 on the surface of each of the source and drain ($n^+$type semiconductor regions 14) of the n-channel type MISFETQn, the surface of each of the source and drain (p+type semiconductor regions 15) of the p-channel type MISFETQp and the surface of the plug 20 inside of the contact hole 18, a plug 27 is formed inside of each of the contact holes 22, 23, 24 and connecting hole 25.

The above-described silicide film 26 is formed, for example, by depositing a Ti film of about 30 nm thick and a TiN film of about 20 nm thick over the silicon oxide film 21 including the inside of each of the contact holes 22, 23, 24 and the connecting hole 25 by sputtering, followed by thermal treatment of the substrate 1 at about 650° C. The plug 27 is formed, for example, by depositing a TiN film of about 50 nm thick and a W film of about 300 nm thick by CVD over the TiN film including the inside of each of the contact holes 22, 23, 24 and the connecting hole 25 and polishing the W film, TiN film and Ti film over the silicon oxide film 21 by CMP to leave these films only inside of the contact holes 22, 23, 24 and the connecting hole 25.

A contact resistance of the source or drain (n+type semiconductor region 14, $p^+$type semiconductor region 15) with the plug 27 can be reduced by the formation of the silicide film 26 composed of Ti silicide on the interface between the source or drain ($n^+$type semiconductor region 14, $p^+$type semiconductor region 15) and the plug 27 formed thereover.

As illustrated in FIG. 11, a bit line BL is then formed over the silicon oxide film 21 of the memory cell array, while the first interconnection layers 30 to 33 are formed over the silicon oxide film 21 of the peripheral circuit region. These bit line BL and the first interconnection layers 30 to 33 are formed, for example, by depositing a W film of about 100 nm thick over the silicon oxide film 21 by sputtering and then dry etching this W film with a photoresist film as a mask.

As illustrated in FIG. 12, a silicon oxide film 34 (first insulating film) of about 300 nm thick is then deposited by CVD over the bit line BL and first interconnection layers 30 to 33, followed by deposition of a polycrystalline silicon film 35 of about 200 nm thick by CVD over the silicon oxide film 34. The polycrystalline silicon film 35 of the memory cell array is then dry etched with a photoresist film as a mask, whereby a groove 36 is formed in the polycrystalline silicon film 35 above the contact hole 19. The diameter of the groove 36 is formed to have a minimum size determined by the resolution limit of photolithography.

Figure 13:
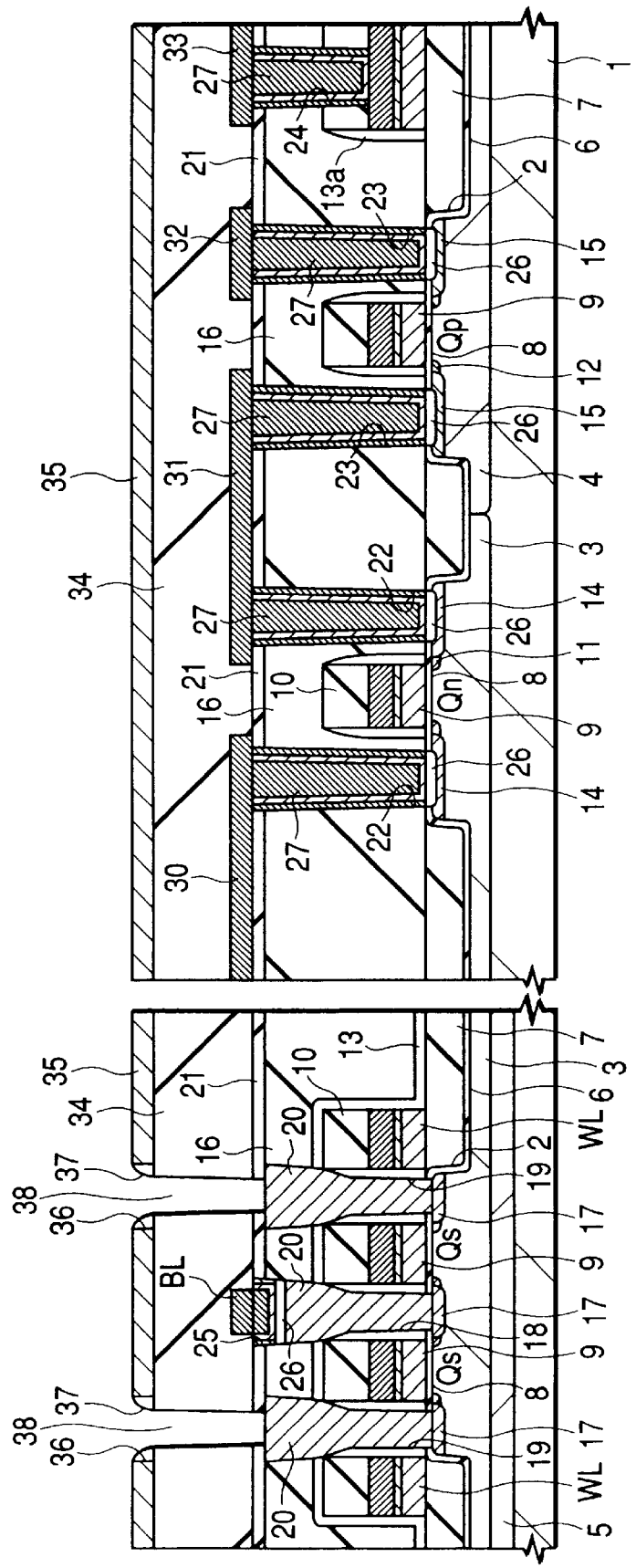
FIG. 13 is a fragmentary cross-sectional view of a substrate, illustrating the process for manufacturing a DRAM according to Embodiment 1 of the present invention.

As illustrated in FIG. 13, side wall spacers 37 are then formed on the side walls of the groove 36. By dry etching of the silicon oxide film 34 and the silicon oxide film 21 lying thereunder with the side wall spacers 37 and the polycrystalline silicon film 35 as a mask, a connecting hole 38 (first connecting hole) is formed over the contact hole 19. The side wall spacers 37 are formed by depositing a polycrystalline silicon film by CVD over the polycrystalline silicon film 35 including the inside of the groove 36 and leaving it on the side walls of the groove 36 by anisotropic etching.

The diameter of the connecting hole 38 is made smaller than the minimum size determined by the resolution limit of photolithography by forming the connecting hole 38 on the bottom of the groove 36 having at the side walls thereof the side wall spacers 37, which makes it possible to certainly prevent a short circuit between a plug 39, which will be embedded inside of the connecting hole 38 in the subsequent step, and the bit line BL, because the alignment margin of the bit line BL and the connecting hole 38 can be secured even if the memory cell size is reduced.

Figure 14:
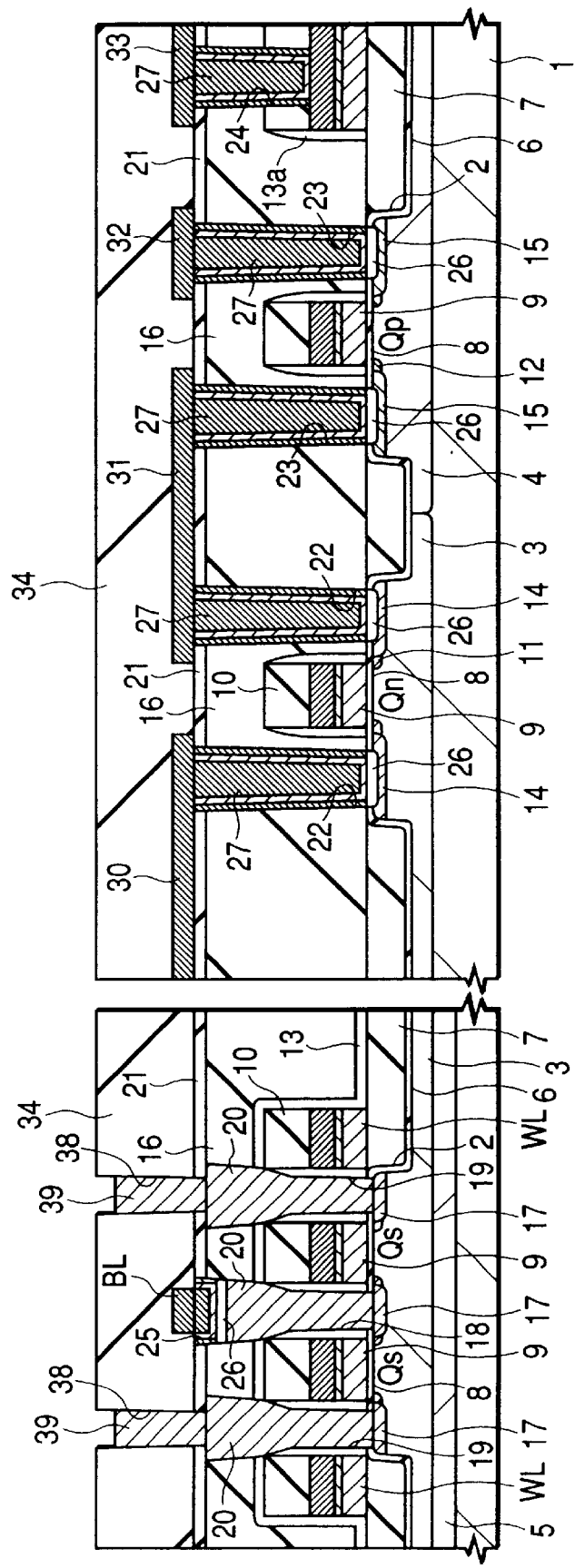
FIG. 14 is a fragmentary cross-sectional view of a substrate illustrating the process for manufacturing a DRAM according to Embodiment 1 of the present invention.

After removal of the polycrystalline silicon film 35 and side wall spacers 37 by dry etching, the plug 39 (first conductive connector) is formed inside of the connecting hole 38 as illustrated in FIG. 14. This plug 39 is formed by depositing a low-resistance polycrystalline silicon film, which has been doped with n-type impurities (phosphorus), by CVD over the silicon oxide film 34 including the inside of the connecting hole 38 and then leaving the polycrystalline silicon film only inside of the connecting hole 38 by etching back. At this time, the polycrystalline silicon film is over-etched, whereby the surface height of the plug 39 is made lower than that of the silicon oxide film 34 as illustrated in FIG. 14.

Figure 15:
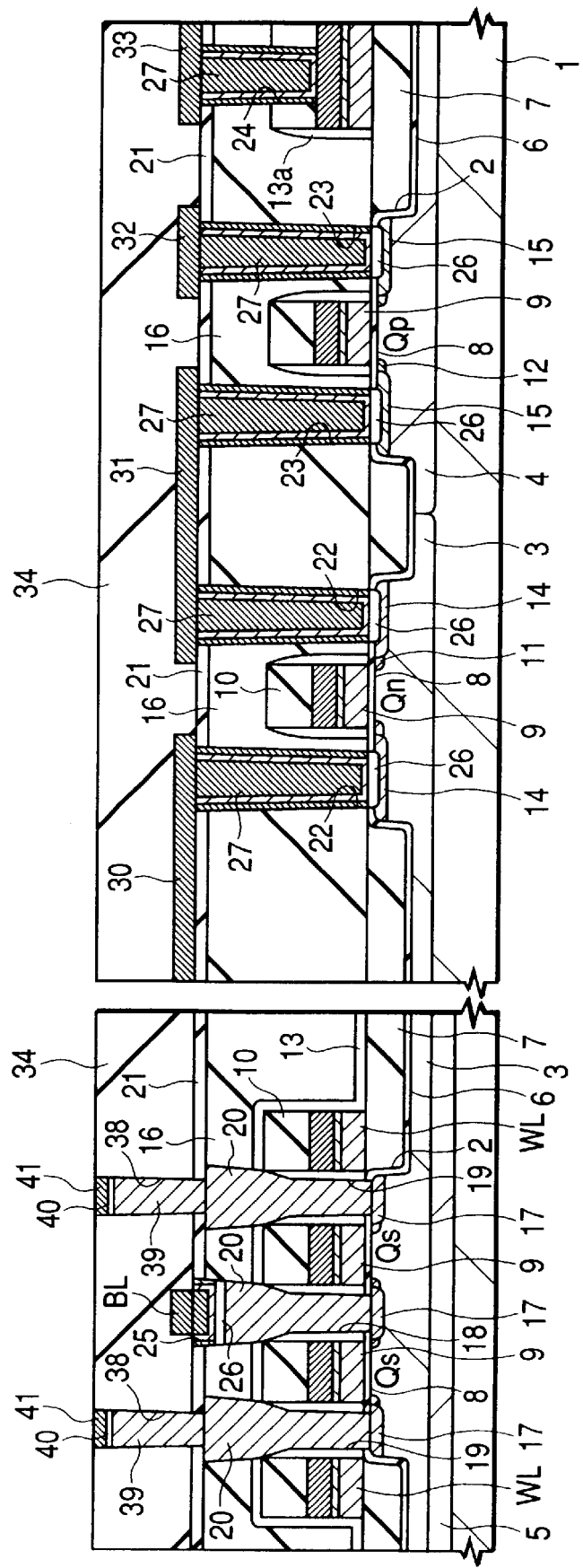
FIG. 15 is a fragmentary cross-sectional view of a substrate illustrating the process for manufacturing a DRAM according to Embodiment 1 of the present invention.

As illustrated in FIG. 15, a silicide film 40 is then formed on the surface of the plug 39 inside of the connecting hole 38, followed by the formation of a barrier metal film 41 on the surface of this silicide film 40. The silicide film 40 is formed in order to reduce the contact resistance between the plug 39 made of polycrystalline silicon and the barrier metal film 41. This silicide film 40 is formed, for example, by depositing a Ti film over the silicon oxide film 34 including the inside of the connecting hole 38 by sputtering, forming the silicide film 40 on the surface of the plug 39 by thermal treatment of the substrate 1 at about 650° C. and then removing the unreacted Ti film, which has remained over the silicon oxide film 34, by etching.

The barrier metal film 41 over the silicide film 40 is formed in order to prevent an increase in the contact resistance which will otherwise be caused by the reaction between a conductive underlying film (42), which will be formed over the barrier metal film 41 in the subsequent step, and the plug 39 and at the same time, to prevent oxidation of the surface of the plug 39 upon thermal treatment of a capacitative insulating film (47) of an information storing capacitor to be formed over the conductive underlying film (42). This barrier metal film 41 is formed, for example, by depositing a conductor film, which is made of a (silicide) nitride of a high-melting-point metal such as TaSiN, TaN, TiSiN, TiN, WSIN or WN or is made of a solid solution of (Ti, Al)N, by sputtering over the silicon oxide film including the inside of the connecting hole 38, and then polishing the conductor film by CMP (or etching back by dry etching) to leave it only inside of the connecting hole 38. In particular, the solid solution of (Ti, Al)N exhibits high oxygen barrier properties owing to Al contained in it so that it can effectively prevent the oxidation of the surface of the plug 39.

Figure 16:
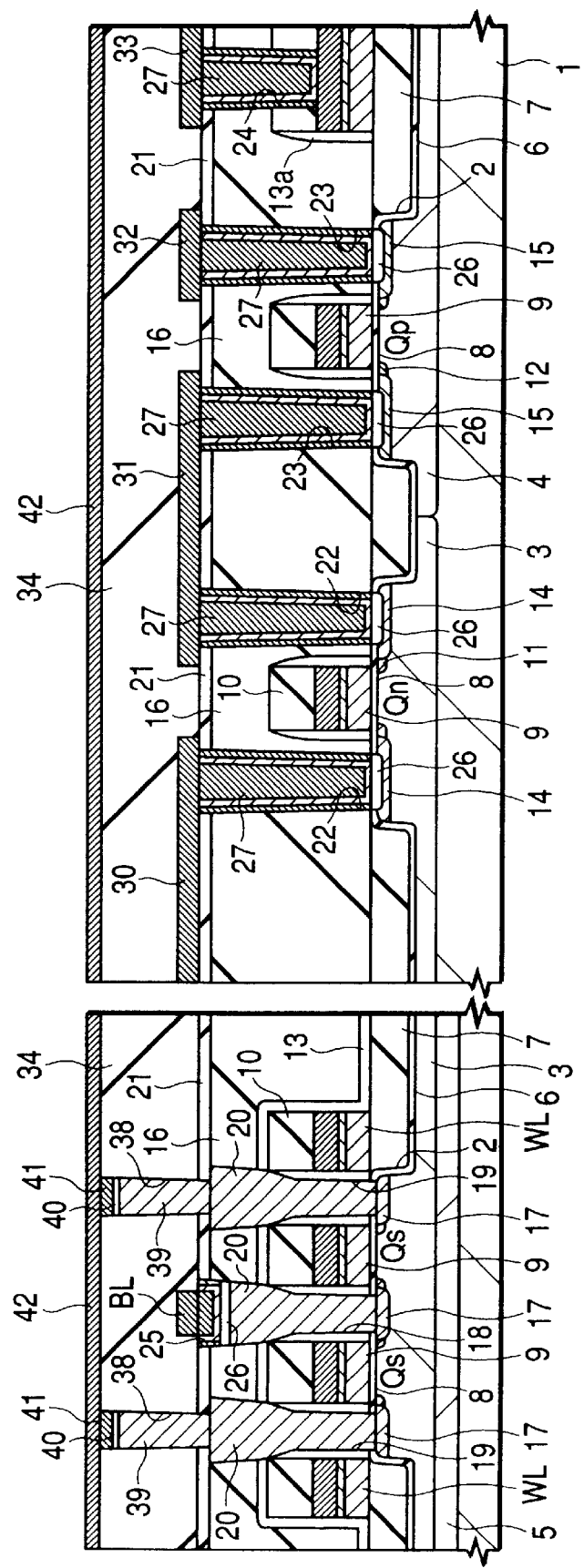
FIG. 16 is a fragmentary cross-sectional view of a substrate illustrating the process for manufacturing a DRAM according to Embodiment 1 of the present invention.

As illustrated in FIG. 16, the conductive underlying film 42 is formed over the silicon oxide film 34. This conductive underlying film 42 serves as a cathode electrode upon formation of a metal film, which is a material of a lower electrode of the information storing capacitor, by electroplating and it is formed thinner than the metal film used as the material of the lower electrode. The conductive underlying film 42 is formed of a Pt film of about 50 to 60 nm thick deposited, for example, by sputtering.

Figure 17:
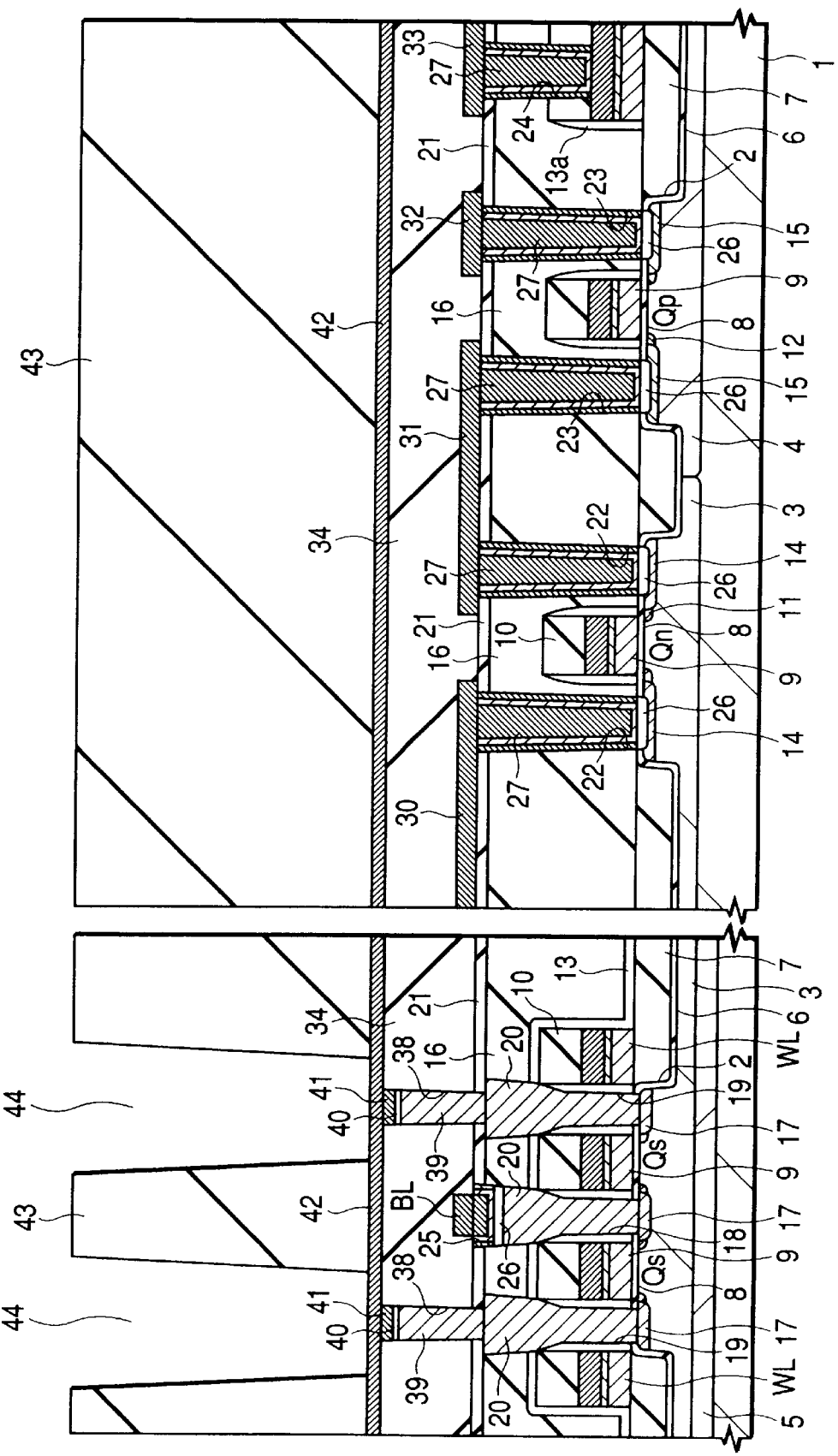
FIG. 17 is a fragmentary cross-sectional view of a substrate illustrating the process for manufacturing a DRAM according to Embodiment 1 of the present invention.

As illustrated in FIG. 17, a groove 44 is formed over the connecting hole 38 by depositing a silicon oxide film 43 (second insulating film) by CVD over the conductive underlying film 42 and then, dry-etching the silicon oxide film 43 of the memory cell array with a photoresist film (not illustrated) as a mask.

As will be described later, the lower electrode (46) of the information storing capacitor is to be formed inside of the groove 44. With a view to increasing the amount of accumulative charge of the information storing capacitor by enlarging the surface area of the lower electrode (46), it is necessary to deepen the groove 44 by depositing the silicon oxide film 43 with sufficient thickness (ex. about 50 nm).

Upon formation of the groove 44 by dry etching of the silicon oxide film 43, the conductive underlying film 42 lying under the silicon oxide film 43 is utilized as a stopper for etching. This stopper prevents the silicon oxide film 34, which exists under the conductive underlying film 42, from being etched even by over-etching of the silicon oxide film 43, whereby the groove 44 can be formed with a small etching margin.

The dry etching of the silicon oxide film 43 further permits the formation of a groove having an inner diameter equivalent at the bottom portion and the upper end portion or to have a reverse taper shape larger at the upper end portion than the bottom portion.

Figure 18:
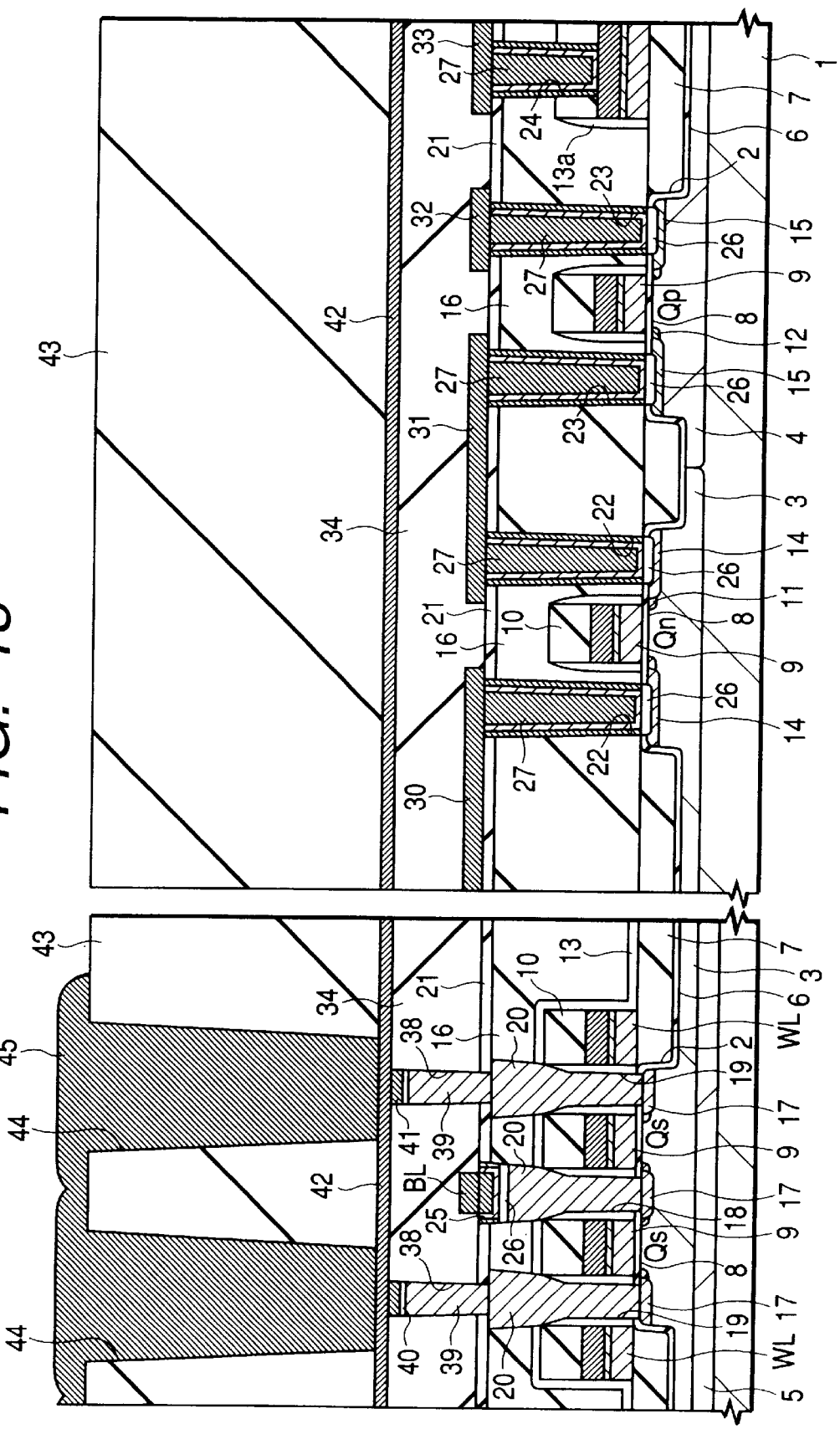
FIG. 18 is a fragmentary cross-sectional view of a substrate illustrating the process for manufacturing a DRAM according to Embodiment 1 of the present invention.

As illustrated in FIG. 18, a PT film 45 (first conductor film) is then precipitated on the surface of the conductive underlying film 42 by electroplating using, as a cathode electrode, the conductive underlying film 42 exposed at the bottom of the groove 44. This Pt film 45 must be formed to have a surface height higher than the surface height of the silicon oxide film 43, that is, the depth of the groove 44.

Figure 19:
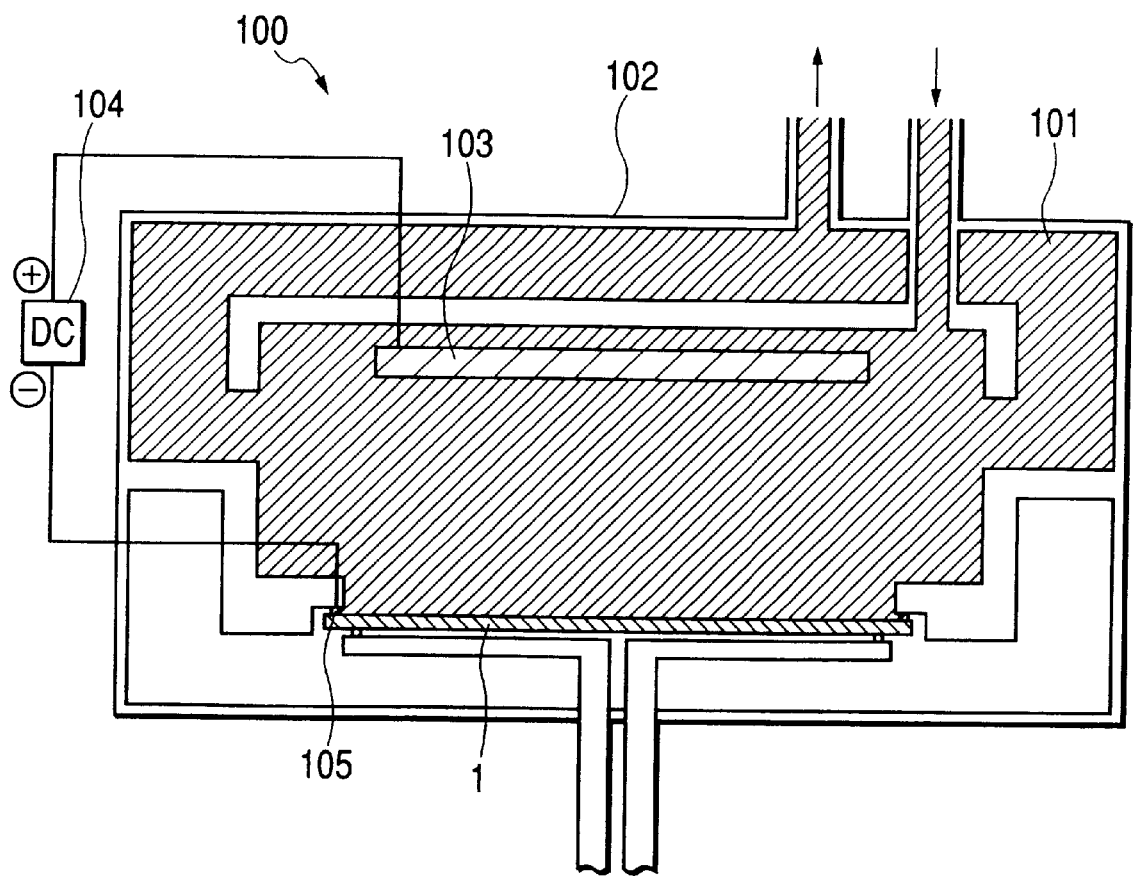
FIG. 19 is a schematic diagram illustrating an electroplating apparatus used for the formation of a Pt film.

FIG. 19 is a schematic diagram illustrating an electroplating apparatus 100 used for the formation of the Pt film 45. In the plating tank 102 filled with a plating solution 101, the substrate (wafer) 1 is disposed opposite to an anode electrode 103. A positive voltage is applied to the anode 103 from a direct current source 104 outside of the plating tank 102, while a negative voltage is applied to the substrate (wafer) 1 from the direct current source 104 through a contact terminal 105.

Figure 20:
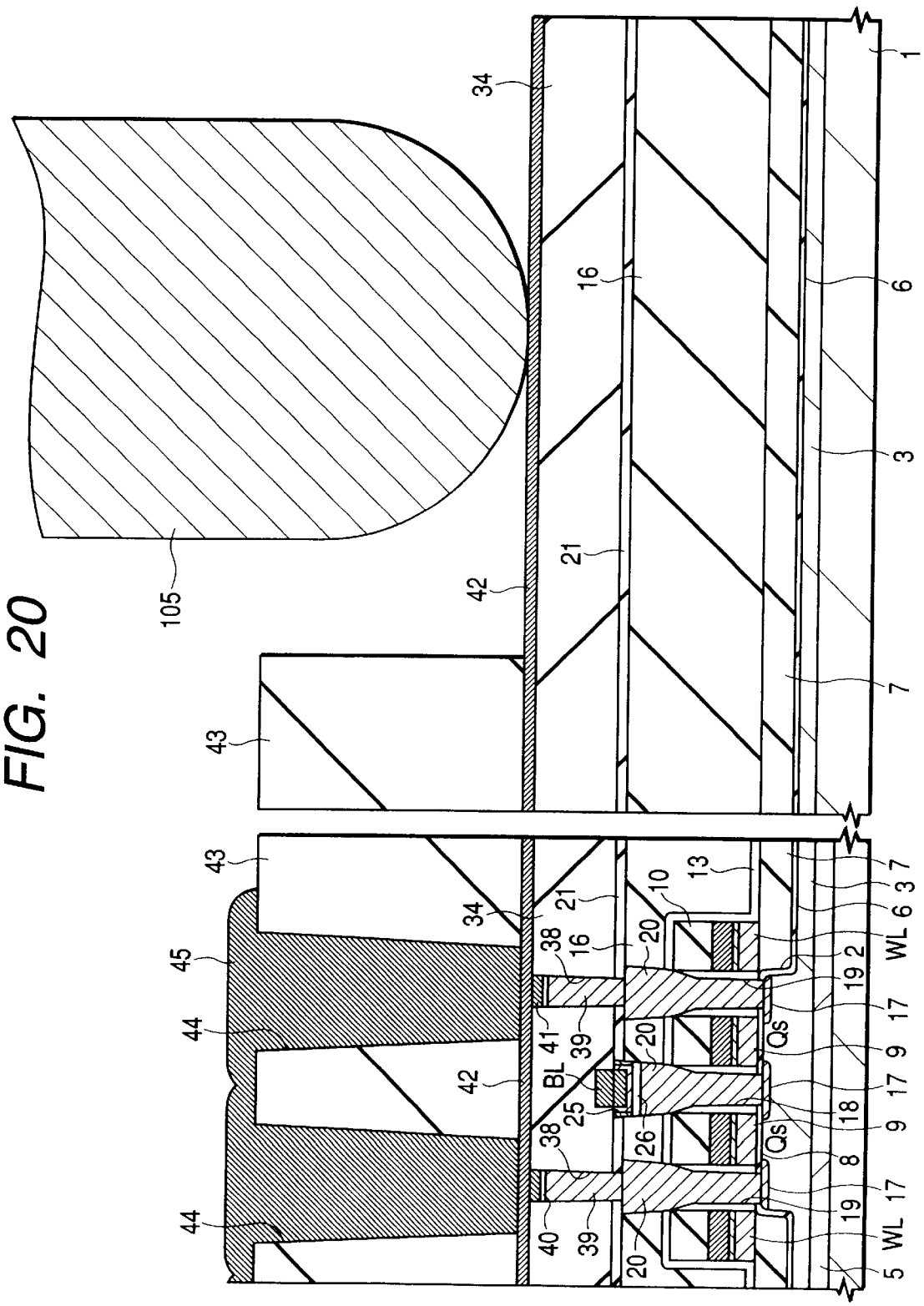
FIG. 20 is a fragmentary cross-sectional view of a substrate illustrating the process for manufacturing a DRAM according to Embodiment 1 of the present invention.
Figure 21:
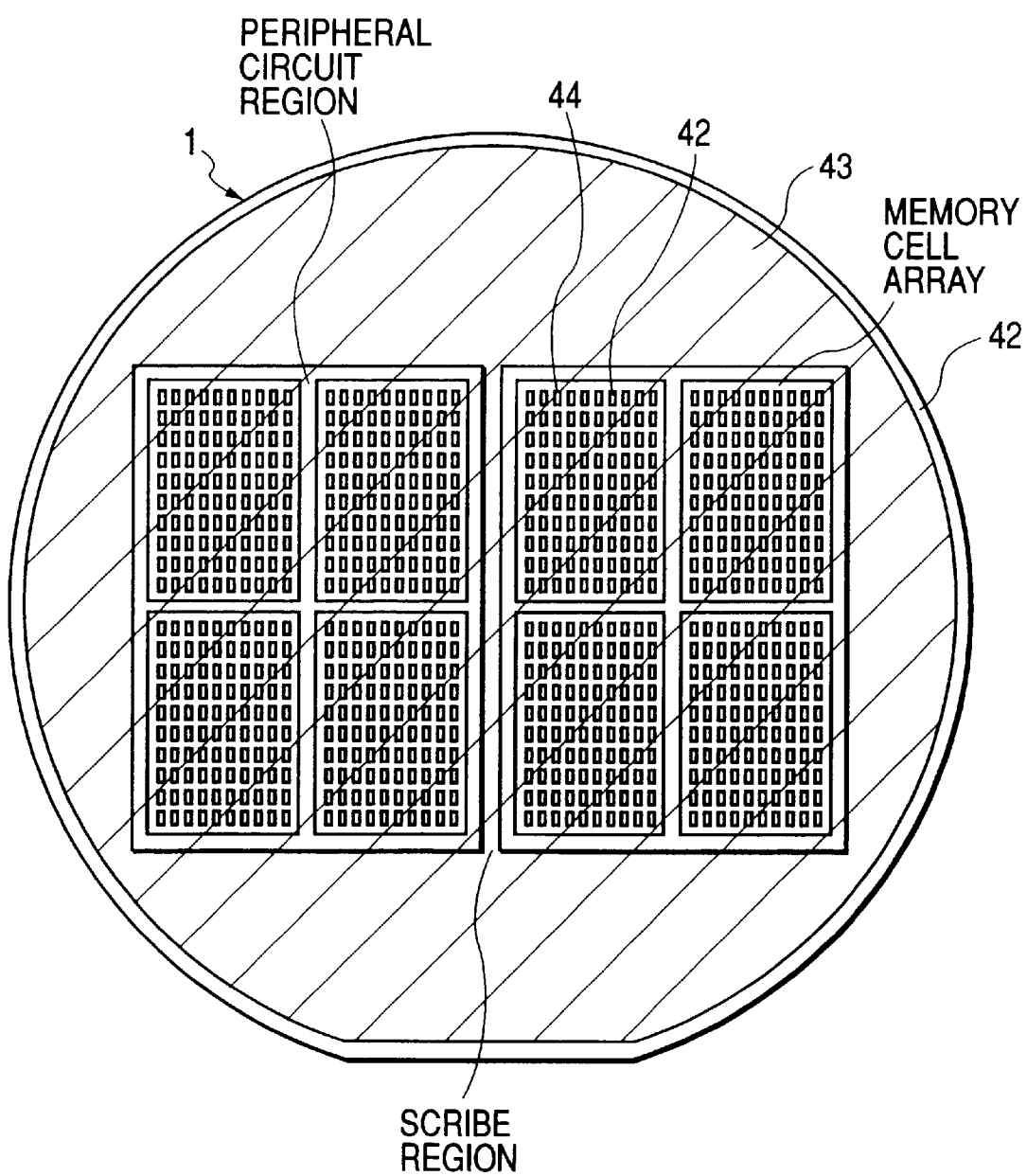
FIG. 21 is an overall plane view of a substrate (wafer) illustrating the process for manufacturing a DRAM according to Embodiment 1 of the present invention.

As illustrated on an enlarged scale in FIG. 20, the contact terminal 105 is brought into contact with the surface of the conductive underlying film 42 exposed at the outermost periphery of the substrate (wafer) 1, whereby the conductive underlying film 42 functions as a cathode electrode. At this time, as illustrated in FIG. 21, on the main surface of the substrate (wafer) 1, the conductive underlying film 42 is exposed only at the outermost periphery which is brought into contact with the contact terminal 105 and the bottom portion of the groove 44 of the memory cell array and the conductive underlying film 42 in the other region (peripheral circuit region, scribe region and the like) has a surface covered with the silicon oxide film 43.

As described above, in the case where the conductive underlying film 42 formed all over the substrate (wafer) 1 is brought into contact with the contact terminal 105 at the outermost periphery of the substrate (wafer) 1, the more distant from the contact terminal 105, that is, the nearer to the center of the substrate (wafer) 1, the weaker will be the strength of the electric current in the plane of the substrate (wafer) 1. The growth rate of a metal film by electroplating increases in proportion to the strength of the electric current. Accordingly, in the case where the conductive underlying film 42 serving as a cathode electrode,is thin, the nearer to the center portion of the substrate (wafer) 1, the greater will be the electric resistance of the electrode, which retards the growth rate of the Pt film 45 precipitated on the surface of the conductive underlying film 42.

When the Pt film 45 is formed on the surface of the substrate (wafer) 1 by electroplating, the film forming time is controlled, in consideration of the scattering of the formation rate of the Pt film 45 in the plane of the substrate (wafer) 1, so that the surface height of the Pt film 45 would be sufficiently greater than that of the silicon oxide film 43 in a region contiguous to the outer periphery of the substrate (wafer) 1. By this control, it is possible to form the Pt film 45 so that the surface height thereof is equal to or greater than that of the silicon oxide film 43 even at the center portion of the substrate (wafer) 1 where the electric resistance of the cathode electrode becomes high.

Figure 22:
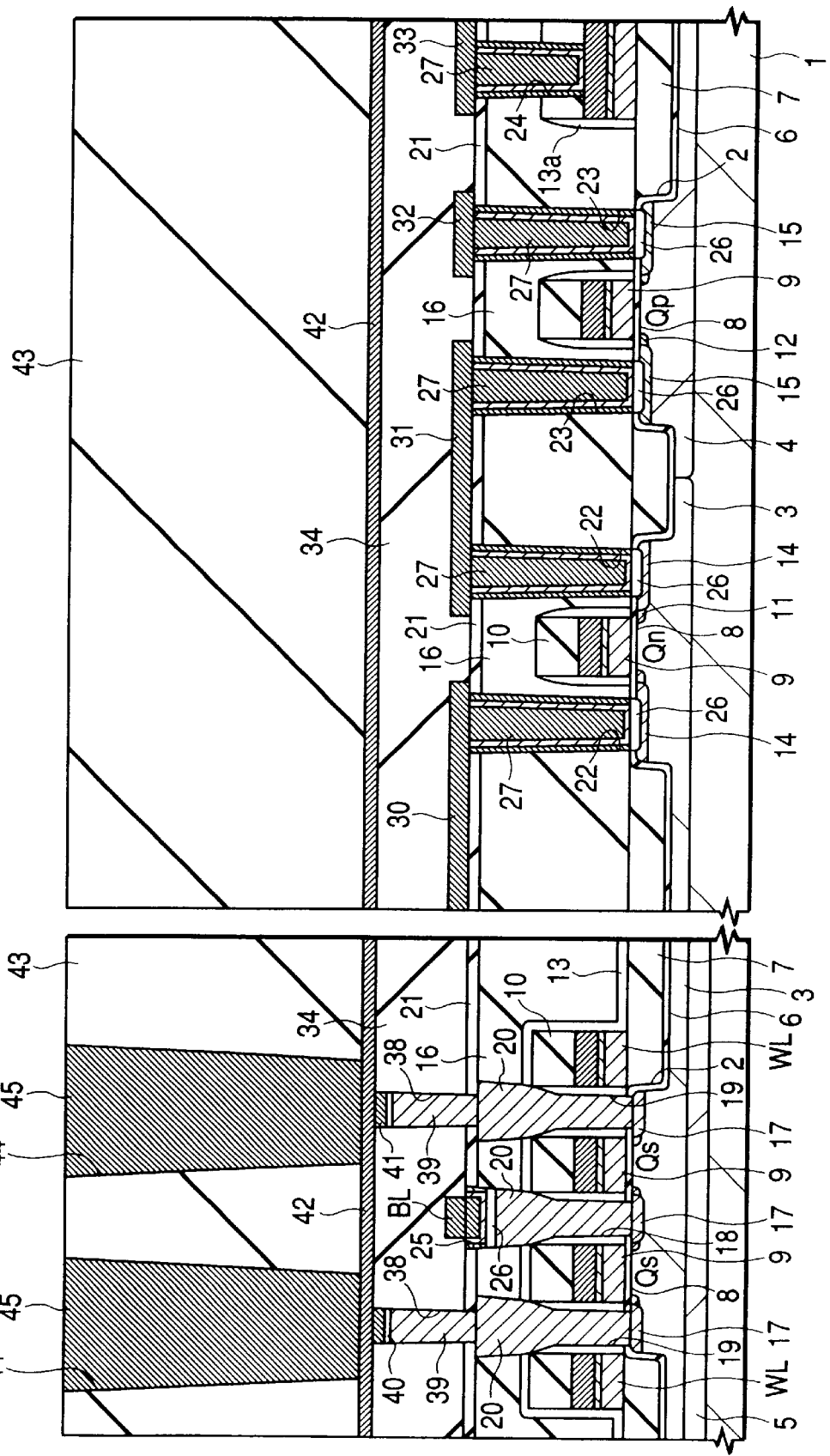
FIG. 22 is a fragmentary cross-sectional view of a substrate illustrating the process for manufacturing a DRAM according to Embodiment 1 of the present invention.

As illustrated in FIG. 22, the surface height of the Pt film 45 is made equal to that of the silicon oxide film 43 all over the substrate (wafer) 1 by polishing back the excessive Pt film 45, which has been exposed at the opening portion of the groove 44, by CMP or by etching it back by dry etching.

The surface height of the Pt film 45 and that of the silicon oxide film 43 can be more precisely equalized by depositing over the Pt film 45 a film having a similar etching rate to Pt, and then successively flattening the film and the Pt film 45. Alternatively, the flattening can be carried out by electrolytically removing a portion of the Pt film 45 which is greater than the surface height of the silicon oxide film 43 by making use of the reverse reaction to electroplating.

Figure 23:
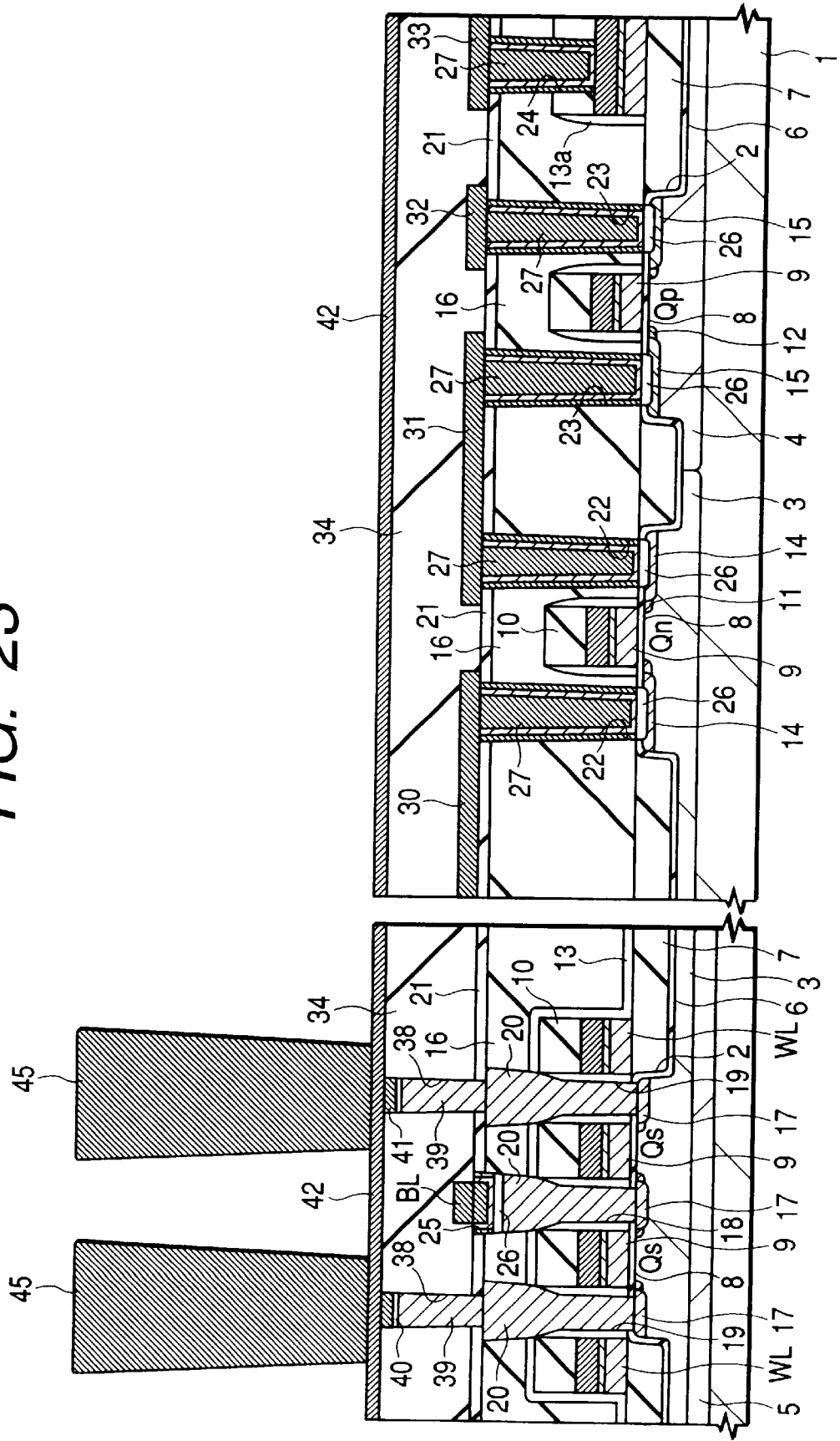
FIG. 23 is a fragmentary cross-sectional view of a substrate illustrating the process for manufacturing a DRAM according to Embodiment 1 of the present invention.

As illustrated in FIG. 23, the silicon oxide film 43 is then removed by wet etching using an etchant such as hydrofluoric acid. Since the conductive underlying film 42 under the silicon oxide film 43 serves as a stopper for etching, the silicon oxide film 34 under the conductive underlying film 42 is not presumably etched even by the over-etching of the silicon oxide film 43. Such a structure makes it possible to completely remove the thick silicon oxide film 43 and to prevent the Pt film 45, which has remained over the conductive underlying film 42 after removal of the silicon oxide film 43 and has a columnar shape with a large aspect ratio, from falling.

Figure 24:
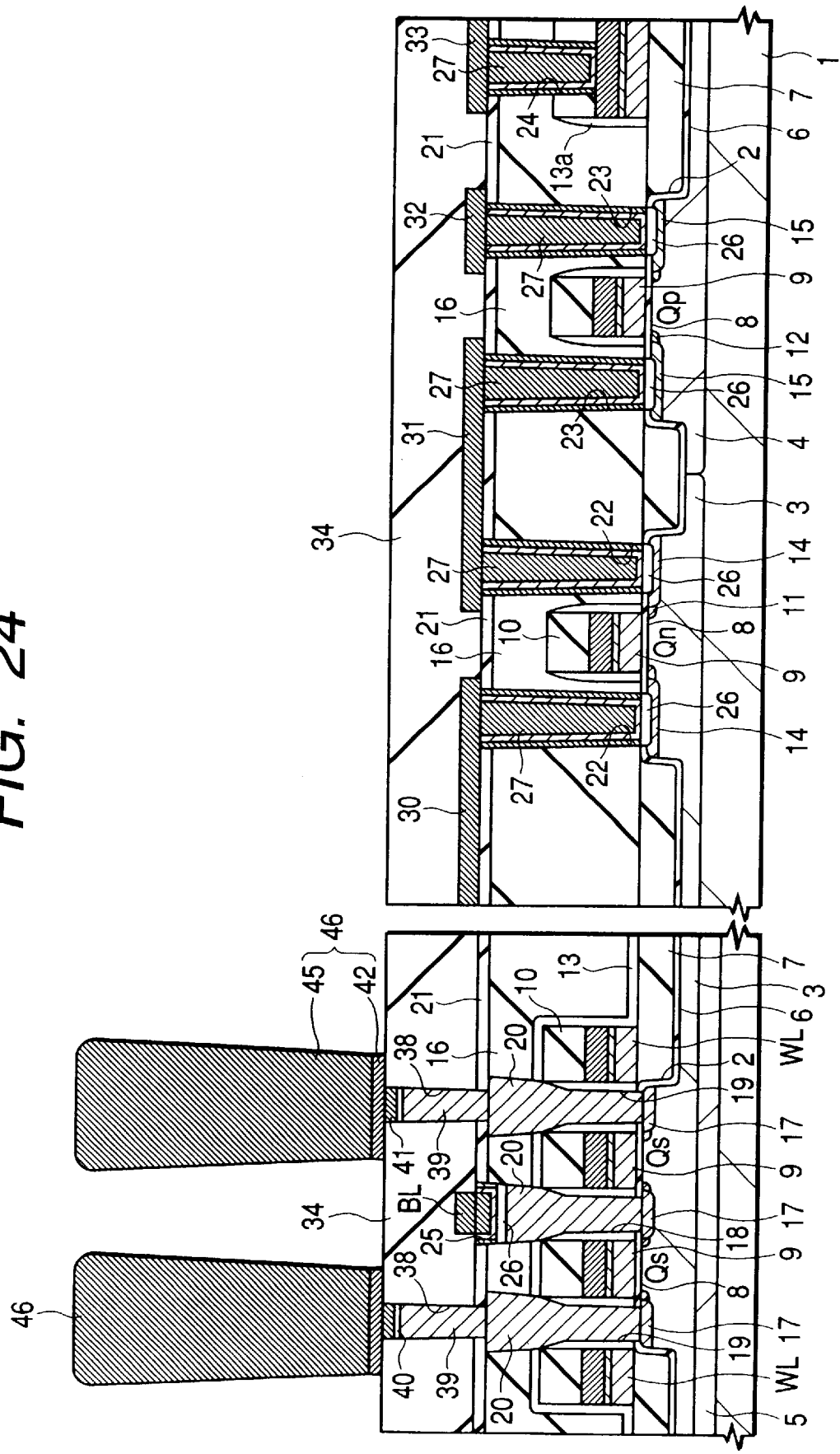
FIG. 24 is a fragmentary cross-sectional view of a substrate illustrating the process for manufacturing a DRAM according to Embodiment 1 of the present invention.

As illustrated in FIG. 24, the conductive underlying film 42 is dry-etched with the Pt film 45 as a mask, whereby a lower electrode 46 of the information storing capacitor formed of the Pt film 45 and the conductive underlying film 42 which has remained thereunder is formed. For the dry etching of the conductive underlying film 42, anisotropic etching making use of $CF_4$+Ar plasma containing Ar ions at a high ratio is used, for example.

As described above, when the Pt film constituting the conductive underlying film 42 is patterned by dry etching, a reaction product of a low vapor pressure is deposited on the side walls of the pattern, whereby the side walls of the conductive underlying film 42 which has remained under the Pt film 45 after etching will have a taper form with a diameter larger at the lower end portion than the upper end portion. In this Embodiment, however, the film thickness of the conductive underlying film 42 to be patterned by dry etching is sufficiently thin (about 50 to 60 nm) compared with the thickness of the Pt film 45 (about 500 nm) formed thereover that the extension of the pattern in the horizontal direction is slight even if it has taper-shaped side surfaces.

Accordingly, a short circuit between lower electrodes 46 can be prevented even if their distance is decreased, which makes it possible to reduce the size of the memory cell of a DRAM having the lower electrode 46 formed of the Pt film.

In addition, when the conductive underlying film 42 is dry etched with the Pt film 45 as a mask, the surface of the Pt film 45 which is made of the same material is also etched to some extent. As a result, the Pt film 45 has a roundly-etched shoulder portion (upper edge portion) as illustrated in FIG. 24, which improves step coverage of a capacitative insulating film (47) to be deposited over the lower electrode 46 in a subsequent step.

Figure 25:
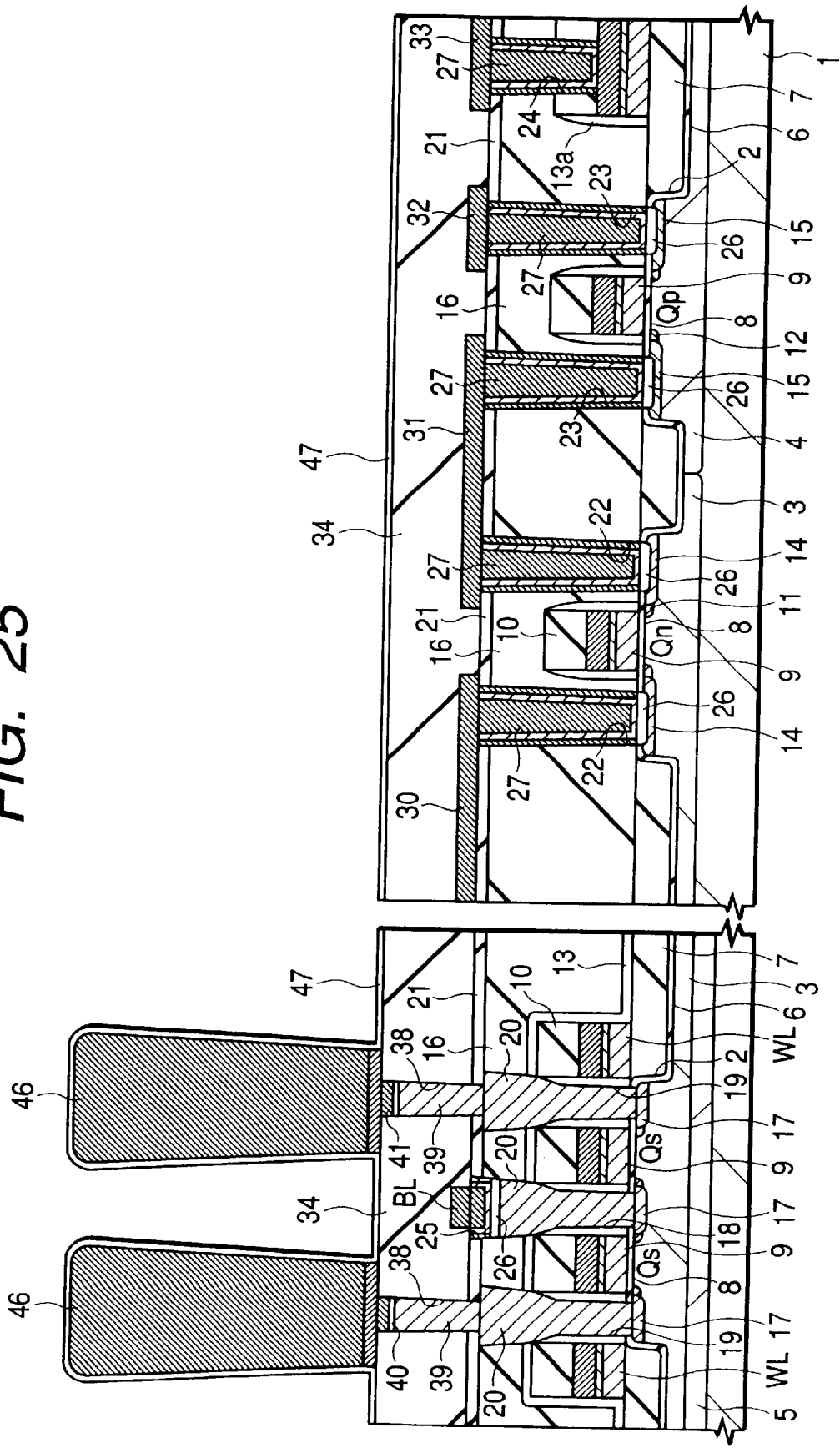
FIG. 25 is a fragmentary cross-sectional view of a substrate illustrating the process for manufacturing a DRAM according to Embodiment 1 of the present invention.

After washing the surface of the substrate 1, the capacitative insulating film 47 is deposited along the upper surface and side surfaces of the lower electrode 46 as illustrated in FIG. 25. The capacitative insulating film 47 is, for example, made of a BST film deposited by MOCVD (Metal Organic Chemical Vapor Deposition).

As described above, the lower electrode 46 has a rounded shoulder portion (upper edge portion) so that the capacitative insulating film 47 can be deposited along the upper surface and side surfaces of the lower electrode 46 with almost uniform film thickness. In other words, the capacitative insulating film 47 does not become thin at the shoulder portion of the lower electrode 46, which makes it possible to prevent the electrostatic focusing in the vicinity of the shoulder portion of the lower electrode 46, thereby preventing an increase in the leakage current resulting from this focusing.

For the improvement of the quality of the capacitative insulating film 47, the substrate 1 is thermally treated in an oxygen atmosphere of about 700° C. At this time, oxygen in the BST film constituting the capacitative insulating film 47 is diffused into the lower electrode 46 formed of a Pt film and a portion of it is diffused even into the connecting hole 38 below the lower electrode 46. As described above, however, the barrier metal film 41 has been formed on the surface of the plug 39 embedded inside of the connecting hole 38 in order to prevent diffusion of oxygen so that there is no fear of the surface of the plug 39 being oxidized by the above-described thermal treatment at high temperature.

Figure 26:
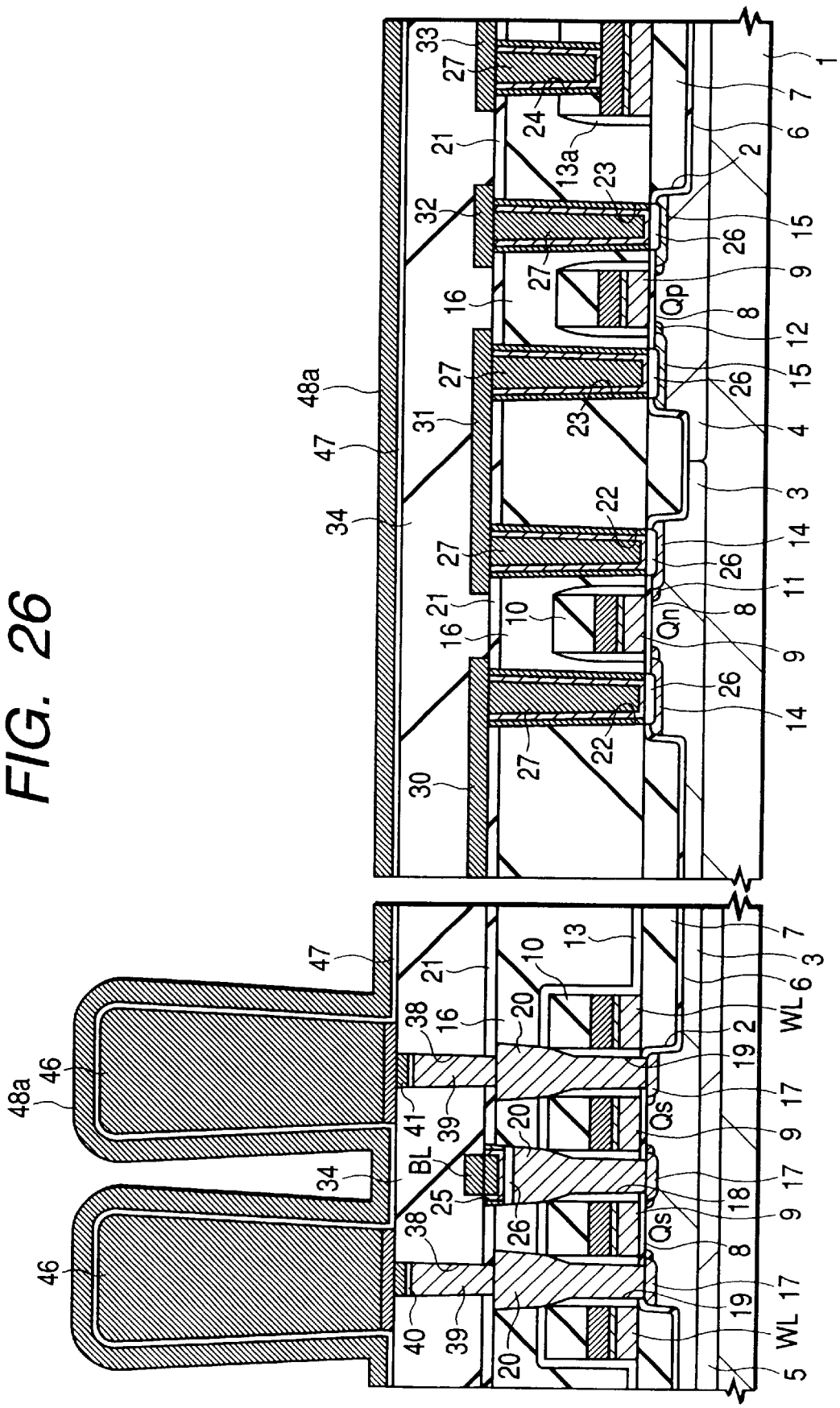
FIG. 26 is a fragmentary cross-sectional view of a substrate illustrating the process for manufacturing a DRAM according to Embodiment 1 of the present invention.
Figure 27:
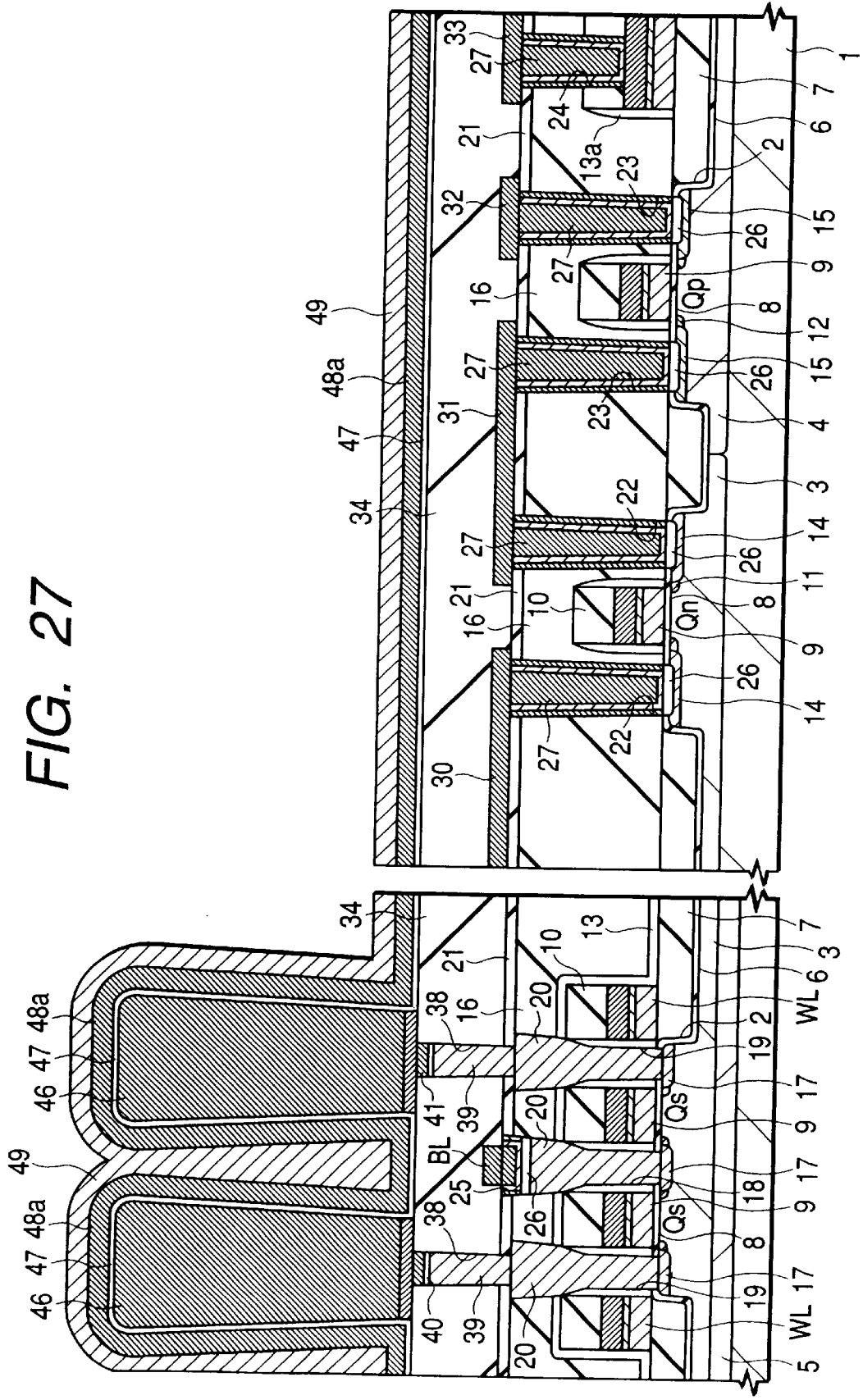
FIG. 27 is a fragmentary cross-sectional view of a substrate illustrating the process for manufacturing a DRAM according to Embodiment 1 of the present invention.

After deposition of a Pt film 48*a* (second conductor film), which is the material of an upper electrode of the information storing capacitor, over the capacitative insulating film 47 as illustrated in FIG. 26, a barrier metal film 49 is formed over the Pt film 48*a* as illustrated in FIG. 27.

The barrier metal film 49 over the Pt film 48*a* is formed in order to sufficiently secure electric connection between the upper electrode (48) and a plug (53) in a connecting hole (51) to be formed in an insulating film over the information storing capacitor in a subsequent step and at the same time, to prevent the oxidation of the plug (53) caused by diffusion of oxygen, which has been contained in the capacitative insulating film 47, through the Pt film 48*a*. The barrier metal film 49 is formed of a conductor film, for example, made of a (silicide) nitride of a high-melting point metal such as TaSiN, TaN, TiSiN, TiN, WSiN or WN deposited by sputtering or a solid solution of (Ti, Al)N, with the solid solution of (Ti, Al) N being particularly preferred.

Figure 28:
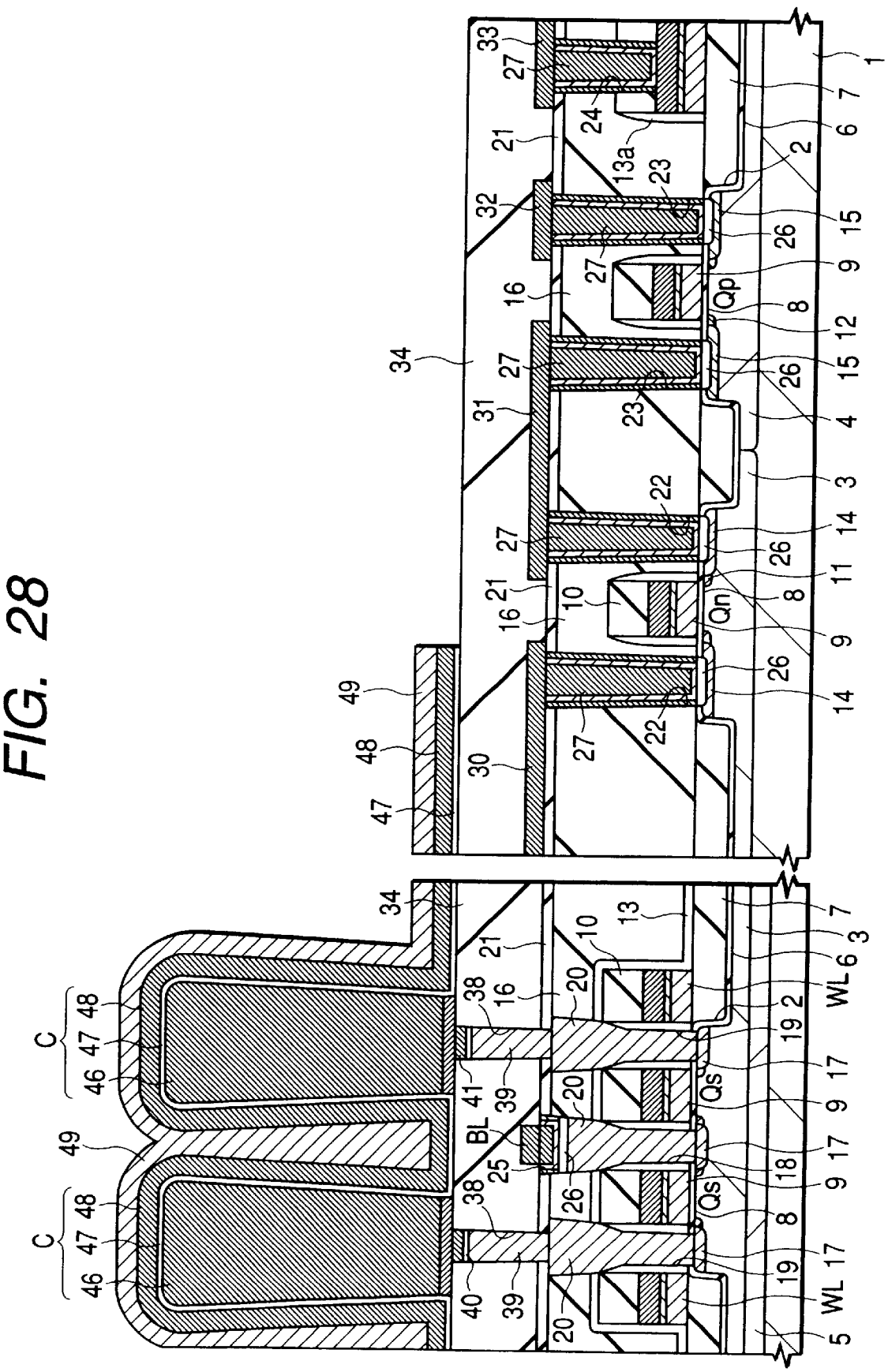
FIG. 28 is a fragmentary cross-sectional view of a substrate illustrating the process for manufacturing a DRAM according to Embodiment 1 of the present invention.

As illustrated in FIG. 28, the information storing capacitor C formed of the upper electrode 48 made of the Pt film 48*a*, the capacitative insulating film 47 made of the BST film and the lower electrode 46 made of the Pt film 45 is formed by removing the barrier metal film 49, Pt film 48*a* and capacitative insulating film 47 from the peripheral circuit region by dry etching with a photoresist film (not illustrated) as a mask. By the steps so far described, a memory cell having the information storing capacitor C and the memory cell selecting MISFETQs connected in series is completed.

Figure 30:
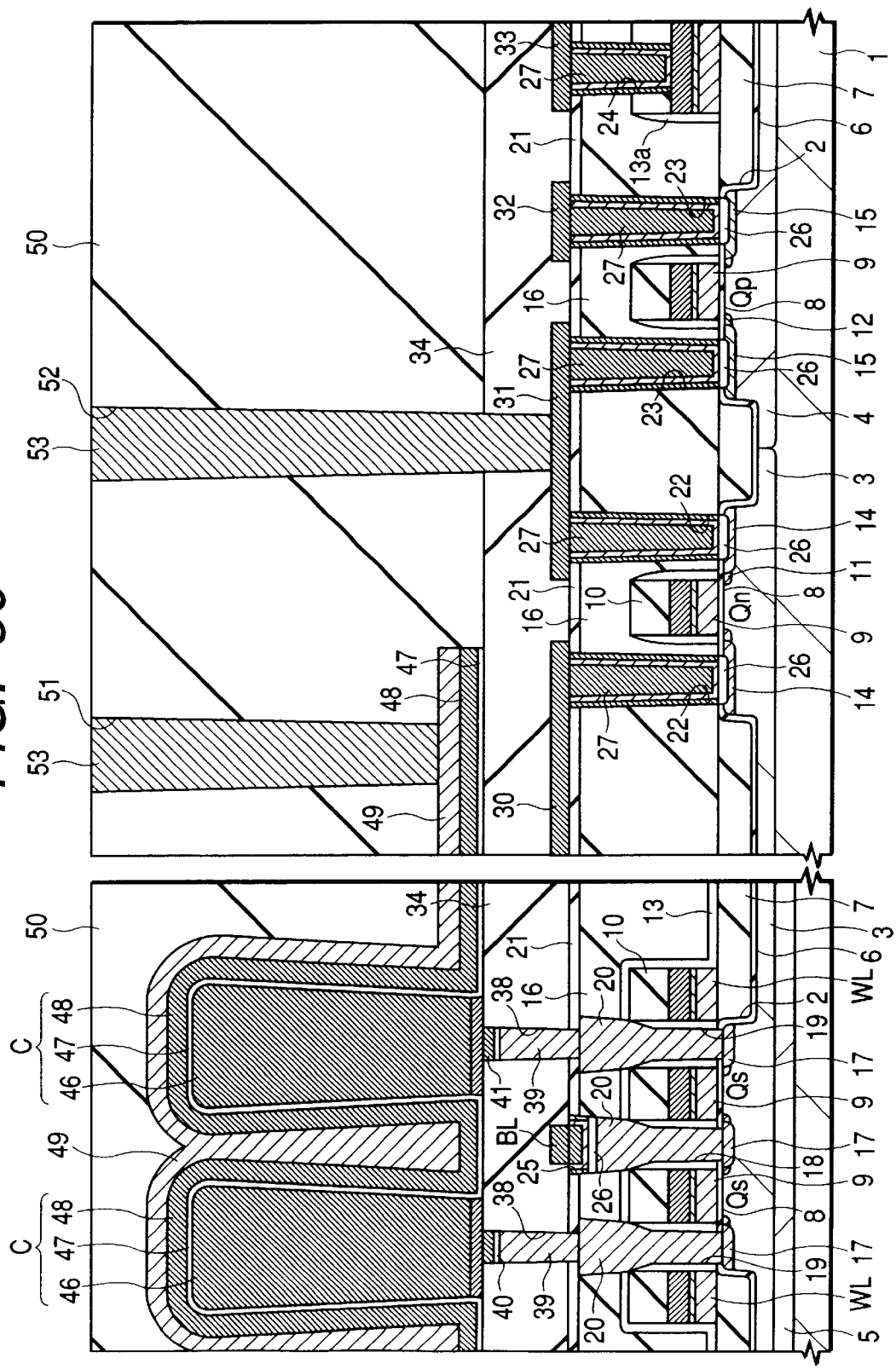
FIG. 30 is a fragmentary cross-sectional view of a substrate illustrating the process for manufacturing a DRAM according to Embodiment 1 of the present invention.

As illustrated in FIG. 29, a silicon oxide film 50 (fourth insulating film) is deposited by CVD over the information storing capacitor C, followed by flattening of its surface by CMP. Then, as illustrated in FIG. 30, the silicon oxide film 50 at the end portion of the memory cell array is dry etched with a photoresist film (not illustrated) as a mask, whereby the connecting hole 51 is formed over the upper electrode 48 of the information storing capacitor C. At the same time, a connecting hole 52 is formed over the first interconnection layer 31 by dry etching of the silicon oxide film 50 and underlying silicon oxide film 34 in the peripheral circuit region.

Then, the plug 53 (second conductive connector) is formed inside of each of the connecting holes 51, 52. This plug 53 is formed, for example, by depositing a W film by sputtering over the silicon oxide film 50 including the inside of each of the connecting holes 51, 52 and then etching back the W film to leave it only inside of the connecting holes 51 and 52. Existence of the barrier metal film 49 between the plug 53 of the connecting hole 51 and the upper electrode 48 makes it possible to prevent oxidation of the plug 53 caused by diffusion of oxygen in the capacitative insulating film 47 through the Pt film 48a constituting the upper electrode 48.

Figure 31:
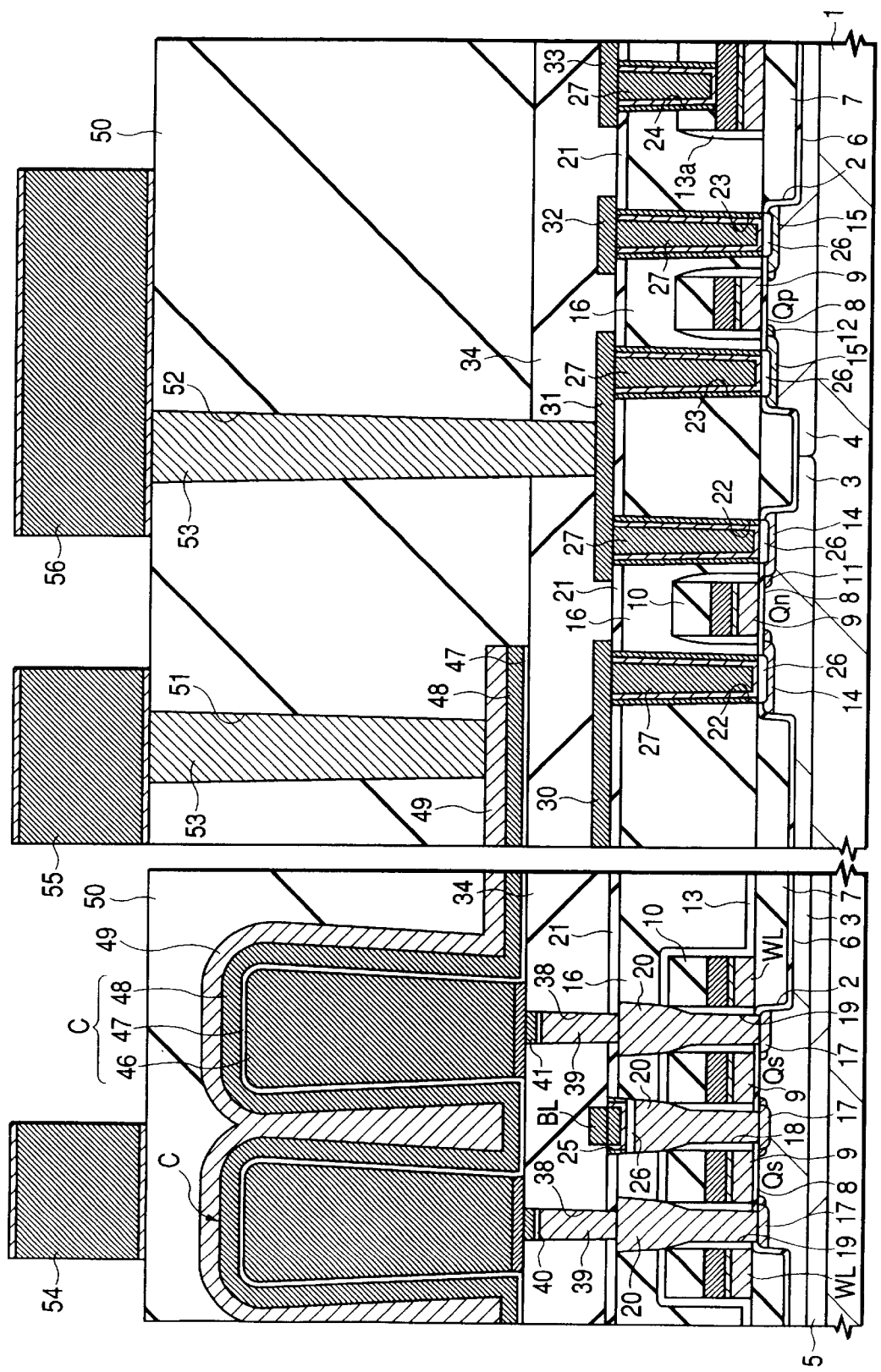
FIG. 31 is a fragmentary cross-sectional view of a substrate illustrating the process for manufacturing a DRAM according to Embodiment 1 of the present invention.

As illustrated in FIG. 31, second interconnection layers 54 to 56 are then formed over the silicon oxide film 50. These interconnections 54 to 56 are formed, for example, by depositing a TiN film, Al alloy film and TiN film successively over the silicon oxide film by sputtering and then patterning these films by dry etching with a photoresist film as a mask. Over these second interconnection layers 54 to 56, the third interconnection layer will be formed later through an insulating film, which are not however illustrated.

In this Embodiment, the conductive underlying film 42, lower electrode 46 and upper electrode 48 are each formed of a Pt film, but they may be formed of a film composed mainly of at least one conductive film of a platinum metal, platinum alloy or conductive oxide of a platinum metal such as Ru, Ir, Pt—Rh alloy, $RuO_2$ or $IrO_2$.

It is not necessary to use the same material for each of the Pt film 45 constituting the lower electrode 46, conductive underlying film 42 and upper electrode 48, but the most suitable material may be selected within a permissible range. For example, by forming the conductive underlying film 42 from an Ru film formed by sputtering, forming the Pt film from a Pt film formed by plating as in this Embodiment, and adopting the conditions permitting the etching rate of the conductive underlying film 42 to be larger than that of the Pt film 45 upon etching of the conductive underlying film 42a, a decrease in the height of the Pt film 45 serving as a mask can be reduced. Such conditions permitting the etching rate of the Ru film (conductive underlying film 42) greater than that of the Pt film 45 are presumed to be attained, for example, by dry etching with a 9:1 mixed gas plasma of oxygen and chlorine, which utilizes the fact that Ru can be etched by the chemical action of an $O_2$ based gas at a relatively low temperature.

In this Embodiment, the lower electrode material (Pt film 45) is formed on the surface of the conductive underlying film 42 by electroplating using the conductive underlying film 42 as a cathode electrode. Alternatively, the lower electrode material (Pt film 45) may be formed on the surface of the conductive underlying film 42 by electroless plating using the conductive underlying film 42 as a catalyst or by selective CVD.

In this Embodiment, the capacitative insulating film 47 is formed of a BST film deposited by MOCVD. It is also possible to constitute it from a film composed mainly of a high dielectric film or a ferroelectric film having a perovskite or complex perovskite structure such as PZT, PLT, PLZT, $PbTiO_3$, $SrTiO_3$, $BaTiO_3$, BST, SBT or $Ta_2O_5$. For the formation of such a film, sputtering or the sol-gel method may be used.

(Embodiment 2)

The process for manufacturing a DRAM according to Embodiment 2 of the present invention will next be described in the order of its steps with reference to FIGS. 32 to 40.

Figure 32:
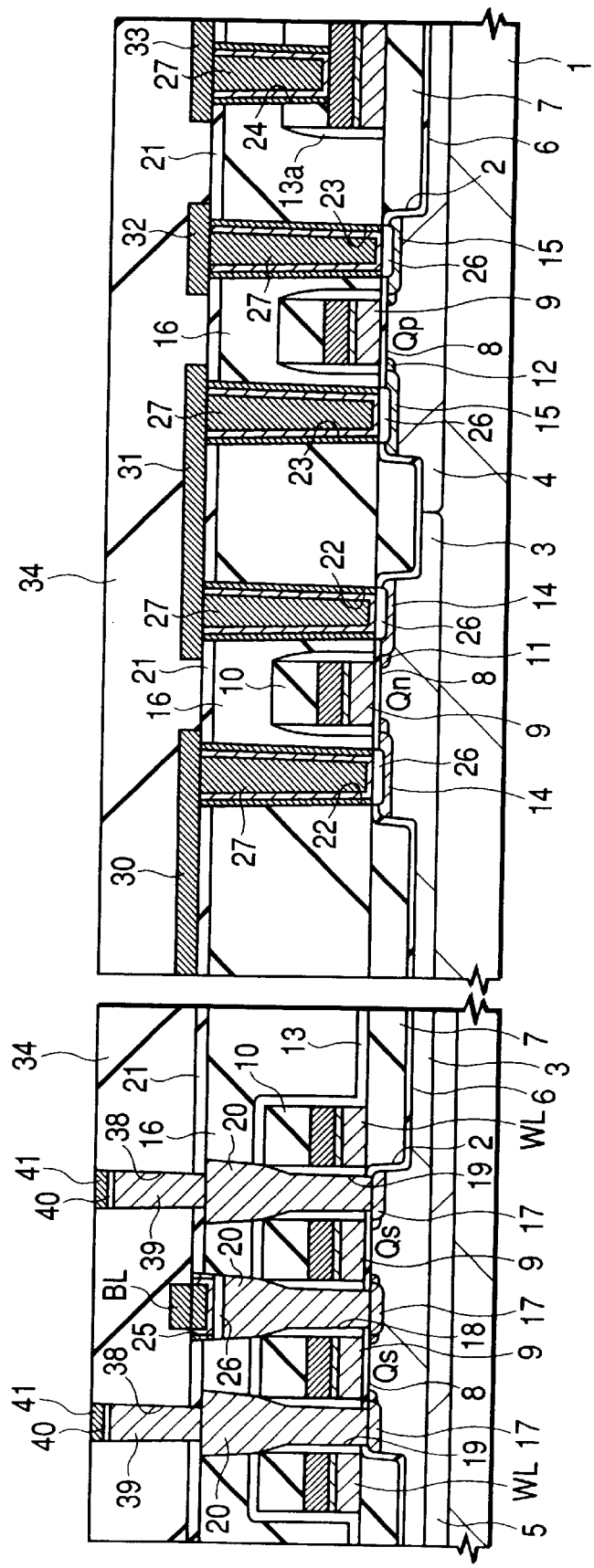
FIG. 32 is a fragmentary cross-sectional view of a substrate illustrating a process for manufacturing a DRAM according to Embodiment 2 of the present invention.

As illustrated in FIG. 32, after formation of a memory cell selecting MISFETQs in the memory cell array and n-channel type MISFETQn and p-channel type MISFETQp in the peripheral circuit region, a bit line BL is formed in the memory cell array, while first interconnection layers 30 to 33 are formed in the peripheral circuit region. A connecting hole 38 is then formed in a silicon oxide film 34 deposited over the bit line BL and the first interconnection layers 30 to 33, followed by successive formation of a plug 39, a silicide film 40 and a barrier metal film 41 inside of the connecting hole 38. These steps so far described are similar to those in Embodiment 1.

Figure 33:
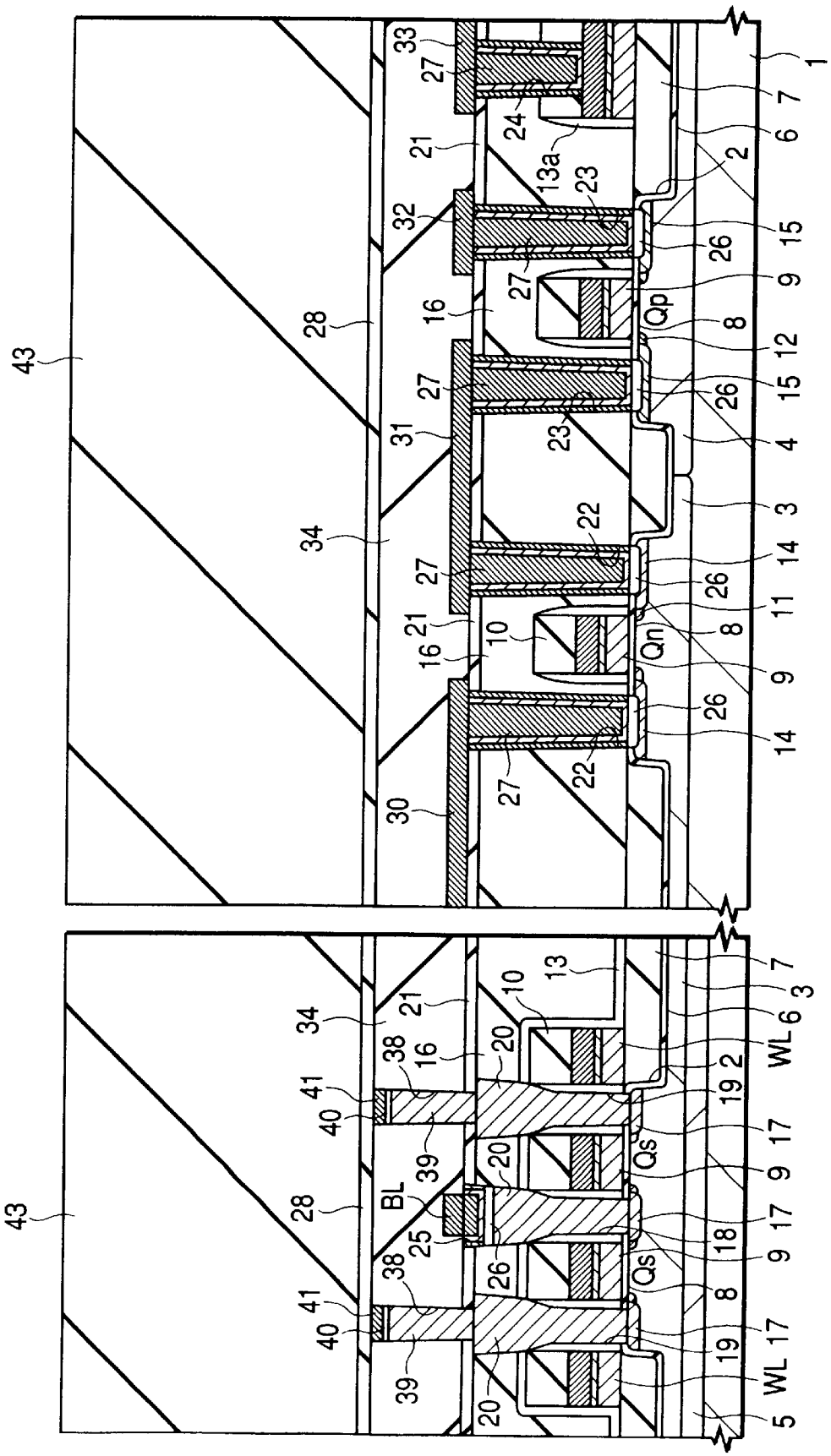
FIG. 33 is a fragmentary cross-sectional view of a substrate illustrating the process for manufacturing a DRAM according to Embodiment 2 of the present invention.
Figure 34:
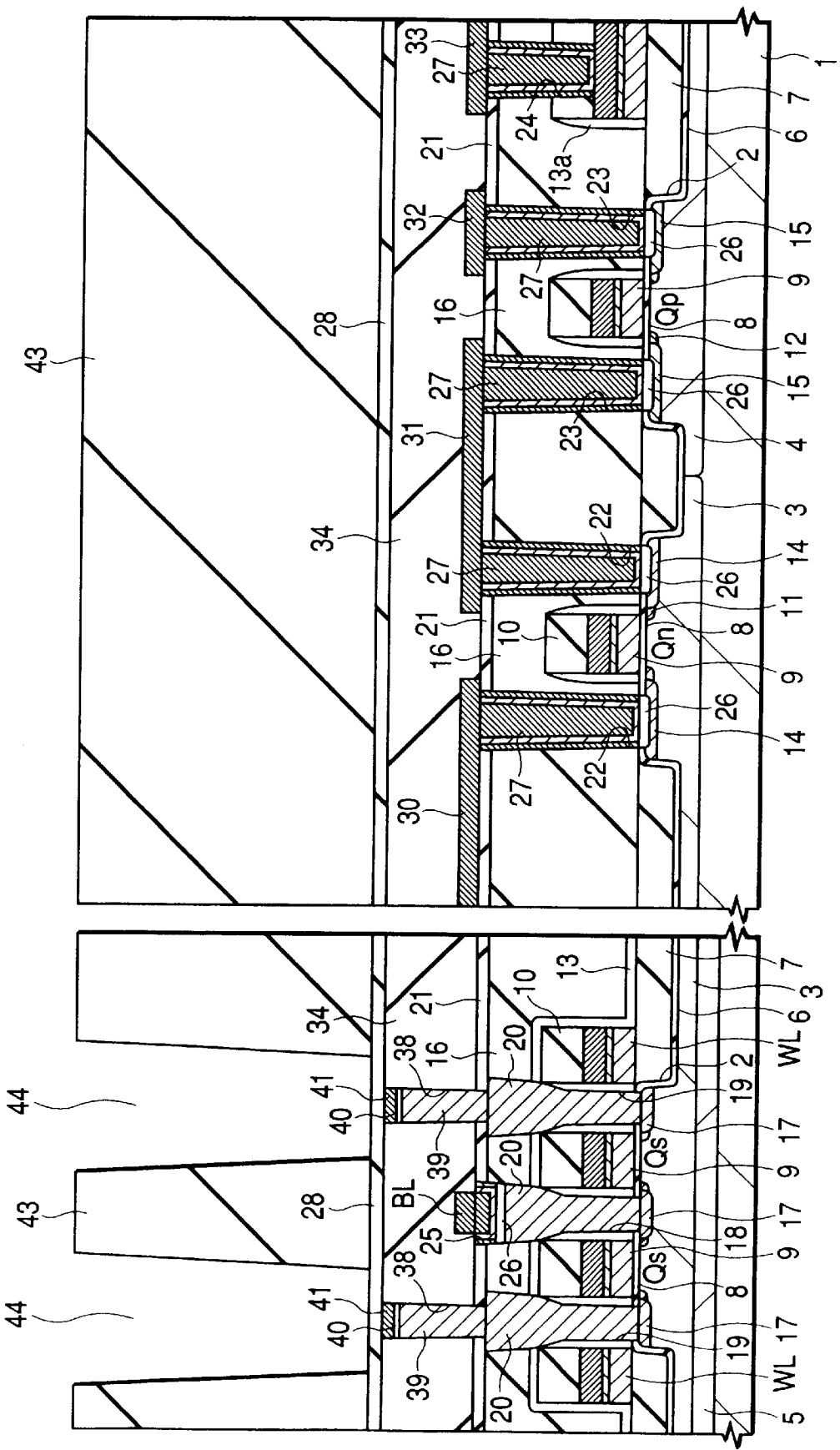
FIG. 34 is a fragmentary cross-sectional view of a substrate illustrating the process for manufacturing a DRAM according to Embodiment 2 of the present invention.

As illustrated in FIG. 33, a silicon nitride film 28 is then deposited to give a film thickness of about 50 to 60 nm by CVD over the bit line BL and the first interconnection layers 30 to 33, followed by the deposition of a silicon oxide film 43 of about 500 nm thick by CVD over the silicon nitride film 28. Then, the silicon oxide film 43 of the memory cell array is dry etched with a photoresist film (not illustrated) as a mask, whereby a groove 44 is formed over the connecting hole 38.

Upon formation of the groove 44 by dry etching of the silicon oxide film 43, the silicon nitride film 28 thereunder is utilized as a stopper for etching, which makes it possible to securely form the groove 44 with a small etching margin, because the silicon oxide film 34 lying under the silicon nitride film 28 is not etched even over-etching of the silicon oxide film 43.

Figure 35:
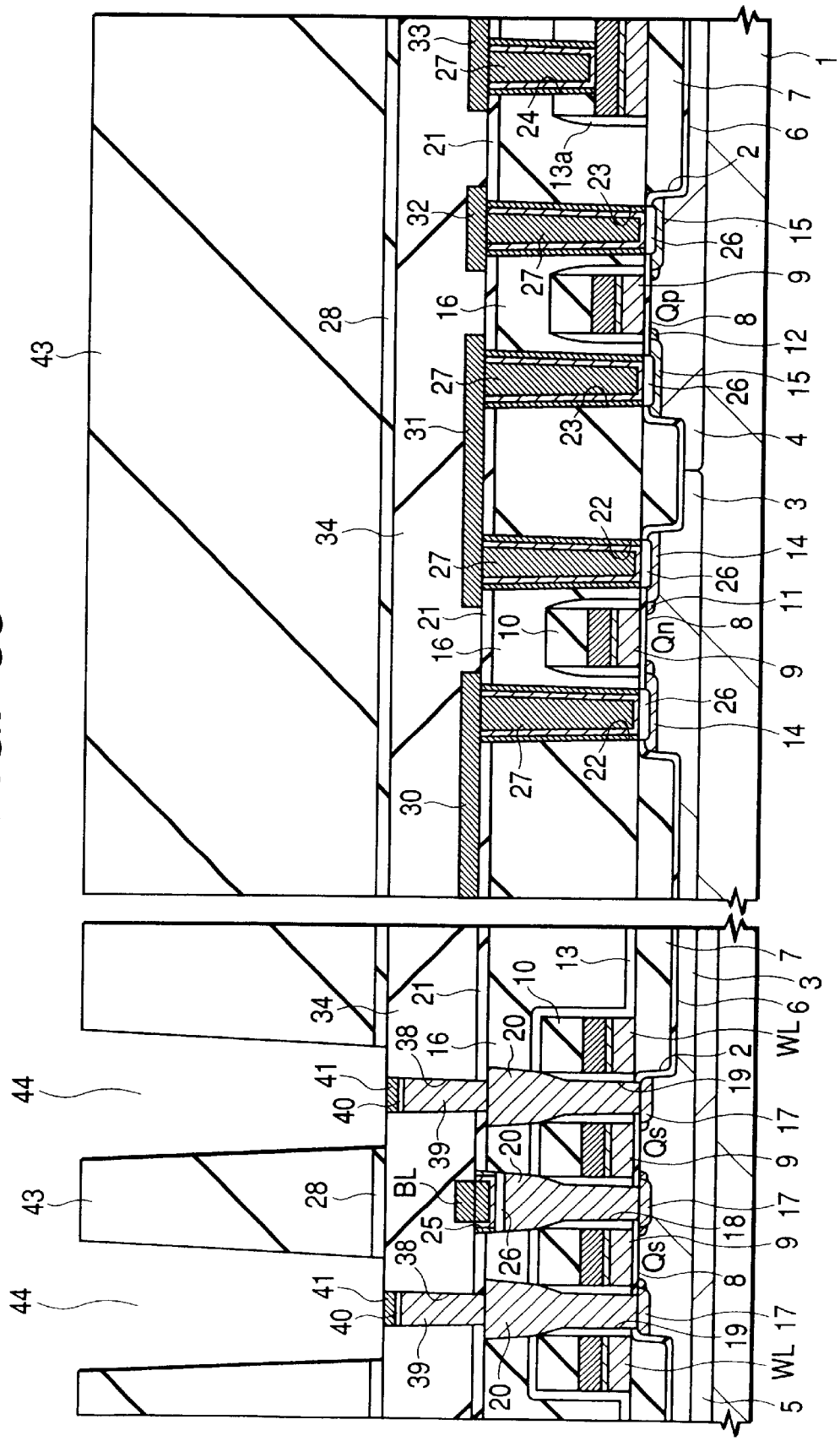
FIG. 35 is a fragmentary cross-sectional view of a substrate illustrating the process for manufacturing a DRAM according to Embodiment 2 of the present invention.
Figure 36:
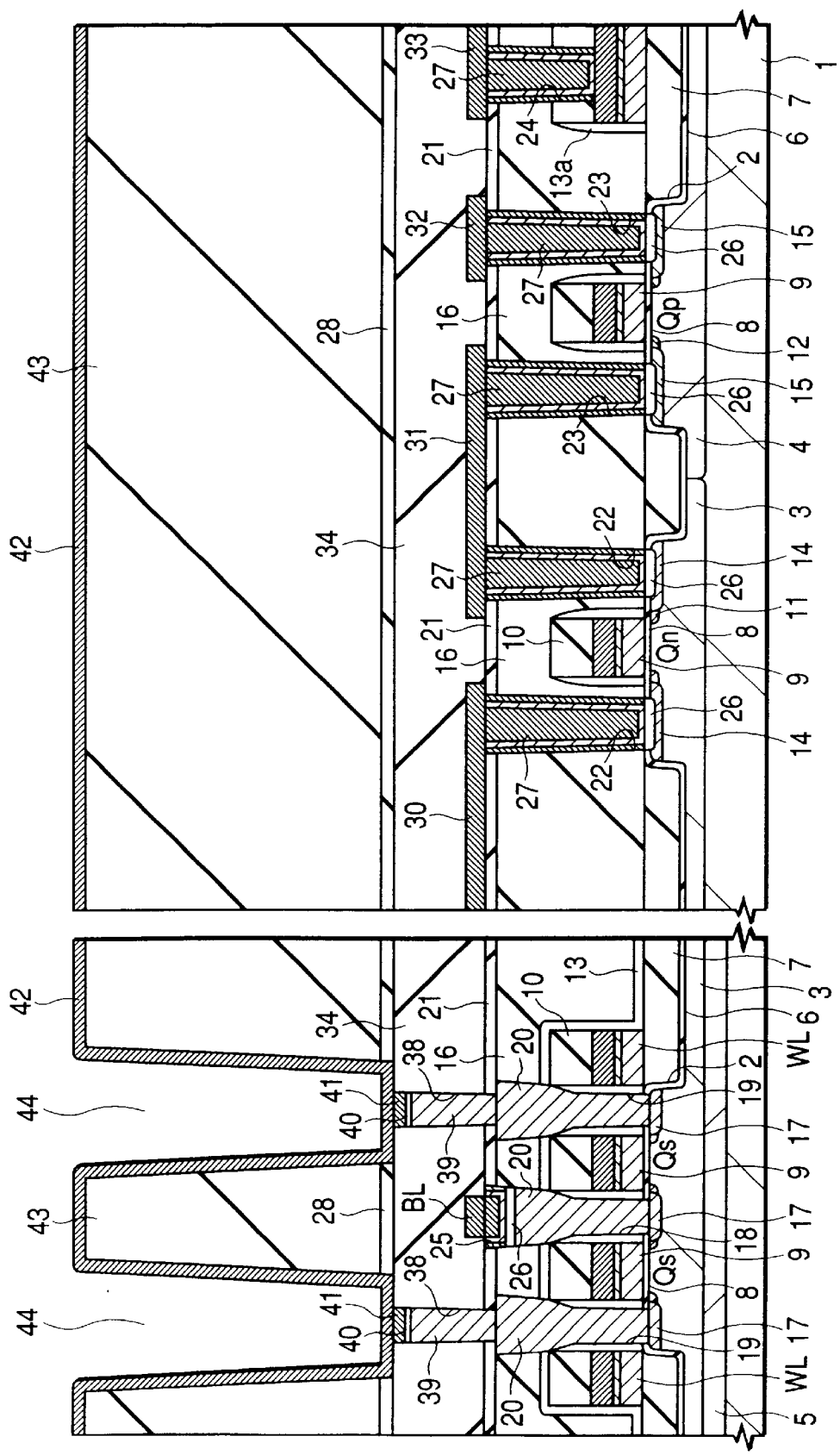
FIG. 36 is a fragmentary cross-sectional view of a substrate illustrating the process for manufacturing a DRAM according to Embodiment 2 of the present invention.

After the silicon nitride film 28 exposed at the bottom of the groove 44 is removed by dry etching as illustrated in FIG. 35, a conductive underlying film 42 is deposited over the silicon oxide film 34 including the inside of the groove 44 as illustrated in FIG. 36. This conductive underlying film 42 is used as a cathode electrode upon formation of a metal film, which will become a lower electrode material of the information storing capacitor, by electroplating and it is, for example, made of a Pt film of about 50 to 60 nm thick deposited by sputtering.

Figure 37:
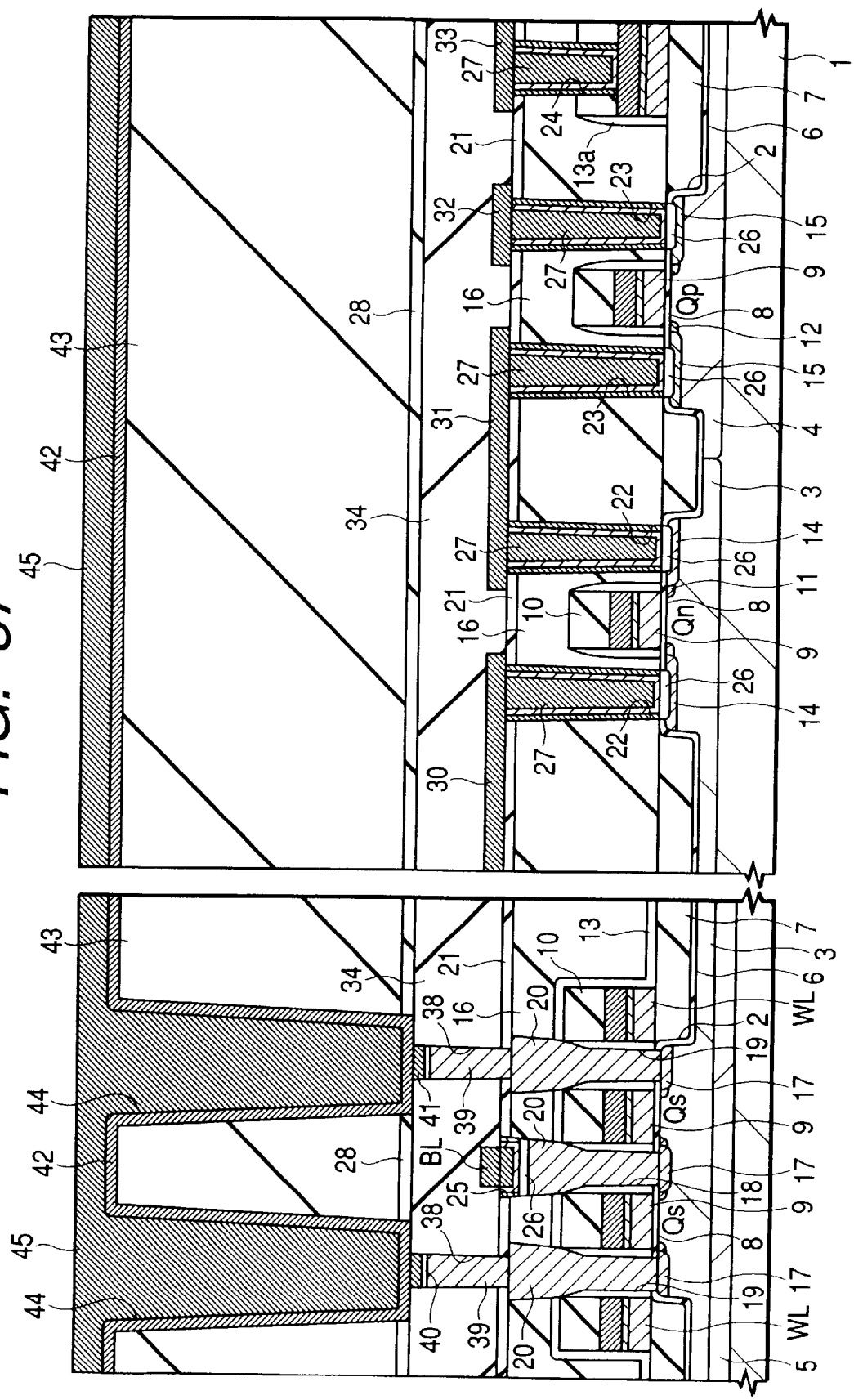
FIG. 37 is a fragmentary cross-sectional view of a substrate illustrating the process for manufacturing a DRAM according to Embodiment 2 of the present invention.

As illustrated in FIG. 37, the Pt film 45 is precipitated on the surface of the conductive underlying film 42 by electroplating using the conductive underlying film 42 as a cathode electrode. Similar to Embodiment 1, the Pt film 45 is formed so that its surface height becomes higher than that of the silicon oxide film 43, that is, the depth of the groove 44. In this Embodiment, in contrast to Embodiment 1, the conductive underlying film 42, which will serve as a cathode electrode, is formed at the bottom and side walls of the groove 44, which permits the growth of the PT film 45 not only from the bottom of the groove but also from the side walls. Accordingly, the Pt film 45 can be formed in a shorter time compared with the Embodiment 1 wherein the conductive underlying film 42 is formed only at the bottom of the groove 44.

Figure 38:
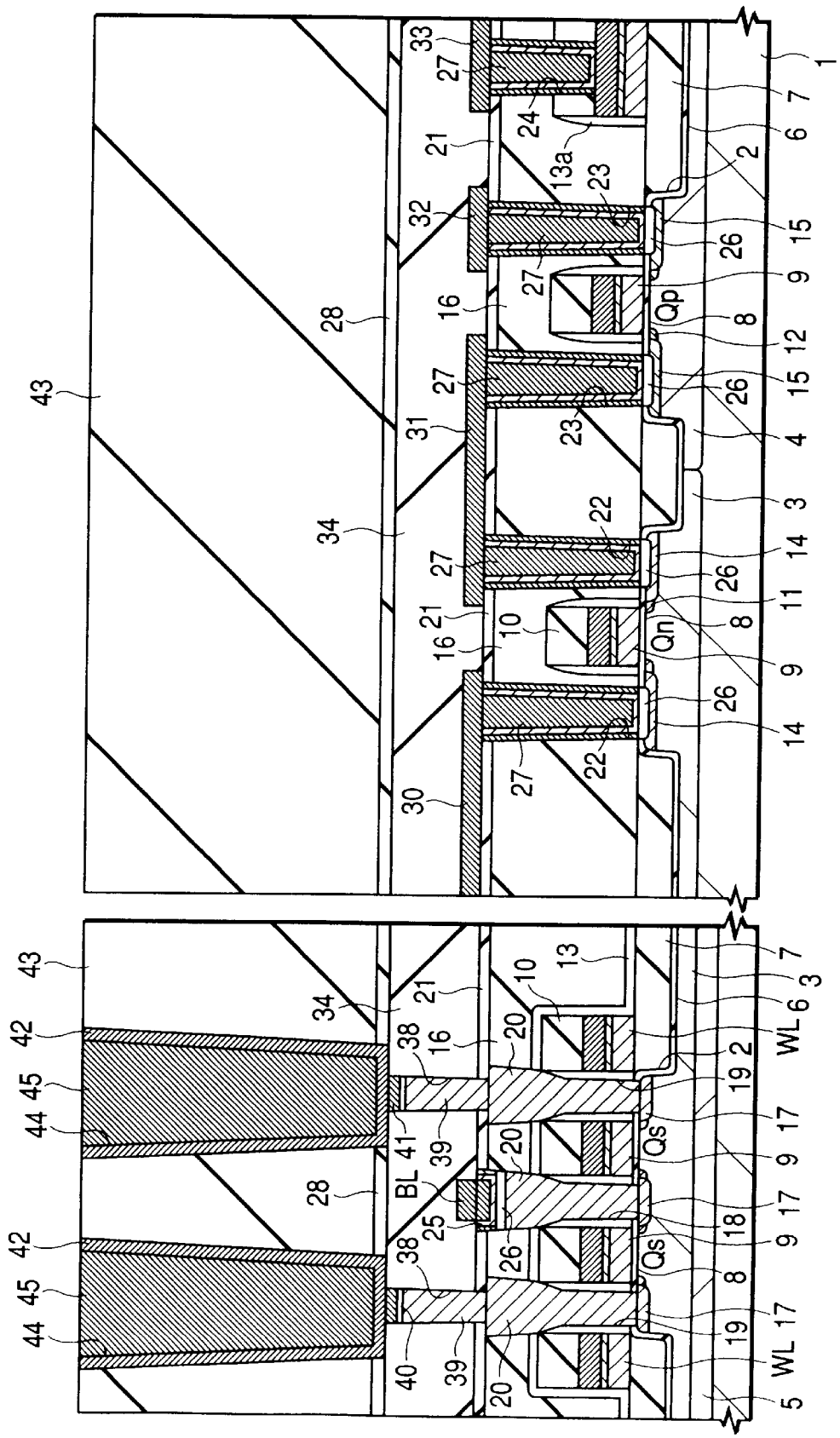
FIG. 38 is a fragmentary cross-sectional view of a substrate illustrating the process for manufacturing a DRAM according to Embodiment 2 of the present invention.

As illustrated in FIG. 38, the Pt film 45 and the conductive underlying film 42 over the silicon oxide film 43 are removed by polishing back through CMP (or etching back through dry etching) to leave them only inside of the groove 44, whereby the surface height of the Pt film 45 is made equal to that of the silicon oxide film 43.

Figure 39:
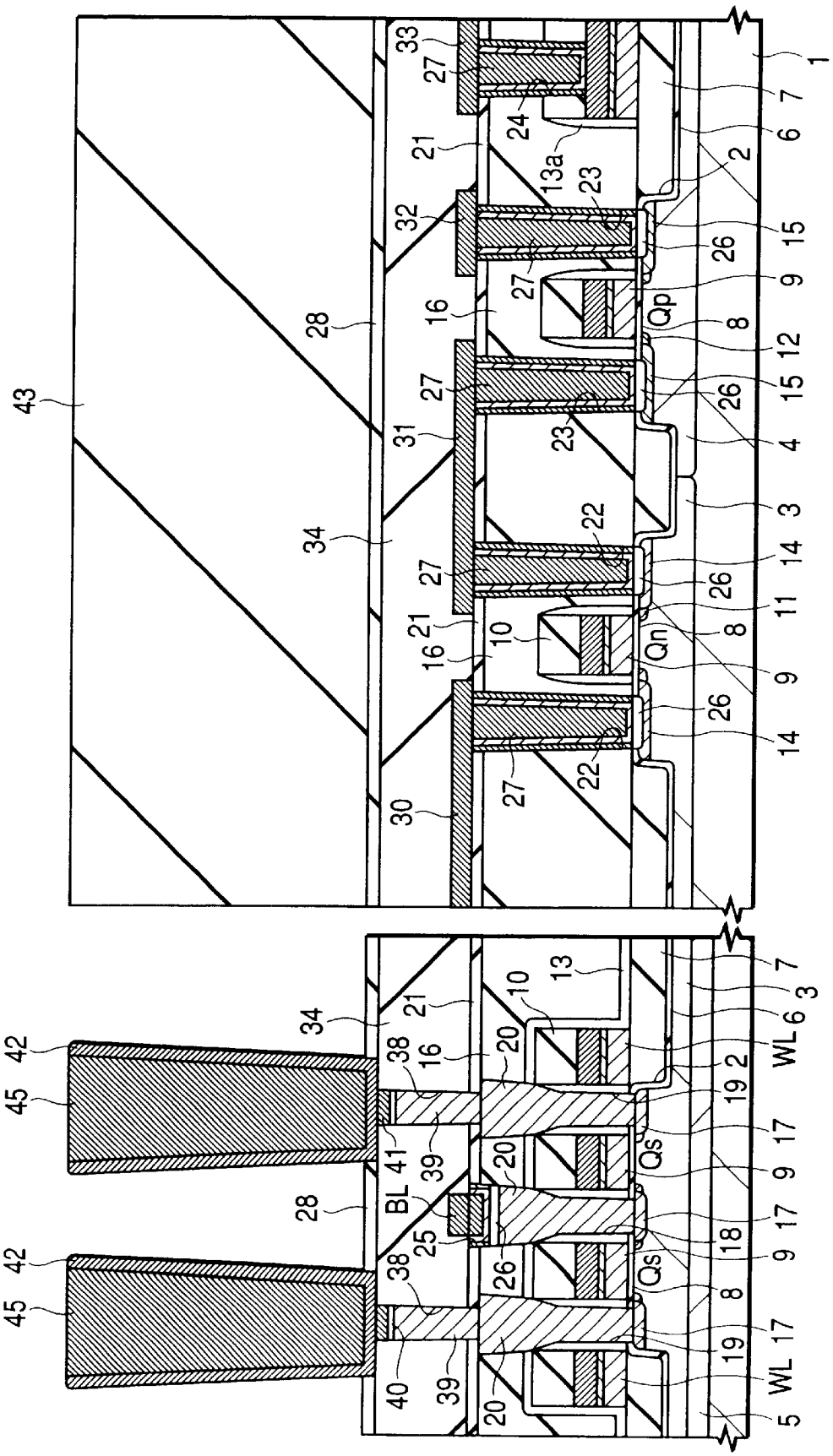
FIG. 39 is a fragmentary cross-sectional view of a substrate illustrating the process for manufacturing a DRAM according to Embodiment 2 of the present invention.

As illustrated in FIG. 39, the silicon oxide film 43 is then removed from the memory cell array by wet etching with a photoresist film (not illustrated) as a mask to form a lower electrode 46 of the information storing capacitor C which is formed of the Pt film 45 and the conductive underlying film 42 covering the bottom and side surfaces of the Pt film 45.

Since the silicon nitride film 28 lying under the silicon oxide film 43 is used as a stopper for the above-described wet etching, there is no tear that the silicon oxide film 34 underlying the silicon nitride film 28 is not etched even by the over-etching of the silicon oxide film 43. Such a structure makes it possible to completely remove the thick silicon oxide film 43 and to prevent the lower electrode 46, which is formed over the silicon oxide film 34 and has a columnar shape with a large aspect ratio, from falling.

In addition, by leaving the thick silicon oxide film 34 in the peripheral circuit region, a step difference between the memory cell array and the peripheral circuit region after the formation of the information storing capacitor can be reduced, leading to an improvement in the processing accuracy of the second interconnection layers to be formed over the silicon oxide film 34 in the subsequent step.

Figure 40:
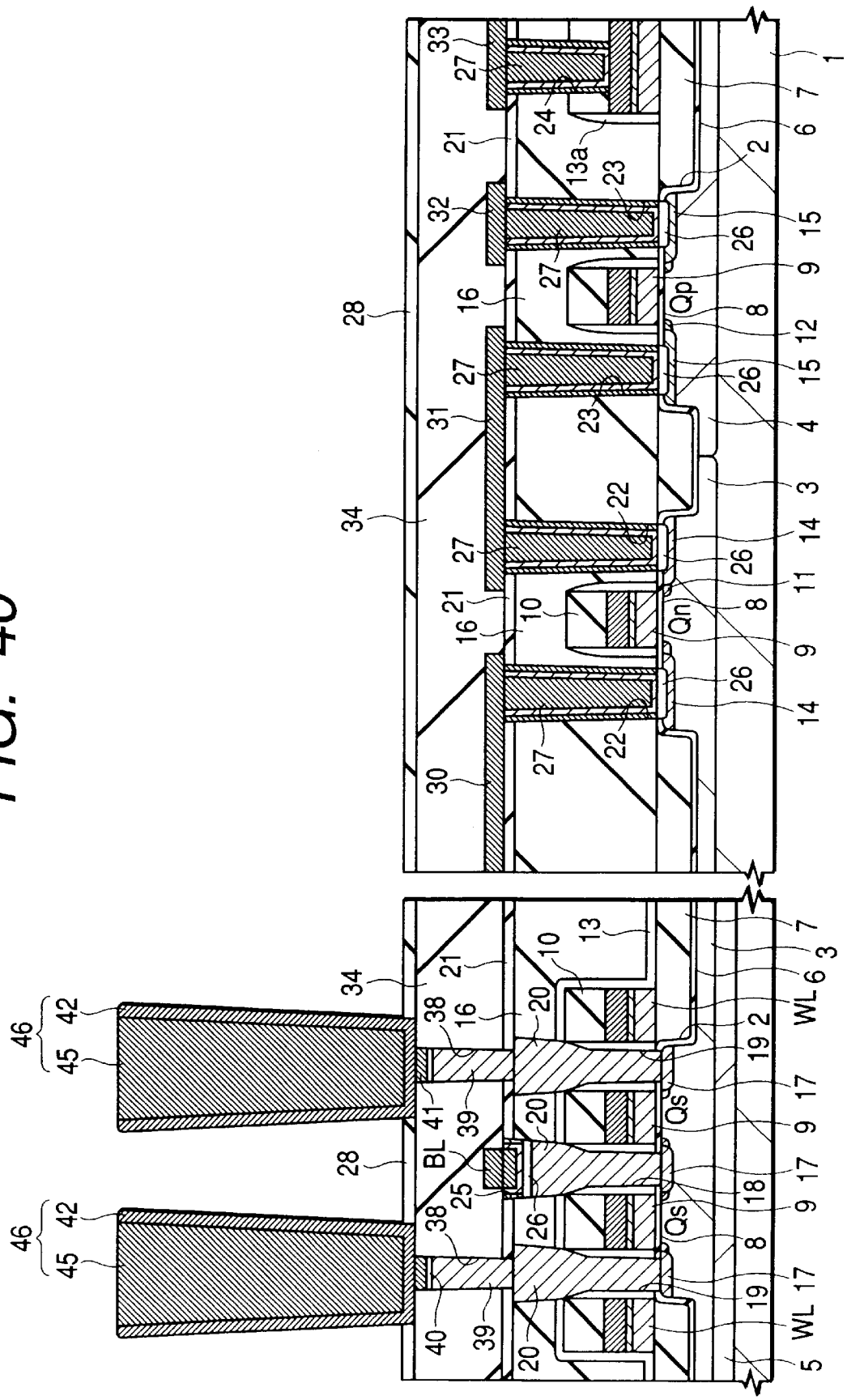
FIG. 40 is a fragmentary cross-sectional view of a substrate illustrating the process for manufacturing a DRAM according to Embodiment 2 of the present invention.

Upon removal of the silicon oxide film 43 from the memory cell array, the silicon oxide film 43 in the peripheral circuit region may be removed at the same time as illustrated in FIG. 40 in this case, the photoresist film covering the silicon oxide film 43 of the peripheral circuit region becomes unnecessary, which makes it possible to decrease the number of the photo masks. In addition, when the thick silicon oxide film 43 is not left in the peripheral circuit region, the thickness of an insulating film, which is to be formed over the silicon oxide film 34 in the peripheral circuit region by a subsequent step, decreases, which makes it possible to reduce the aspect ratio of the connecting hole for connecting the second interconnection layers with the first interconnection layers in the peripheral circuit region, thereby improving the processing accuracy of the connecting hole.

Although not illustrated in the drawings, a capacitative insulating film is then formed on the upper surface and side surfaces of the lower electrode 46 as in Embodiment 1, followed by deposition of a PT film, which will become an upper electrode material, over the capacitative insulating film, The Pt film and the capacitative insulating film are then patterned by dry etching with a photoresist film as a mask, whereby the information storing capacitor is formed. Over the information storing capacitor, about two Al interconnection layers are thereafter formed.

In the manufacturing process according to this Embodiment, the conductive underlying film 42, which will become a cathode electrode upon formation of a lower electrode material of the information storing capacitor by electroplating, is formed over the silicon oxide film 34. Upon removal of the Pt film 45 lying over the silicon oxide film 43 by polishing back through CMP, the conductive underlying film 42 is removed simultaneously, which makes it possible to omit such an etching step for only the conductive underlying film 42 as in Embodiment 1.

When the conductive underlying film 42 is etched with the Pt film 45 as a mask as in Embodiment 1, the Pt film 45 is etched at the same time, which decreases the height of the lower electrode 46. In the manufacturing process according to this Embodiment, on the other hand, the height of the lower electrode 46 can be made equal to the depth of the groove 44 so that a decrease in the surface area of the lower electrode 46 by etching can be suppressed.

(Embodiment 3)

The manufacturing process of a DRAM according to Embodiment 3 of the present invention will next be described in the order of steps with reference to FIGS. 41 to 47.

Figure 41:
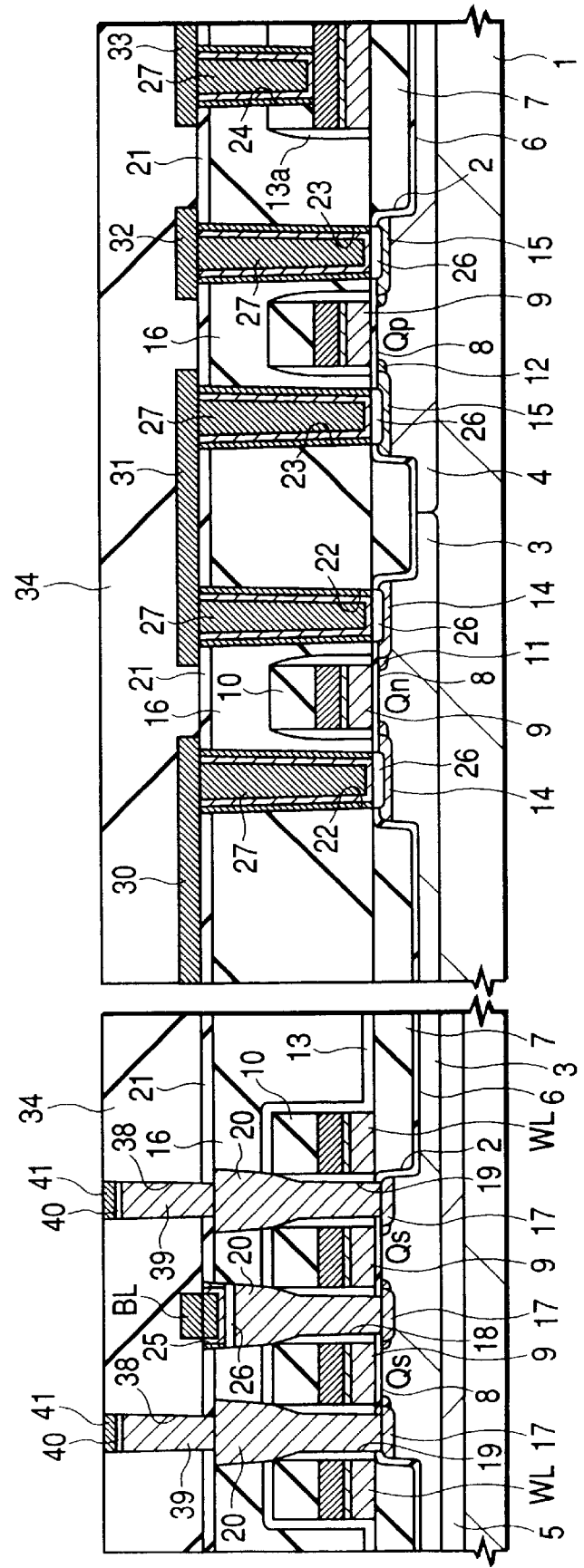
FIG. 41 is a fragmentary cross-sectional view of a substrate illustrating a process for manufacturing a DRAM according to Embodiment 3 of the present invention.

As illustrated in FIG. 41, after formation of a memory cell selecting MISFETQs in the memory cell array and n-channel type MISFETQn and p-channel type MISFETQp in the peripheral circuit region, a bit line BL is formed in the memory cell array, while first interconnection layers 30 to 33 are formed in the peripheral circuit region. A connecting hole 38 is then formed in a silicon oxide film 34 deposited over the bit line BL and the first interconnection layers 30 to 33, followed by successive formation of a plug 39, a silicide film 40 and a barrier metal film 41 inside of the connecting hole 38. The steps so far described are similar to those of Embodiment 1 or Embodiment 2.

Figure 42:
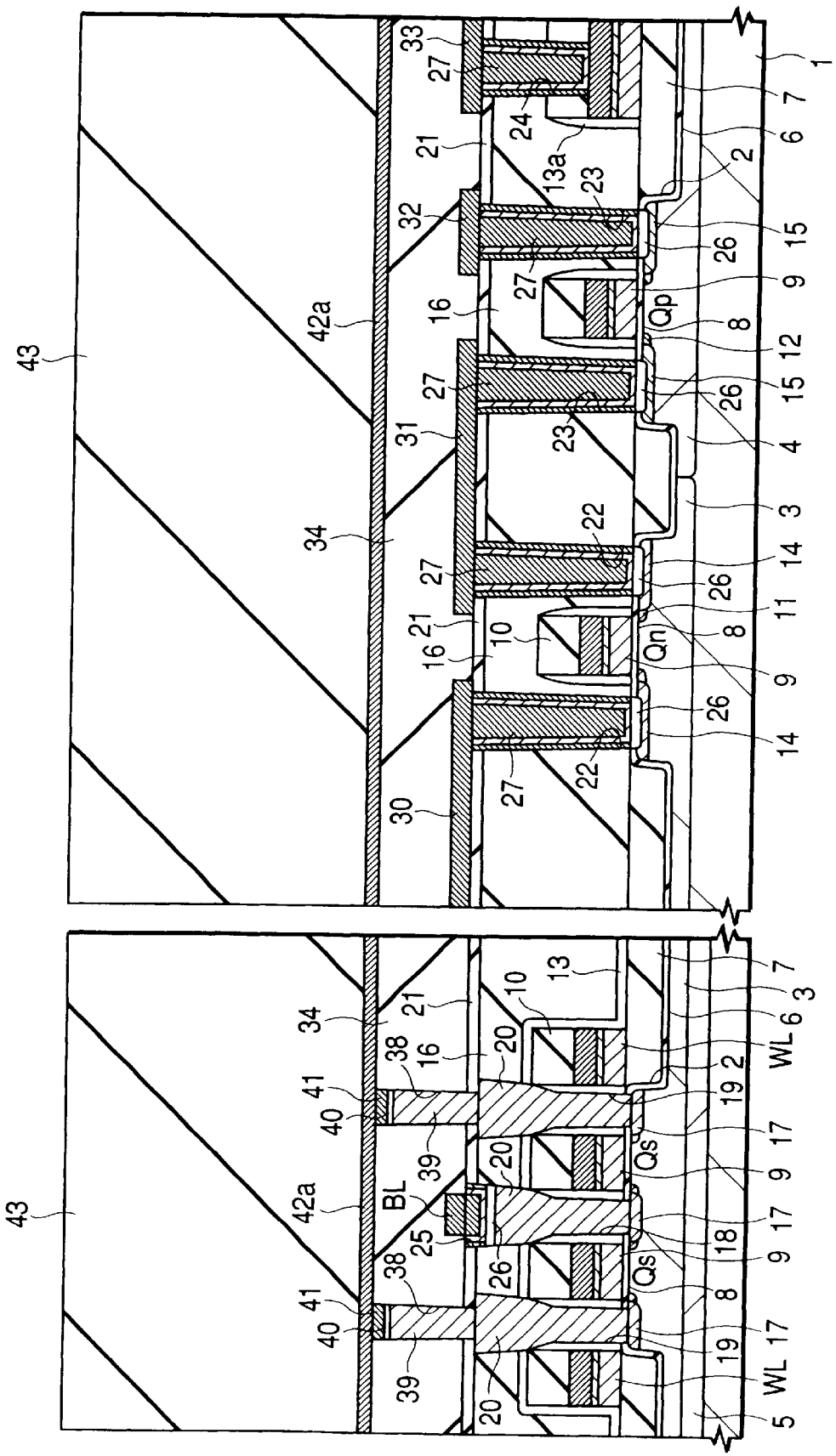
FIG. 42 is a fragmentary cross-sectional view of a substrate illustrating the process for manufacturing a DRAM according to Embodiment 3 of the present invention.

As illustrated in FIG. 42, after formation of a conductive underlying film 42a (first conductive underlying film) over the silicon oxide film 34, a thick silicon oxide film 43 is deposited over the conductive underlying film 42a to give a thickness of about 500 nm by CVD. The conductive underlying film 42a is, similar to the conductive underlying film 42 of Embodiment 1, made of a Pt film of about 50 to 60 nm thick deposited by sputtering.

Figure 43:
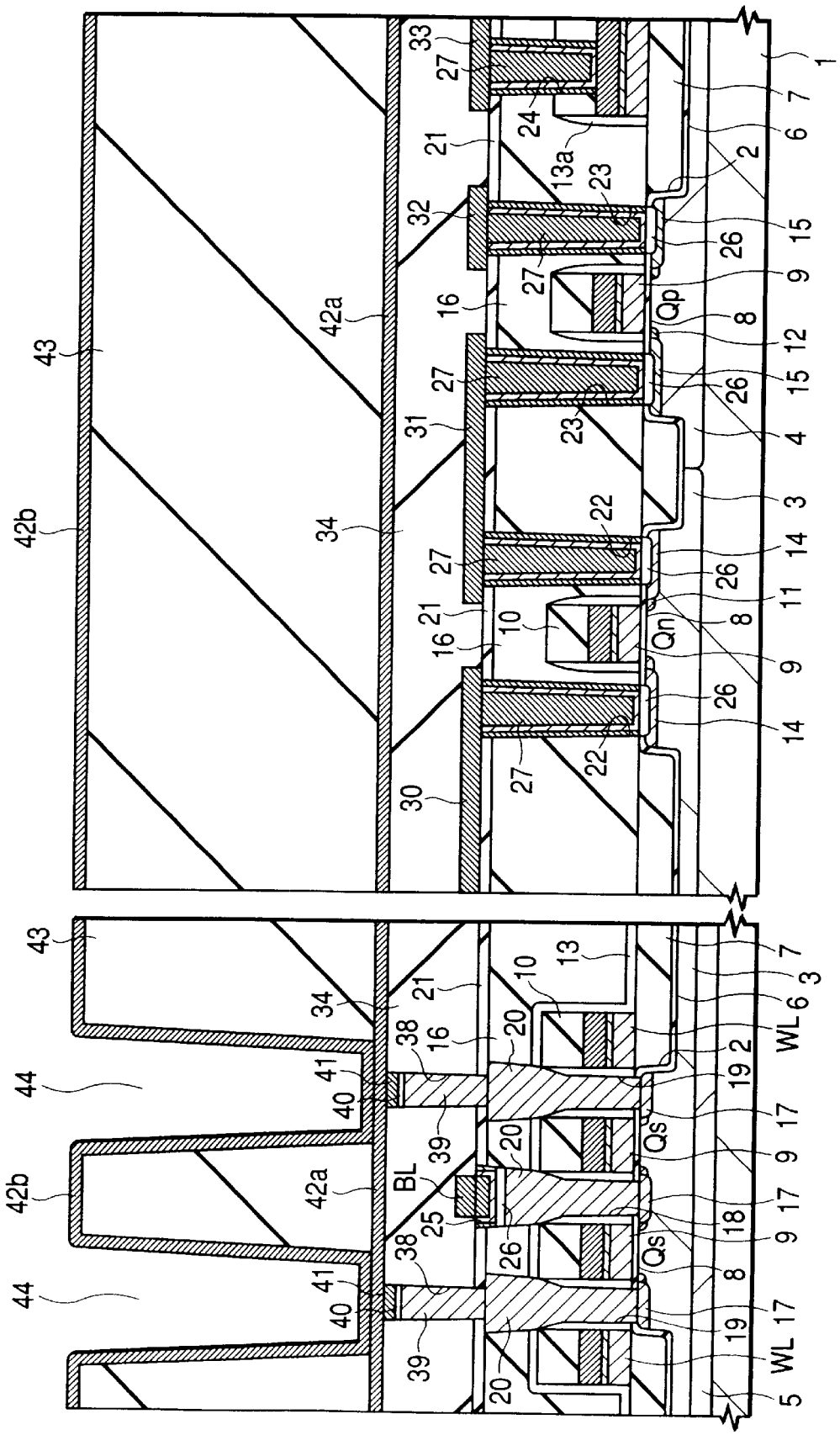
FIG. 43 is a fragmentary cross-sectional view of a substrate illustrating the process for manufacturing a DRAM according to Embodiment 3 of the present invention.

As illustrated in FIG. 43, a groove 44 is formed over the connecting hole 38 by dry etching of the silicon oxide film 43 in the memory cell array with a photoresist film (not illustrated) as a mask. Upon formation of the groove 44, the conductive underlying film 42a under the silicon oxide film 43 is utilized as a stopper for etching as in Embodiment 1.

Then, by forming the second conductive underlying film 42b over the silicon oxide film 43 including the inside of the groove 43, two layers of conductive underlying films 42a and 42b are stacked one after another at the bottom of the groove 44. The conductive underlying film 42b is, similar to the conductive underlying film 42a, made of a Pt film of about 50 to 60 nm thick deposited by sputtering.

Figure 44:
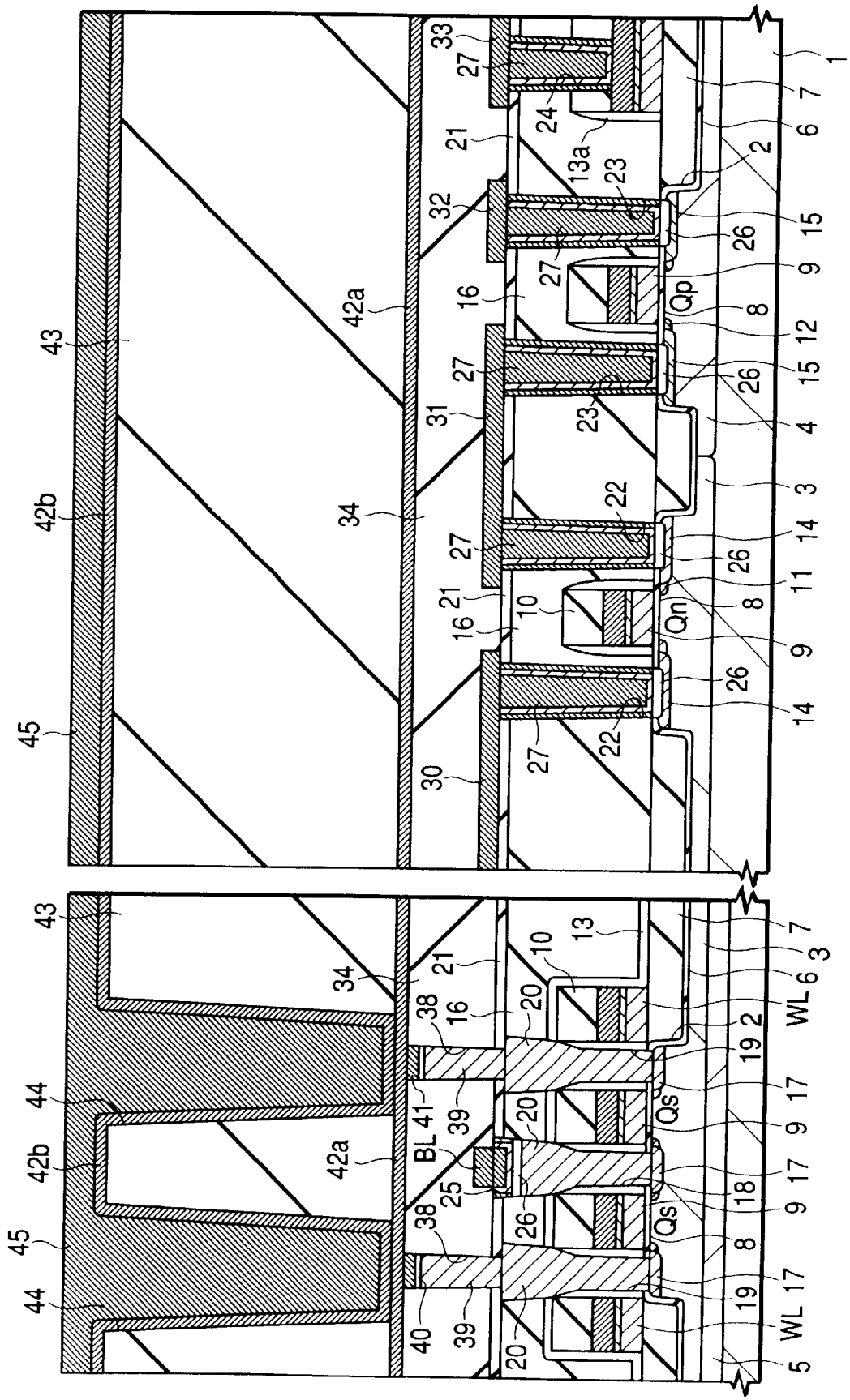
FIG. 44 is a fragmentary cross-sectional view of a substrate illustrating the process for manufacturing a DRAM according to Embodiment 3 of the present invention.

As illustrated in FIG. 44, a Pt film 45 is precipitated on the surface of the conductive underlying film 42b by electroplating using the above-described two stacked layers 42a, 42b as a cathode electrode. The Pt film 45 inside of the groove 44 is formed as in Embodiment 2 so that its surface height becomes higher than that of the silicon oxide film 43, that is, the depth of the groove 44.

In this Embodiment, similar to Embodiment 2, since the conductive underlying film 42b serving as a cathode electrode is formed at the bottom and side walls of the groove 44, the Pt film 45 can be formed inside of the groove 44 in a shorter time compared with Embodiment 1 wherein the conductive underlying film 42 is formed only at the bottom of the groove 44.

In addition, since two layers of the conductive underlying films 42a, 42b are stacked at the bottom of the groove 44, the electric field strength of the cathode electrode at the bottom of the groove 44 becomes higher than that of Embodiment 1 or 2, which makes it possible to suppress an increase in the resistance of the cathode electrode at the center portion of the substrate (wafer) 1 to a slight degree, thereby reducing the scattering of the growth rate of the Pt film 45 in the plane of the substrate (wafer) 1, whereby the Pt film 45 having a uniform thickness can be formed all over the substrate (wafer) 1.

Figure 45:
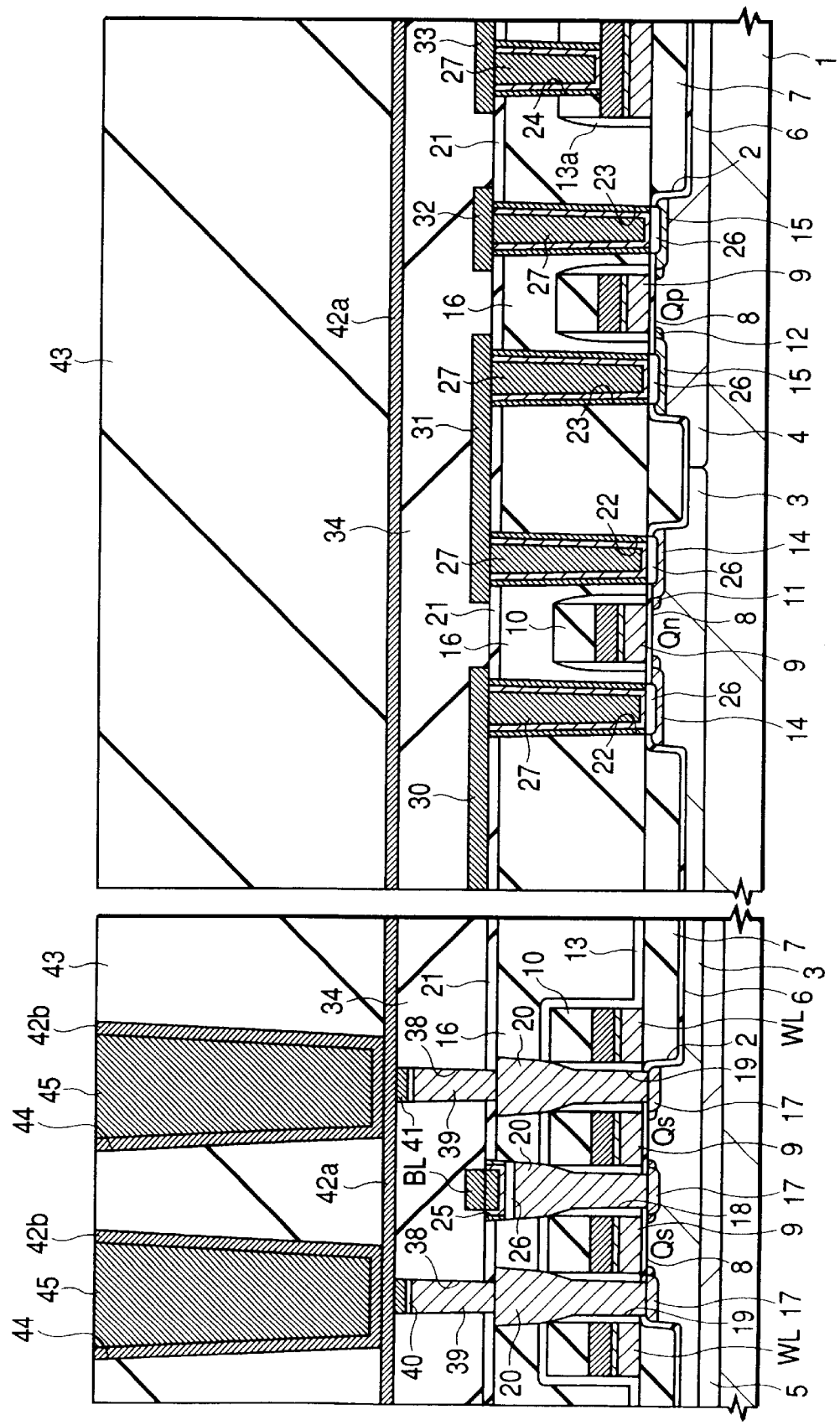
FIG. 45 is a fragmentary cross-sectional view of a substrate illustrating the process for manufacturing a DRAM according to Embodiment 3 of the present invention.

As illustrated in FIG. 45, the Pt film 45 and the conductive underlying film 42b over the silicon oxide film 43 are removed by polishing back through CMP (or etching back through dry etching) and they are left only inside of the groove 44.

Figure 46:
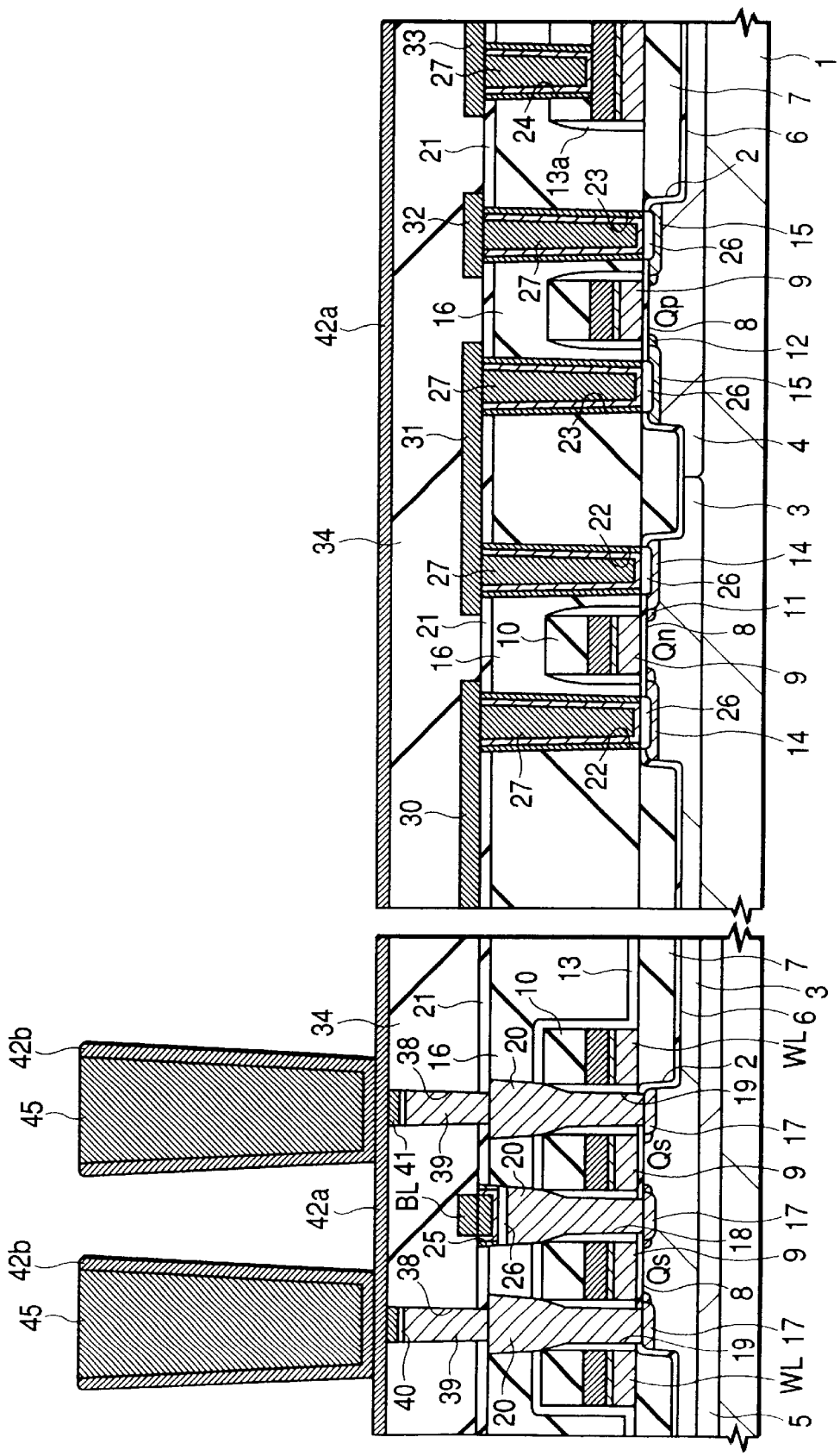
FIG. 46 is a fragmentary cross-sectional view of a substrate illustrating the process for manufacturing a DRAM according to Embodiment 3 of the present invention.

As illustrated in FIG. 46, after removal of the silicon oxide film 43 by wet etching using the conductive underlying film 42a as an etching stopper, the conductive underlying film 42a is anisotropically etched with the Pt film 45 and the conductive underlying film 42b on the side walls thereof as a mask, whereby a lower electrode 46 of the information storing capacitor formed of the Pt film 45 and the conductive underlying films 42a, 42b is formed.

As described above, when the Pt film constituting the conductive underlying film 42a is patterned by dry etching, a reaction product of a low vapor pressure is deposited on the side walls of the pattern. The conductive underlying film 42a after etching therefore has a side surface in the taper form. The conductive underlying film 42a is sufficiently thin (about 50 to 60 nm) compared with the Pt film 45 (about 500 nm) thereover, that even if it has a taper-shaped cross-section, extension of the pattern in the horizontal direction is slight. In this case, it is possible to decrease the thickness of the lower conductive underlying film 42a to be patterned by dry etching and, on the other hand, to thicken the upper conductive underlying film 42b. This makes it possible to decrease the amount of the reaction product deposited on the side walls of the pattern upon dry etching, thereby resulting in a further improvement in the processing accuracy of the lower electrode 46 while maintaining a large electric field strength of the cathode electrode.

Figure 47:
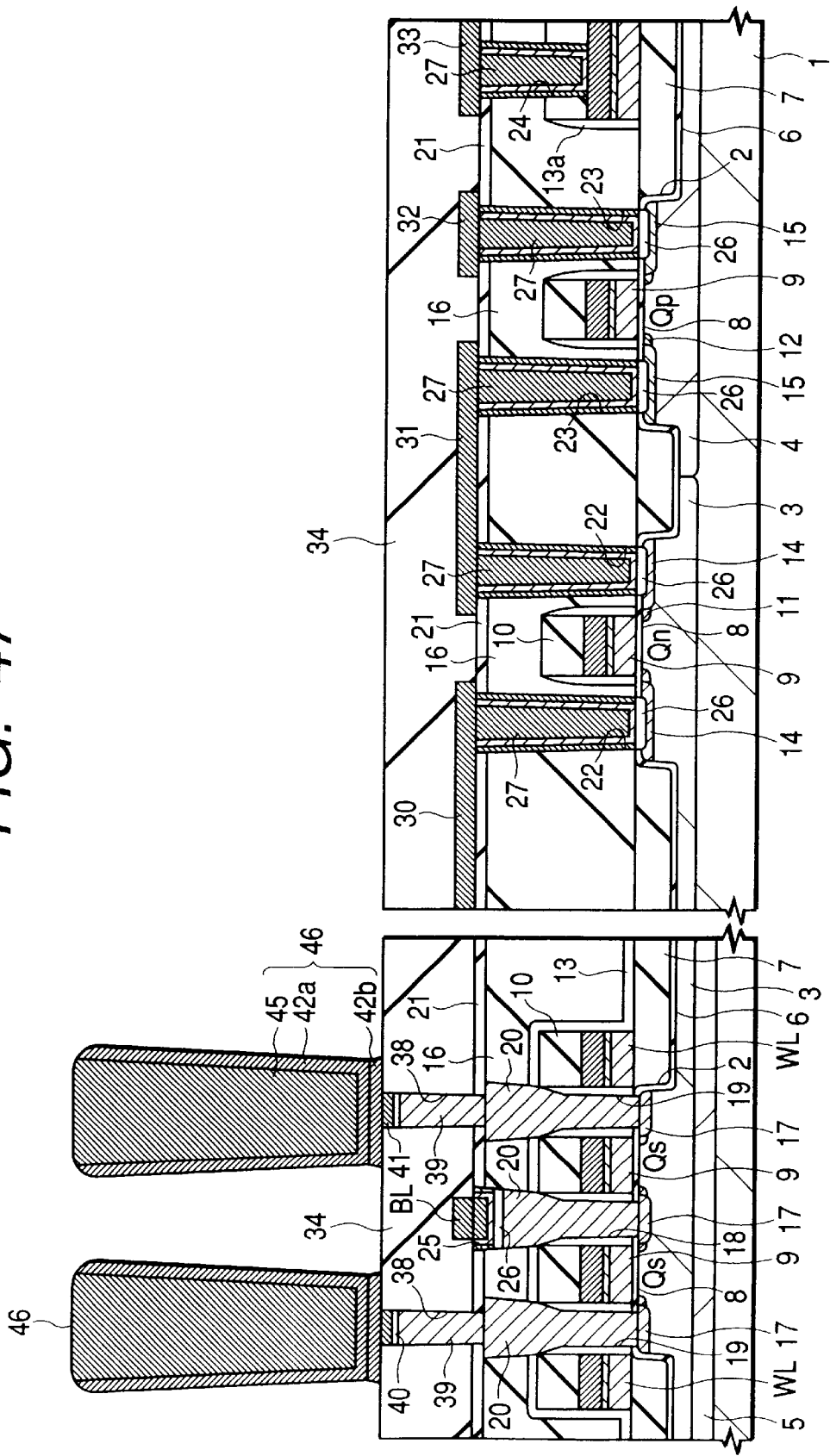
FIG. 47 is a fragmentary cross-sectional view of a substrate illustrating a process for manufacturing a DRAM according to Embodiment 3 of the present invention.

When the conductive underlying film 42a is dry etched with the Pt film 45 and the conductive underlying film 42b as a mask, the surfaces of the Pt film 45 and the conductive underlying film 42b are also etched to some extent because they are made of the same material as the conductive underlying film 42a. As a result, the shoulder portions (upper edge portions) of the lower electrode are roundly etched as illustrated in FIG. 47, which improves the step coverage of a capacitative insulating film 47 to be deposited over the lower electrode 46 in the subsequent step. In this case, an etched amount of the shoulder portion of the lower electrode 46 can be decreased by forming the lower conductive underlying film 42a, which is to be patterned by dry etching, to be thin and the upper conductive underlying film 42b to be thick so that a decrease in the surface area of the lower electrode 46 can be suppressed while the electric field strength of the cathode electrode is maintained high.

Although not illustrated in the drawing, the capacitative insulating film is formed on each of the upper surface and side surfaces of the lower electrode 46 in a similar manner to Embodiment 1 or 2, followed by deposition of a Pt film, as an upper electrode material over the capacitative insulating film. Then, the Pt film and the capacitative insulating film are patterned by dry etching with the photoresist film as a mask, whereby an information storing capacitor is formed. Over the information storing capacitor, about two Al interconnection layers are then formed.

(Embodiment 4)

The manufacturing process of a DRAM according to Embodiment 4 of the present invention will next be described in the order of steps with reference to FIGS. 48 to 57.

Figure 48:
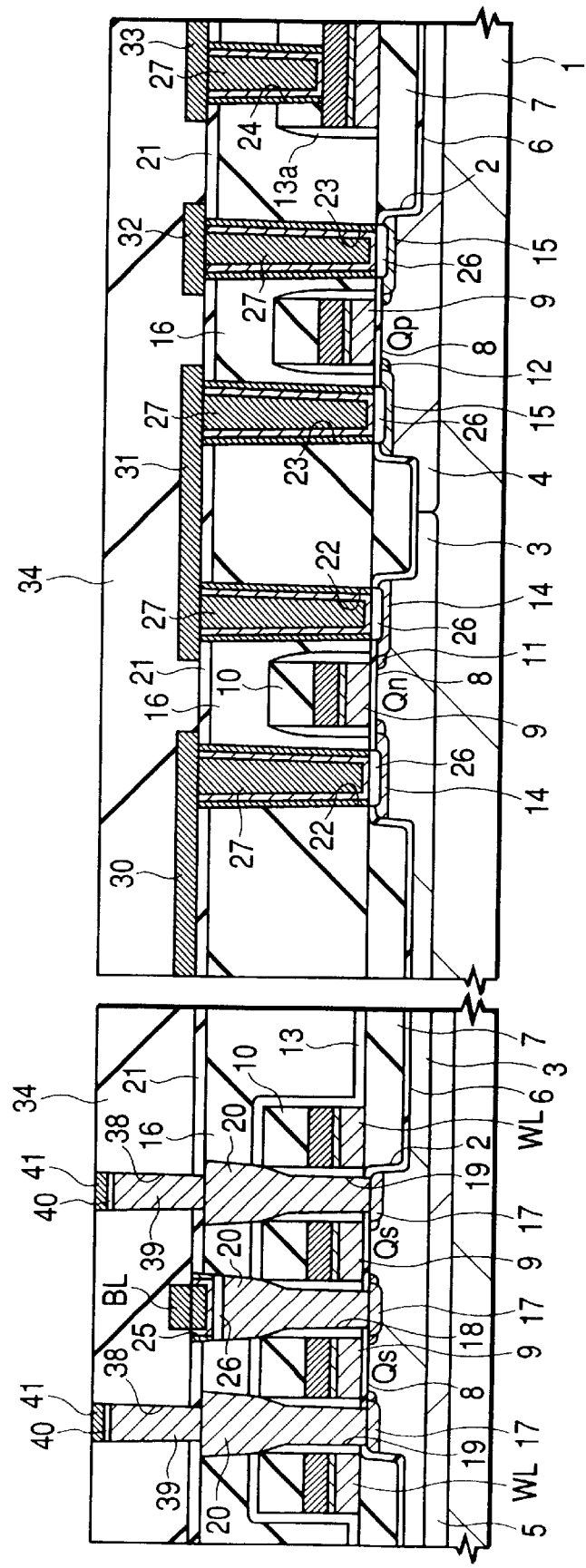
FIG. 48 is a fragmentary cross-sectional view of a substrate illustrating a process for manufacturing a DRAM according to Embodiment 4 of the present invention.

As illustrated in FIG. 48, after formation of a memory cell selecting MISFETQs in the memory cell array and n-channel type MISFETQn and p-channel type MISFETQp in the peripheral circuit region, a bit line BL is formed in the memory cell array, while first interconnection layers 30 to 33 are formed in the peripheral circuit region.

Then, a silicon oxide film 34 and a silicon nitride film 29 are deposited successively over the bit line BL and the first interconnection layers 30 to 33 by CVD, followed by the formation of a connecting hole 38 in the silicon nitride film 29 and the silicon oxide film 34. Inside of the connecting hole 38, a plug 39, a silicide film 40 and a barrier metal film 41 are successively formed. The steps so far described are similar to those of Embodiment 1 to 3 except that the silicon nitride film 29 is stacked over the silicon oxide film 34.

Figure 49:
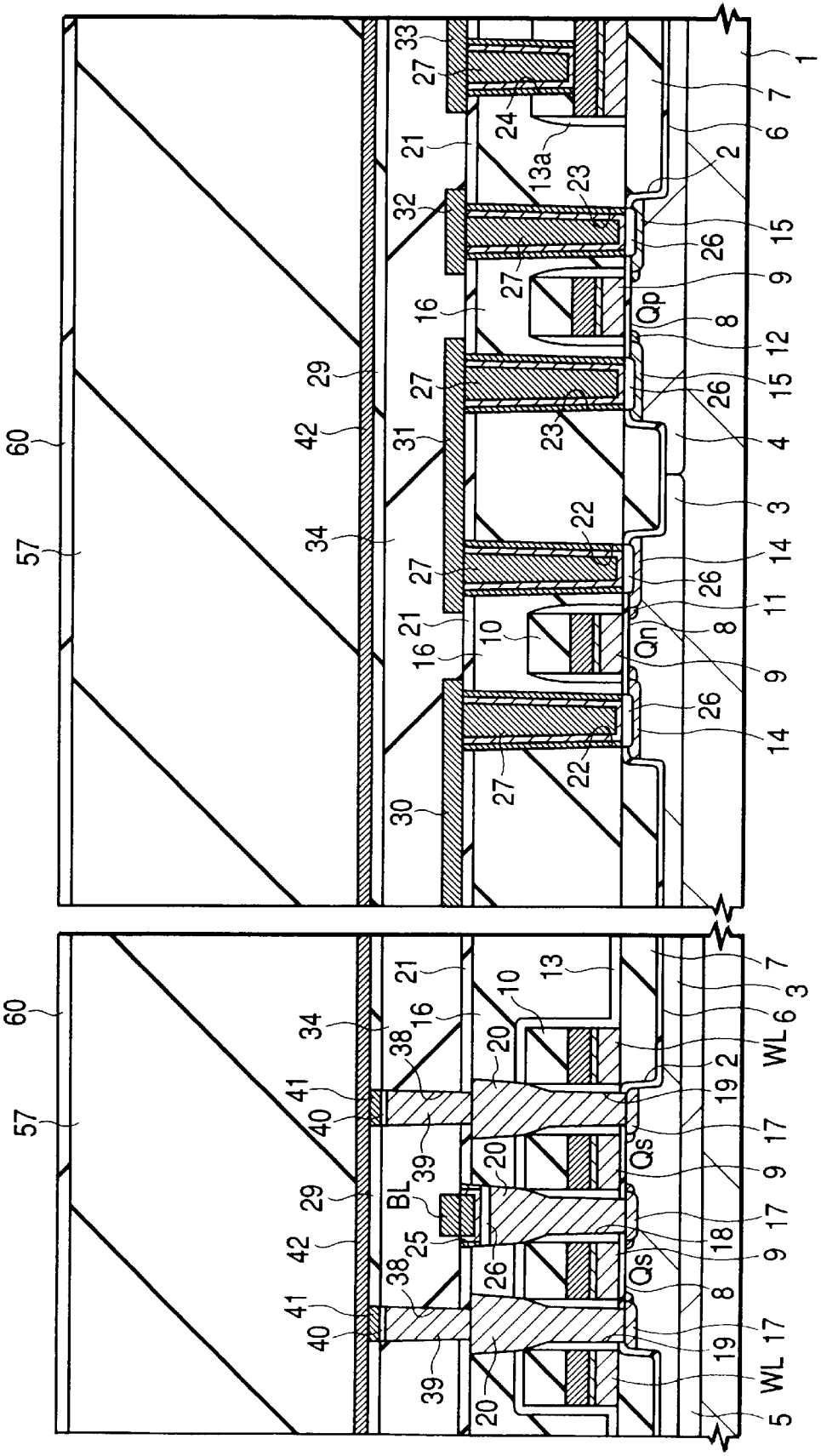
FIG. 49 is a fragmentary cross-sectional view of a substrate illustrating the process for manufacturing a DRAM according to Embodiment 4 of the present invention.

As illustrated in FIG. 49, after deposition of the conductive underlying film 42 over the silicon nitride film 29, a BPSG (Boron-doped Phospho Silicate Glass) film 57 and a silicon nitride film 60 are deposited successively over the conductive underlying film 42. As in Embodiment 1, the conductive underlying film 42 is used as a cathode electrode upon formation of a lower electrode material by electroplating and it is made of a Pt film deposited, for example, by sputtering. The BPSG film 57 and the silicon nitride film 60 are deposited over the conductive underlying film 42 so that the total thickness of them are at least equal to the height of a lower electrode (46).

Figure 50:
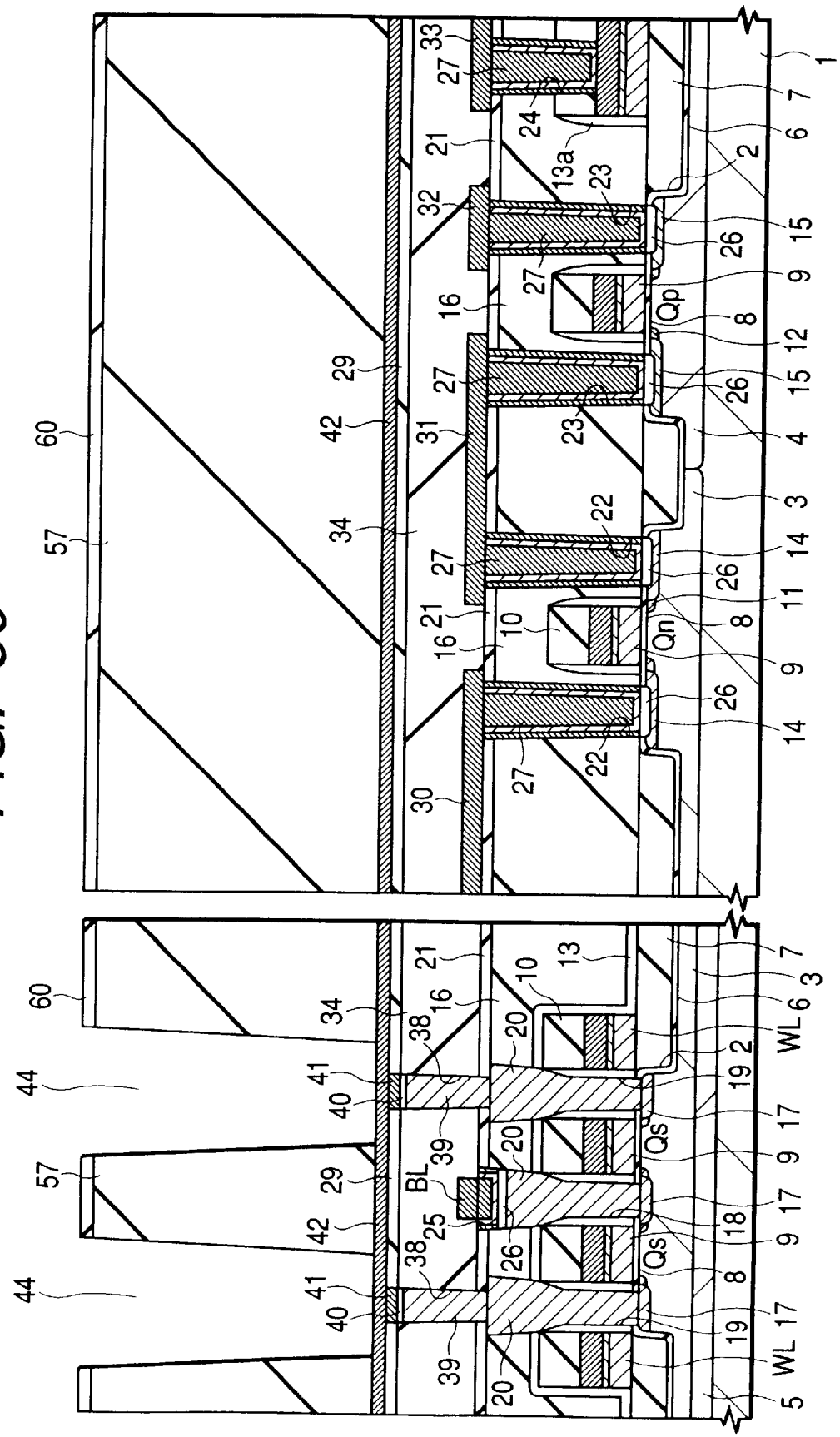
FIG. 50 is a fragmentary cross-sectional view of a substrate illustrating a process for manufacturing a DRAM according to Embodiment 4 of the present invention.

As Illustrated in FIG. 50, a groove 44 is then formed over the connecting hole 38 by dry etching of the silicon nitride film 60 and BPSG film 57 thereunder in the memory cell array.

The etching of the silicon nitride film 60 is carried out with a photoresist film (not illustrated) as a mask and with the BPSG film 57 under the silicon nitride film 60 as an etching stopper. The etching of the BPSG film 57 is carried out, after removal of the above-described photoresist film, with the silicon nitride film 60 which has remained over the BPSG film 57 as a mask and the conductive underlying film 42 there under as an etching stopper.

When the silicon nitride film 60 and BPSG film 57 thereunder are successively etched with a photoresist film as a mask, a reaction product of a low vapor pressure is generated from the surface of the conductive underlying film 42, which serves as a stopper upon etching of the BPSG film 57, and is deposited on the side walls of the photoresist film. Upon removal of the photoresist film, the reaction product, which has deposited on the side walls, inevitably remains on the BPSG film 57 as foreign matter. It is therefore necessary to use a film which does not generate a reaction product in an amount sufficient to remain as foreign matter on the side walls and in this Embodiment the silicon nitride film 60 is employed.

Figure 51:
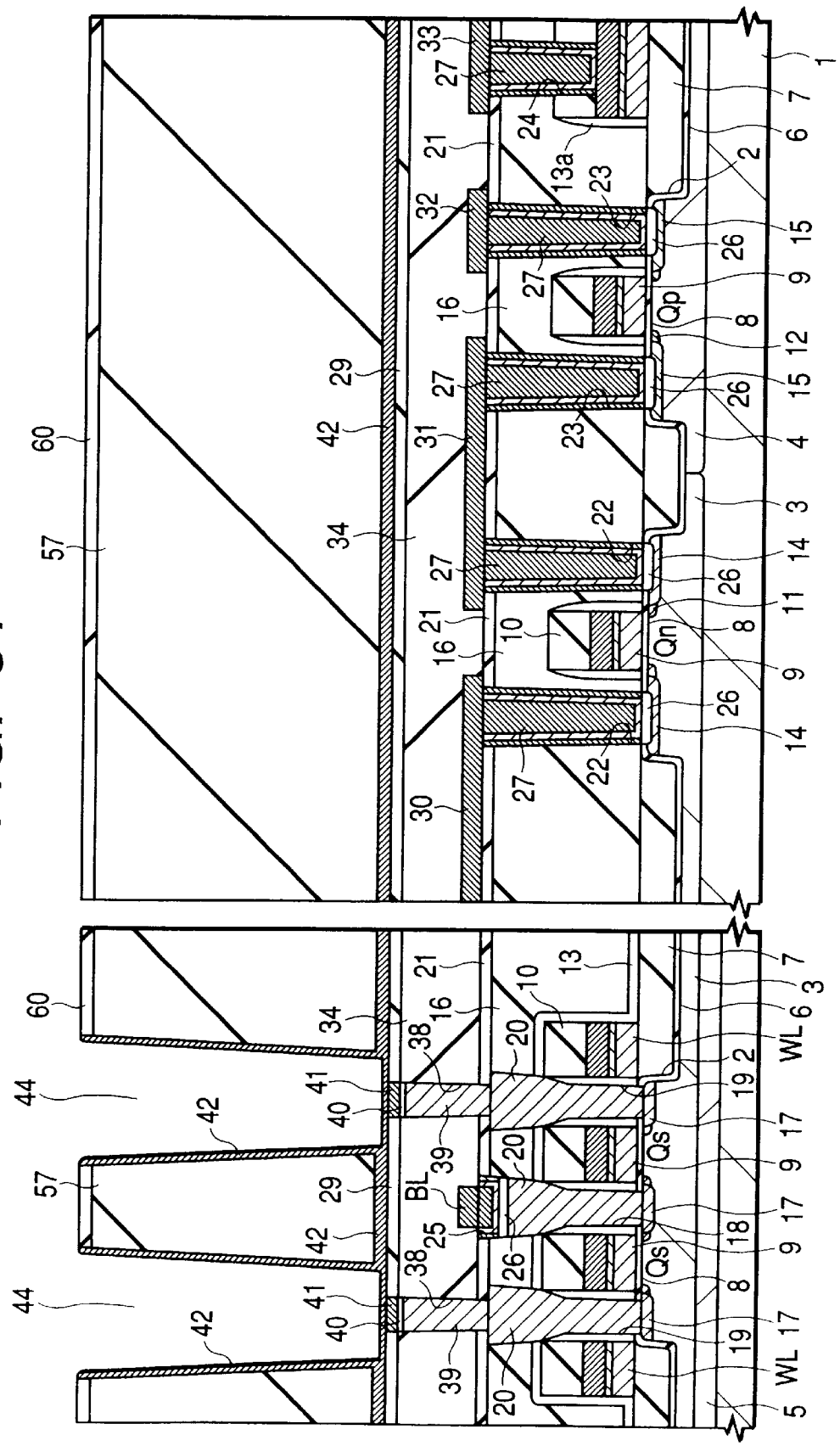
FIG. 51 is a fragmentary cross-sectional view of a substrate illustrating a process for manufacturing a DRAM according to Embodiment 4 of the present invention.

As illustrated in FIG. 51, the surface of the conductive underlying film 42 exposed at the bottom of the groove 44 is subjected to sputter etching with Ar ions or the like, whereby a portion of the conductive underlying film 42 is re-precipitated on the side walls of the groove 44. The conductive underlying film 42 re-precipitated on the side walls of the groove 44 is, together with the conductive underlying film 42 which has remained at the bottom of the groove 44, used as a cathode electrode upon formation of a lower electrode material by electroplating.

Figure 52:
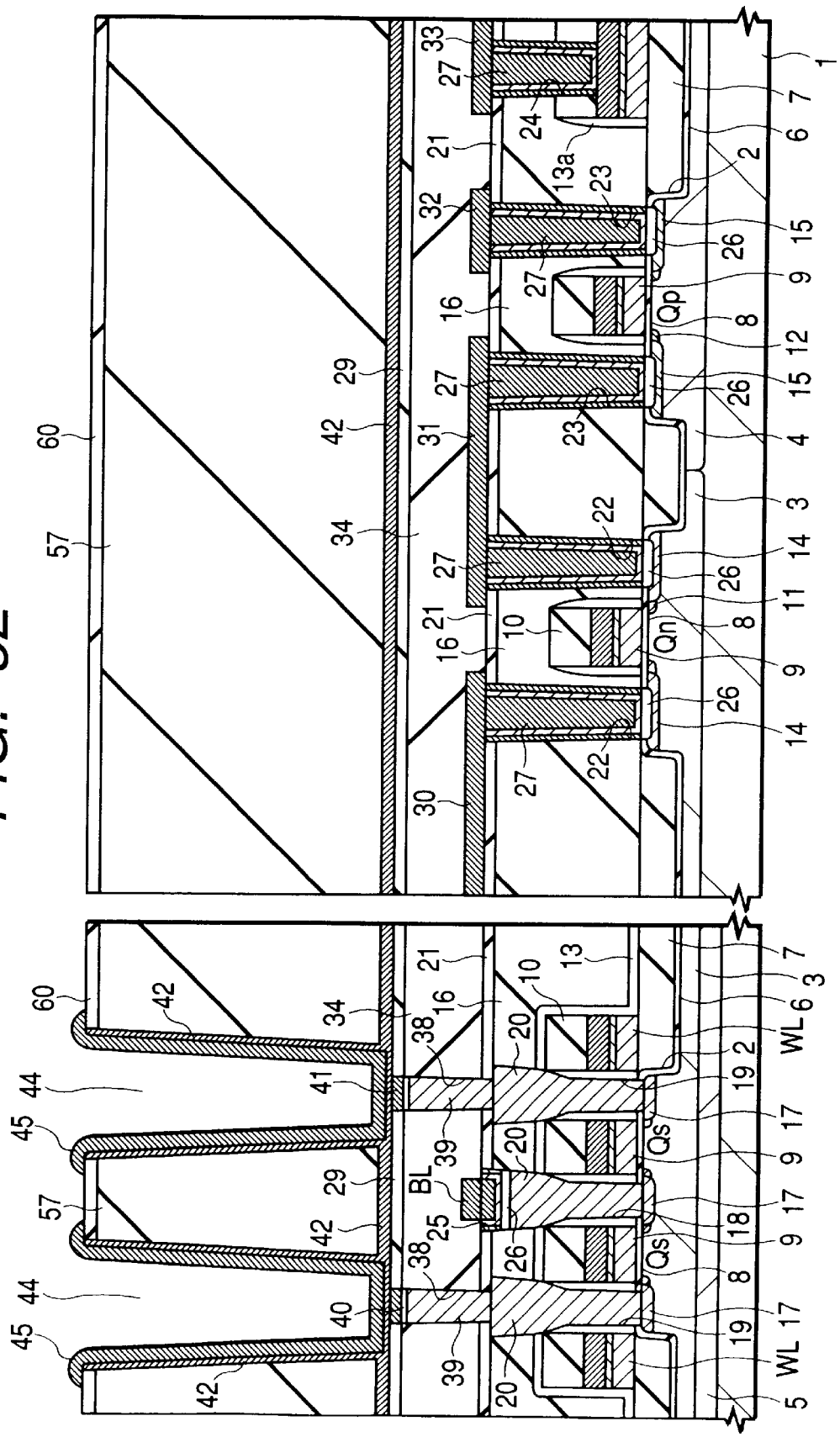
FIG. 52 is a fragmentary cross-sectional view of a substrate illustrating the process for manufacturing a DRAM according to Embodiment 4 of the present invention.

As illustrated in FIG. 52, a Pt film 45 is precipitated on the surface of the conductive underlying film 42 by electroplating using, as a cathode electrode, the conductive underlying film 42 on the bottom and side walls of the groove 44. In this case, it is possible to completely embed the Pt film 45 inside of the groove 44, but in this Embodiment, plating is terminated before the Pt film 45 is completely embedded inside of the groove 44, and the Pt film 45 is precipitated along the inner wall of the groove 44.

Figure 53:
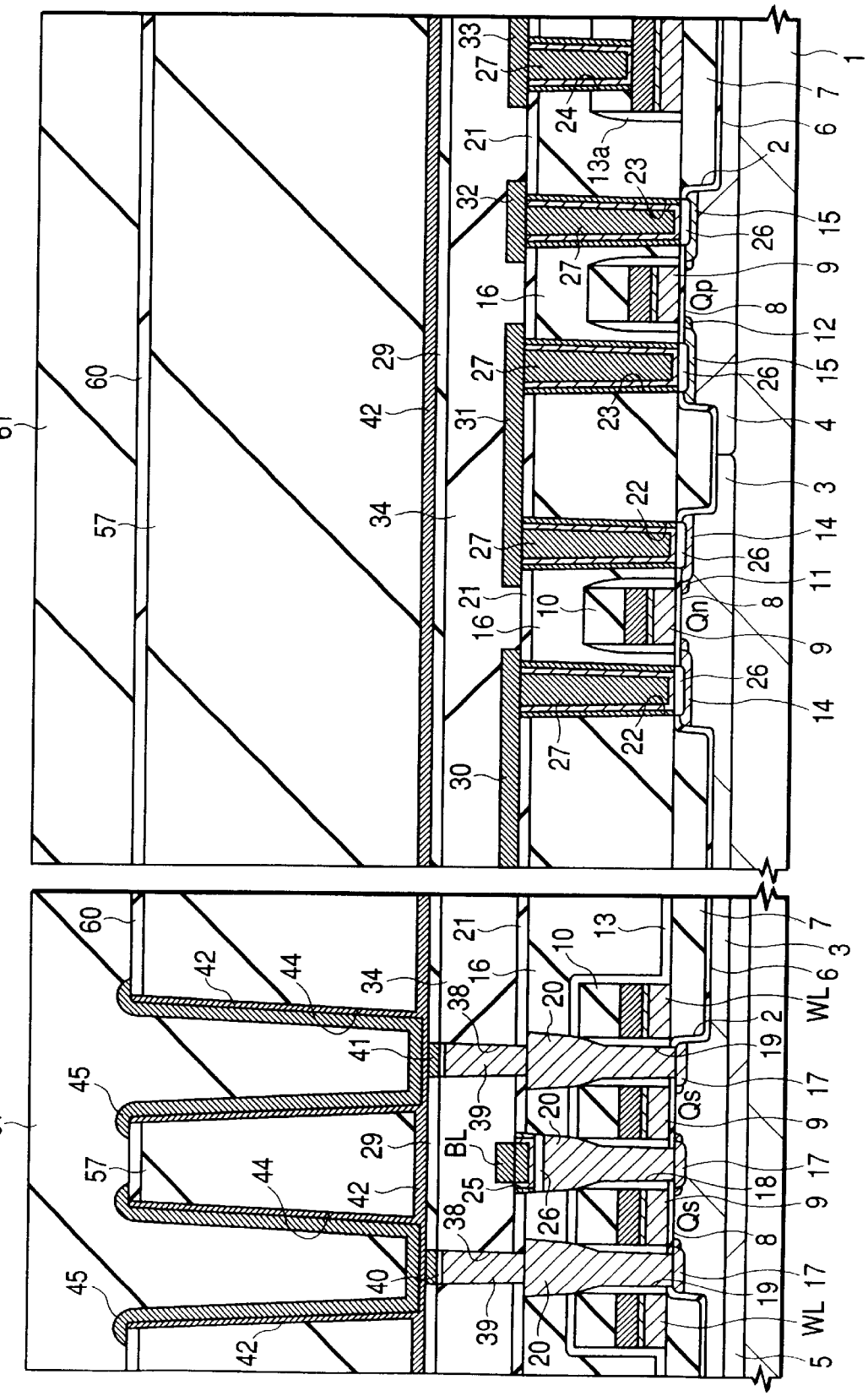
FIG. 53 is a fragmentary cross-sectional view of a substrate illustrating the process for manufacturing a DRAM according to Embodiment 4 of the present invention.

As illustrated in FIG. 53, a silicon oxide film 61 thicker than the depth of the groove 44 is deposited over the silicon nitride film 60 including the inside of the groove 44. The BPSG film 57 is adopted in this Embodiment, because it differs in etching rate from each of the silicon oxide film 61, silicon nitride film 60, Pt film 45 and conductive underlying film 42. As an insulating film having such properties, PSG (Phospho Silicate Glass) film or BSG (Boro Silicate Glass) film may be used instead of the BPSG film.

Figure 54:
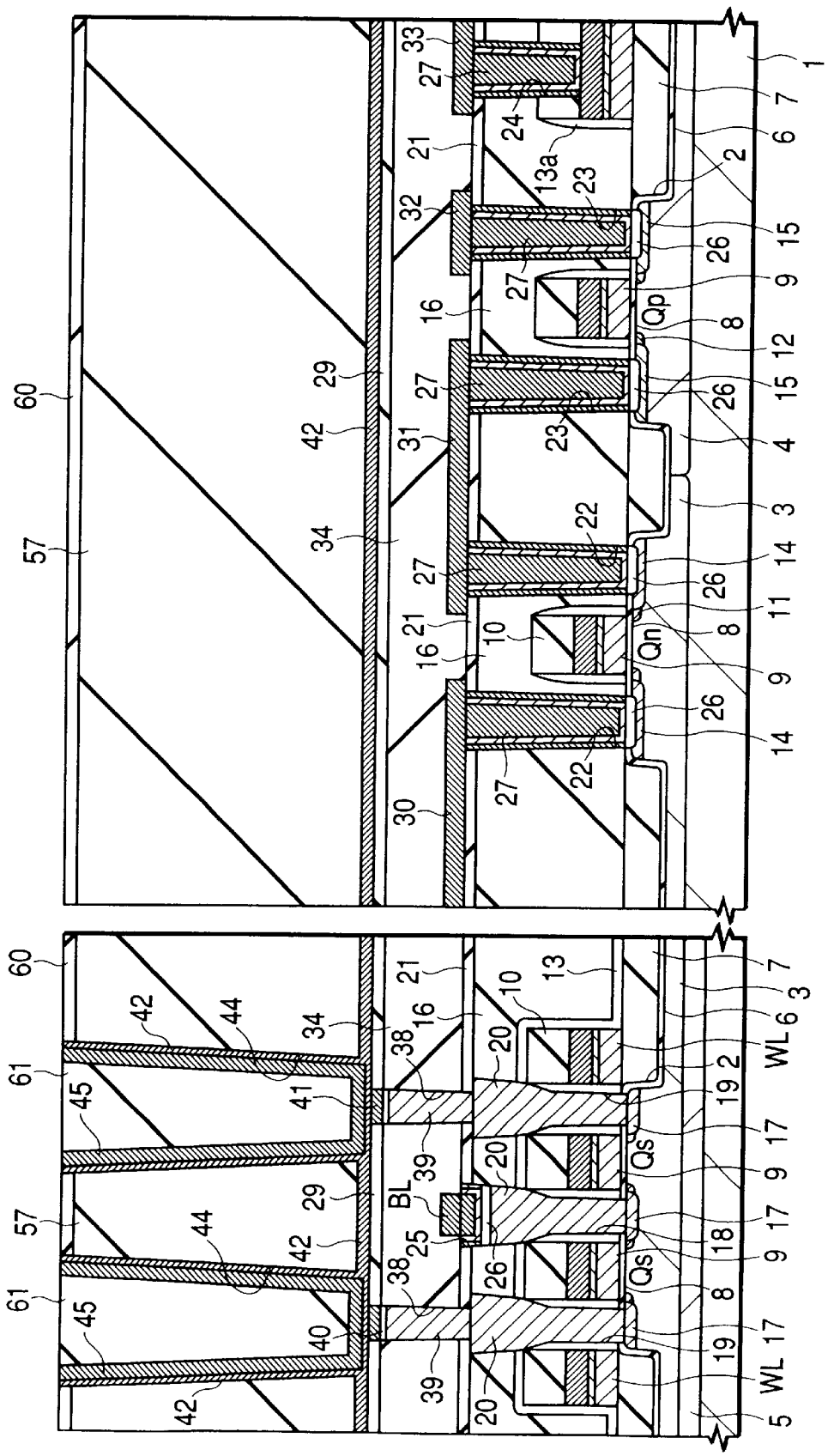
FIG. 54 is a fragmentary cross-sectional view of a substrate illustrating the process for manufacturing a DRAM according to Embodiment 4 of the present invention.

As illustrated in FIG. 54, the surface height of each of the silicon oxide film 61 and the Pt film 45 is then made equal to that of the silicon nitride film 60 by removing the silicon oxide film 61 and the Pt film 45 over the silicon nitride film 60 by polishing back through CMP (or etching back by dry etching) to leave them only inside of the groove 44.

Figure 55:
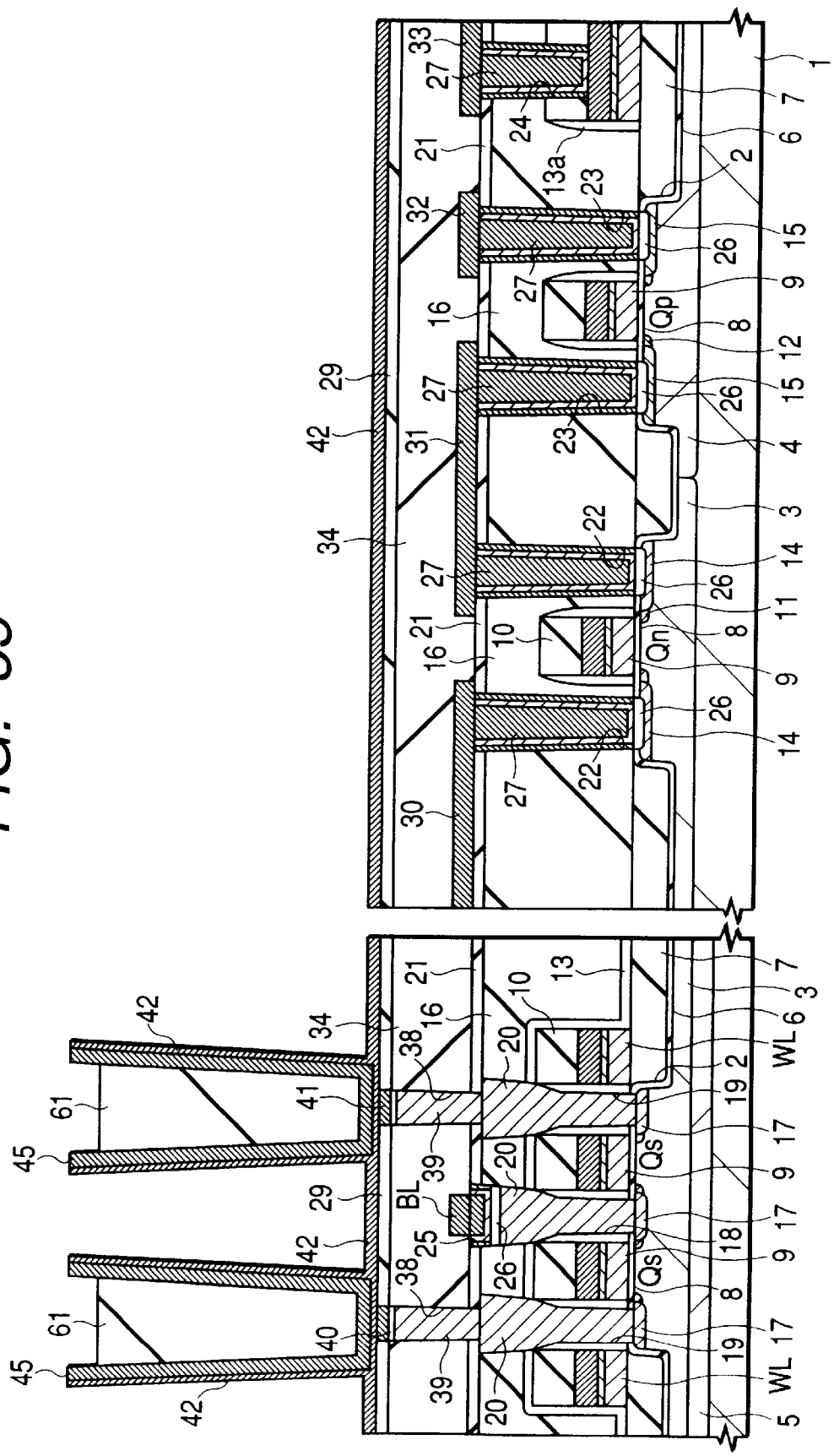
FIG. 55 is a fragmentary cross-sectional view of a substrate illustrating the process for manufacturing a DRAM according to Embodiment 4 of the present invention.

As illustrated in FIG. 55, the silicon nitride film 60 is selectively removed by wet etching (ex. HF vapor etching)

by utilizing the difference in the etching rate among the silicon oxide film 61, BPSG film 57 and silicon nitride film 60, followed by selective removal of the BPSG film 57 thereunder by wet etching, whereby the silicon oxide film 61 is left inside of the groove 44.

Figure 56:
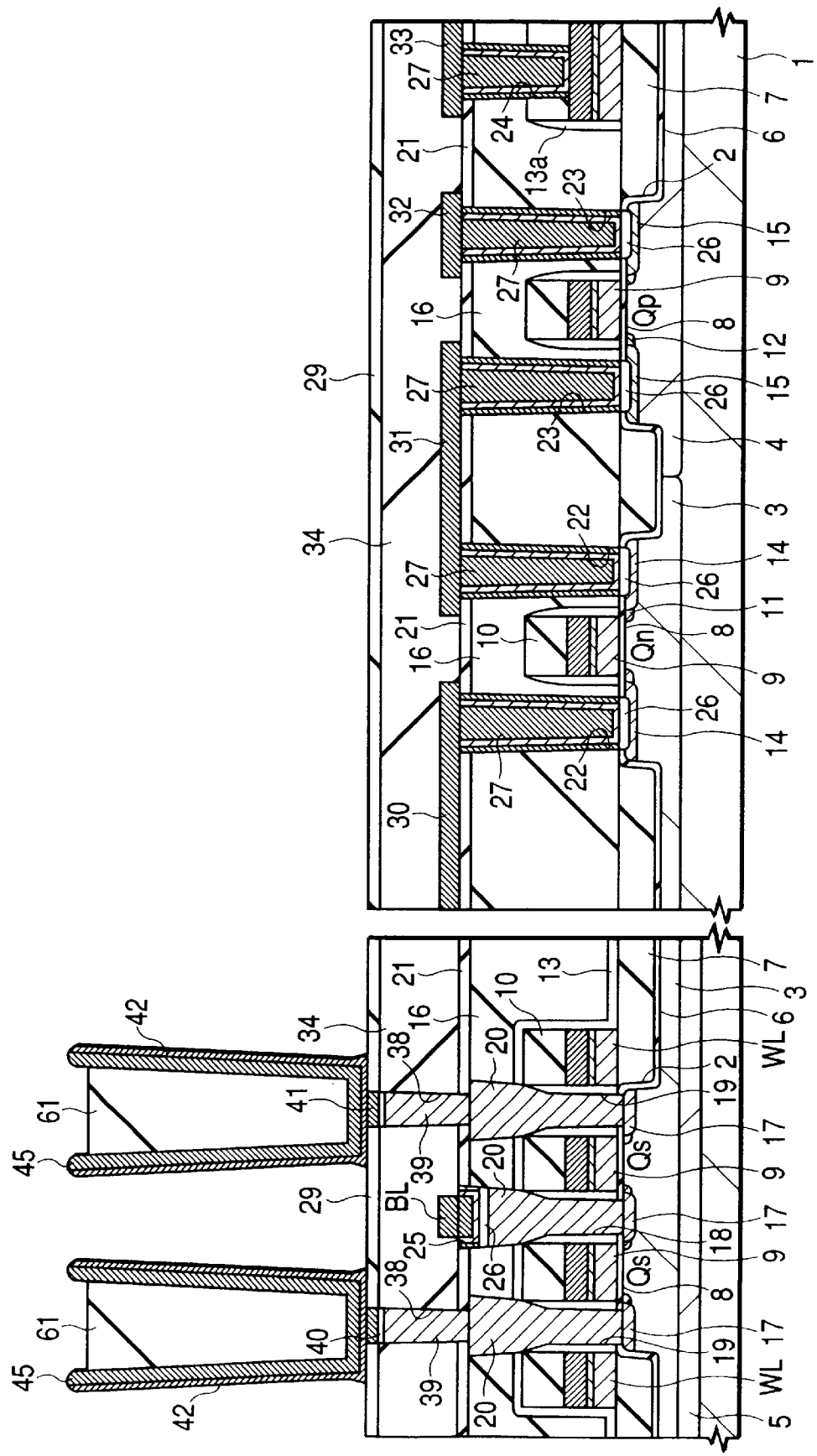
FIG. 56 is a fragmentary cross-sectional view of a substrate illustrating the process for manufacturing a DRAM according to Embodiment 4 of the present invention.
Figure 57:
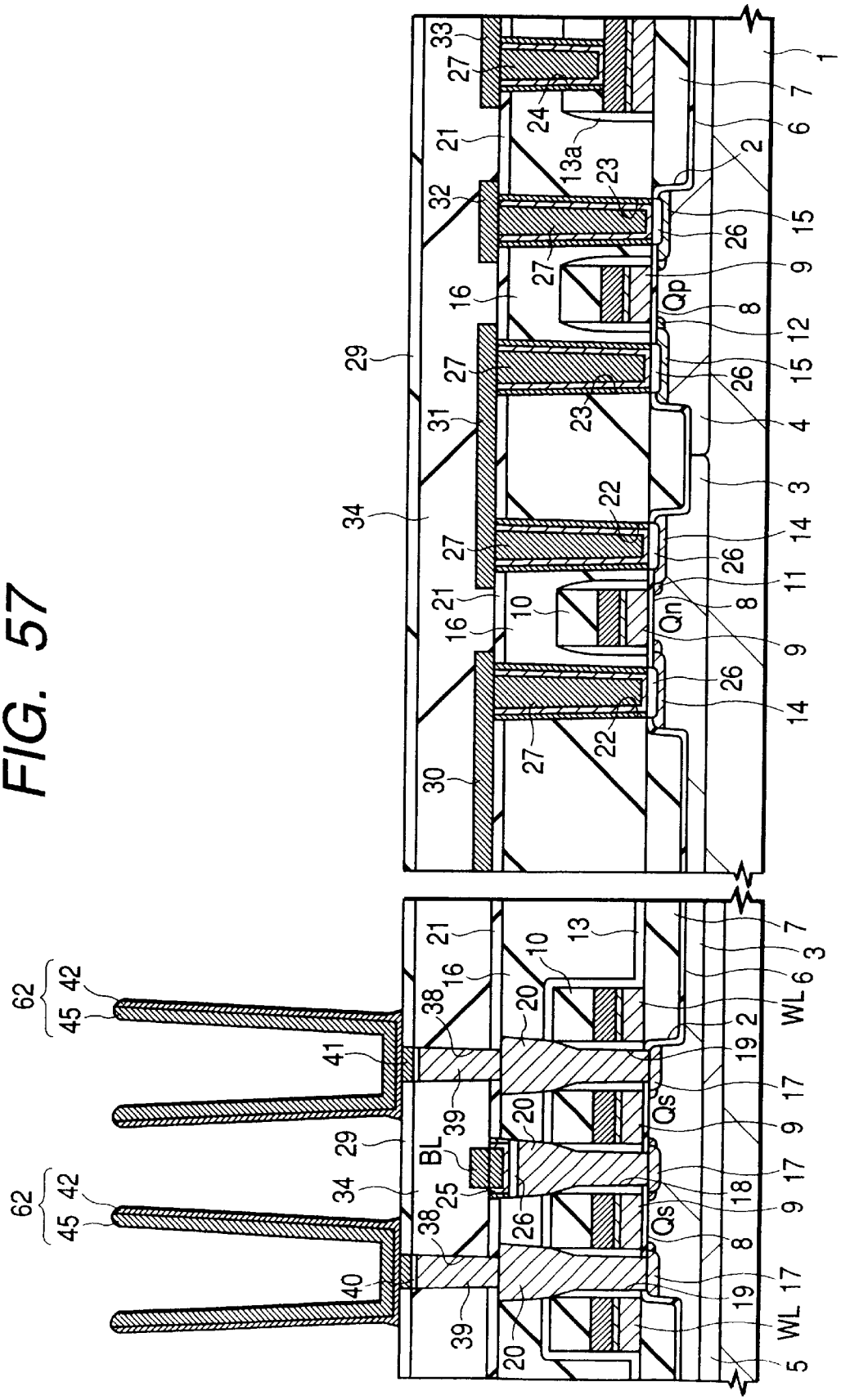
FIG. 57 is a fragmentary cross-sectional view of a substrate illustrating the process for manufacturing DRAM according to Embodiment 4 of the present invention.

As illustrated in FIG. 56, after anisotropic dry etching of the conductive underlying film 42 with the conductive underlying film 42 re-precipitated on the side walls of the groove 44 and the Pt film 45 as masks, the silicon oxide film 61 which has remained at an inner side of the Pt film 45 is selectively removed, as illustrated in FIG. 57, by wet etching while utilizing the difference in the etching rate between the silicon oxide film 61 and the silicon nitride film 29, whereby a cylindrical (crown type) lower electrode 62 comprising the conductive underlying film 42 and Pt film 45 is formed.

Although not illustrated in the drawing, a capacitative insulating film is then formed on the surface of the lower electrode 46, followed by deposition of a Pt film, as an upper electrode material, over the capacitative insulating film. Then, the Pt film and capacitative insulating film are patterned by dry etching with a photoresist film as a mask, whereby an information storing capacitor is formed over the information storing capacitor, about two Al interconnection layers are then formed.

(Embodiment 5)

The manufacturing process of a DRAM according to Embodiment 5 of the present invention will hereinafter be described in the order of steps with reference to FIGS. 58 to 62.

In Embodiment 1, after formation of the Pt film 45 over the conductive underlying film 42 by electroplating, an unnecessary portion of the conductive underlying film 42 is dry etched with the Pt film 45 as a mask. From the Pt film 45 and the conductive underlying film 42 which has remained thereunder, the lower electrode 46 is formed (refer to FIG. 24).

Upon dry etching of the conductive underlying film 42, anisotropic etching making use of, for example, $CF_4+Ar$ plasma is employed, whereby the Pt film 45 is etched simultaneously and its height decreases, leading to a decrease in the surface area of the lower electrode 46. In Embodiment 3 or 4, the lower electrode 46 is formed similarly so that the surface area of it decreases.

In this Embodiment, therefore, a decrease in the surface area of the lower electrode 46 is prevented in the following manner. A description will hereinafter be made of the case where the lower electrode 46 is formed in accordance with the steps of Embodiment 1, but it can also be applied to the case where the lower electrode 46 is formed in accordance with the steps of Embodiment 3 or 4.

Figure 58:
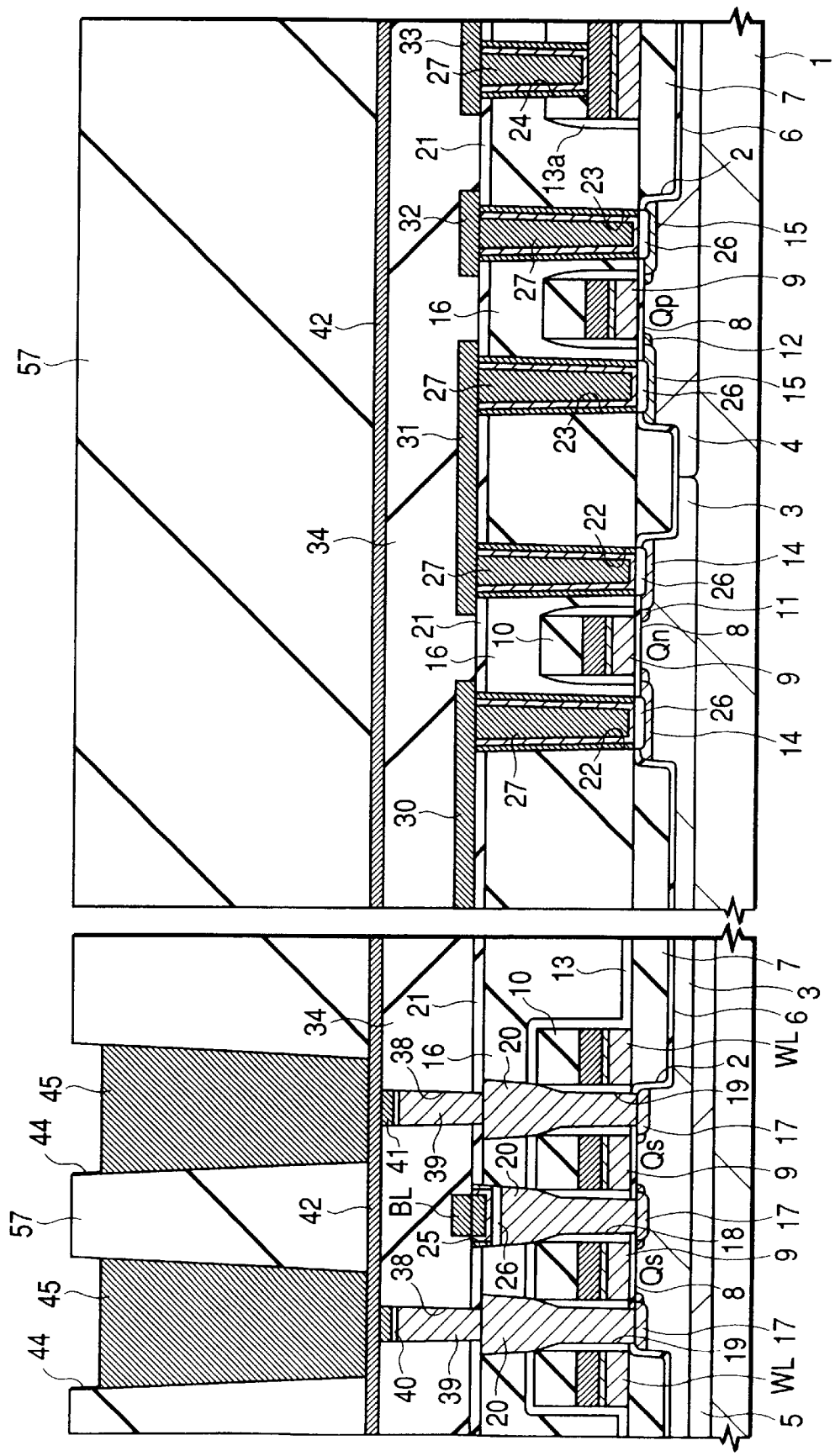
FIG. 58 is a fragmentary cross-sectional view of a substrate illustrating a process for manufacturing a DRAM according to Embodiment 5 of the present invention.

As illustrated in FIG. 58, a Pt film 45 is deposited, by electroplating, on the surface of the conductive underlying film 42 exposed at the bottom of the groove 44 in accordance with the steps as shown in FIGS. 1 to 18 of Embodiment 1. At this time, by terminating the plating before completion, the surface height of the Pt film 45 is made lower than that of the BPSG film 57. As an alternative process which however requires an additional step, it is possible to lower the surface height of the Pt film 45 more than that of the BPSG film 57 by making the surface height of the Pt film 45 greater than that of the BPSG film 57 similar to Embodiment 1 and then carrying out over-etching of the Pt film 45 upon etching back of the excessive Pt film 45 exposed at the opening portion of the groove 44.

Figure 59:
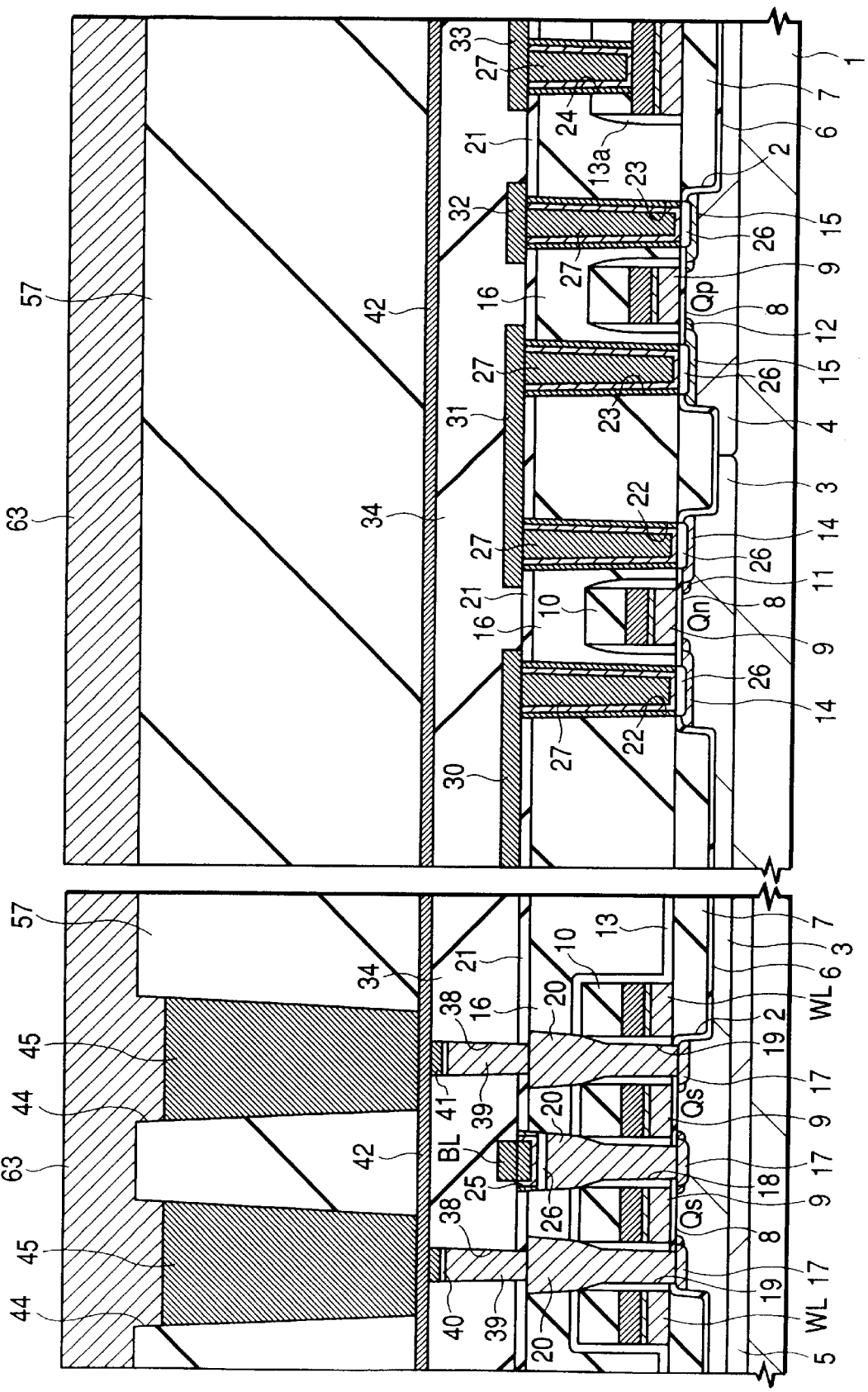
FIG. 59 is a fragmentary cross-sectional view of a substrate illustrating the process for manufacturing a DRAM according to Embodiment 5 of the present invention.

As illustrated in FIG. 59, an etching barrier film 63 is deposited over the BPSG film 57 including the inside of the groove 44. This etching barrier film 63 is formed of a conductive film having a different etching rate than any one of the BPSG film 57, Pt film 45 and conductive underlying film 42. As the conductive film equipped with such properties, a TiN film deposited by CVD or sputtering can be exemplified.

Figure 60:
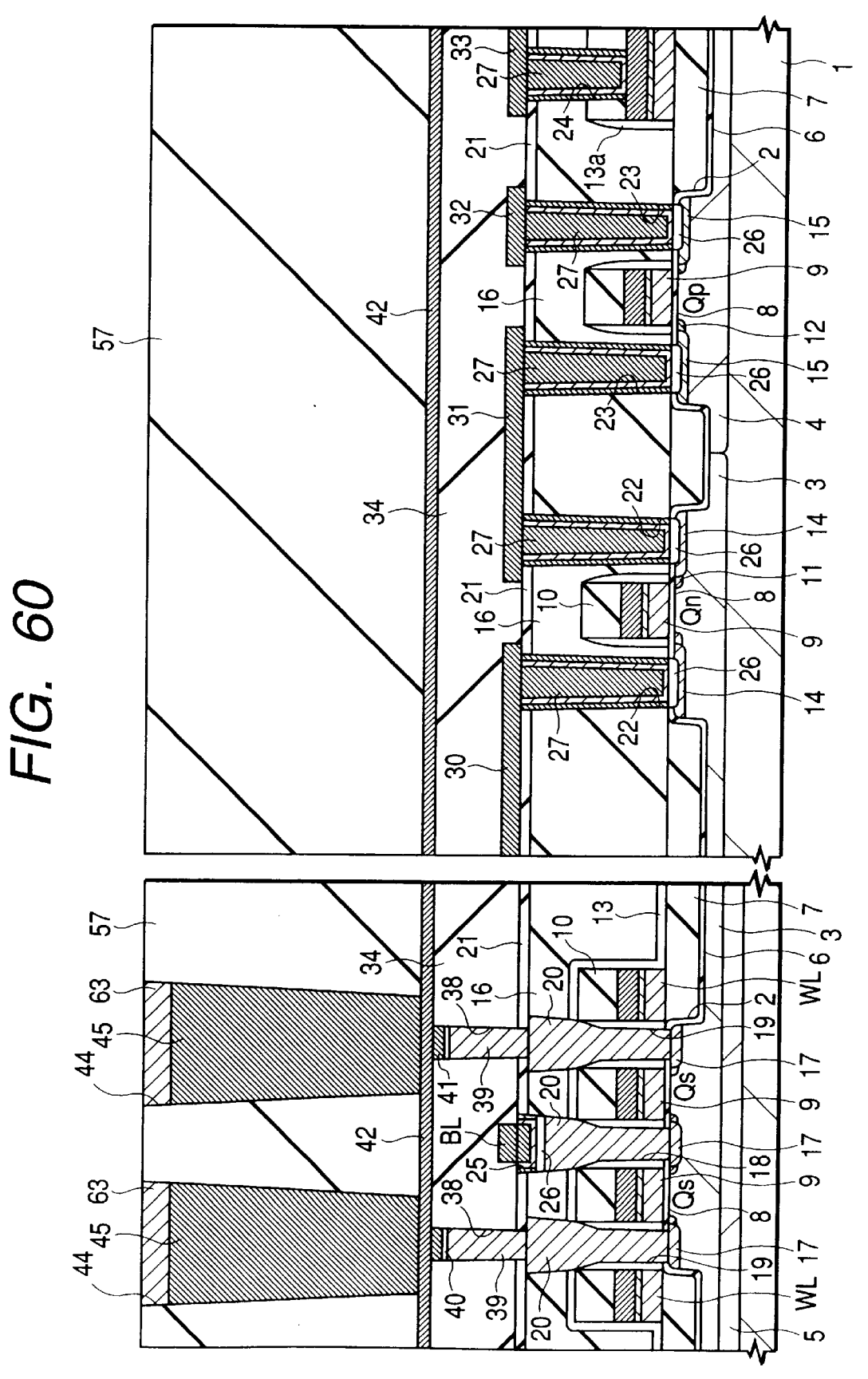

As illustrated in FIG. 60, the barrier metal film 63 over the BPSG film 57 is removed by polishing back through CMP (or etching back through dry etching) to leave it only inside of the groove 44, whereby the surface height of the barrier metal film 63 is made equal to that of the BPSG film 57.

Figure 61:
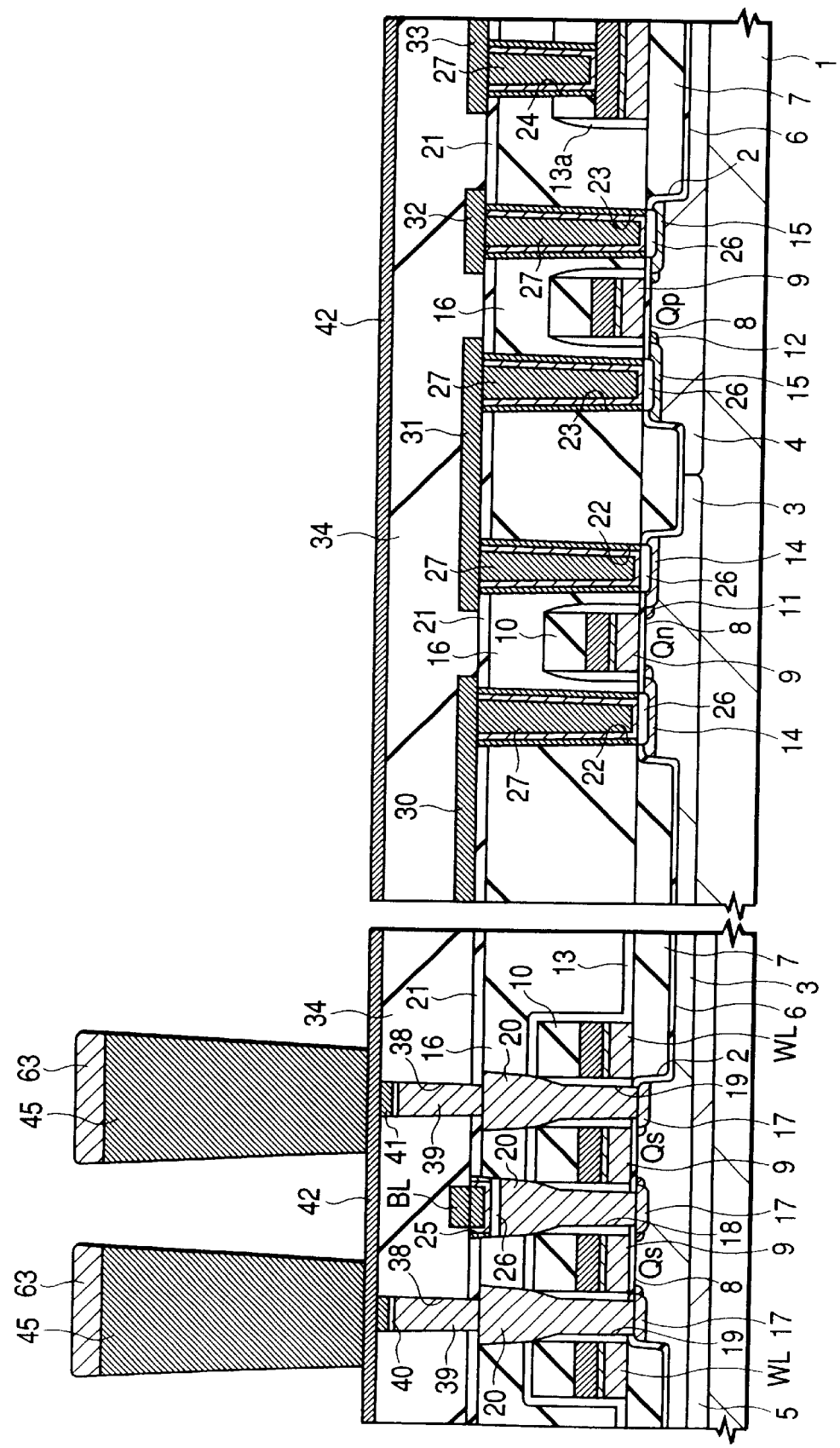
FIG. 61 is a fragmentary cross-sectional view of a substrate illustrating the process for manufacturing a DRAM according to Embodiment 5 of the present invention.
Figure 62:
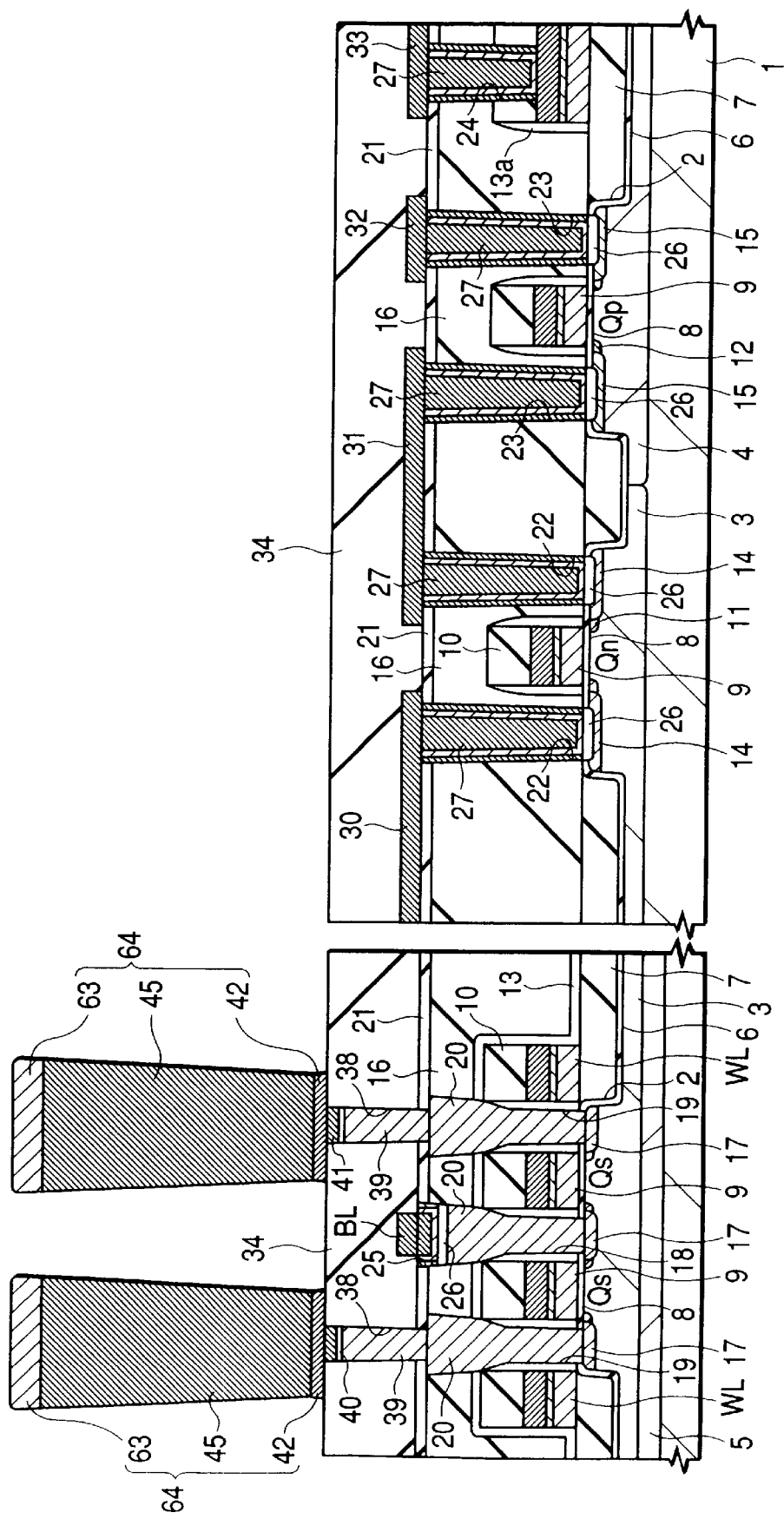
FIG. 62 is a fragmentary cross-sectional view of a substrate illustrating the process for manufacturing a DRAM according to Embodiment 5 of the present invention.

By making use of the difference in the etching rate among the BPSG film, etching barrier film 63, Pt film 45 and conductive underlying film 42, the BPSG film 57 is selectively etched by wet etching as illustrated in FIG. 61 and then, the conductive underlying film 42 is anisotropically dry etched with the barrier metal film 63 as a mask as illustrated in FIG. 62, whereby a lower electrode 64 comprising the barrier metal film 63, Pt film 45 and conductive underlying film 42 is formed.

Owing to the formation of the barrier metal film 63, which is different from the conductive underlying film 42 in etching rate, over the Pt film 45, the Pt film 45 is not etched upon anisotropic dry etching of the conductive underlying film 42. This makes it possible to suppress a decrease in the height of the lower electrode 64, thereby suppressing a decrease in the surface area. When BST is used as the capacitative insulating film in the subsequent steps as in Embodiments 1 to 4, it is desired to remove the barrier metal film before formation of the capacitative insulating film, because when oxidation of the barrier metal occurs during contact with BST or during crystallization annealing of BST in an oxygen atmosphere, there is a possibility of the capacity lowering with an increase in the resistance due to oxidation. A description of each of the subsequent steps is omitted because it is similar to Embodiment 1 to 4.

(Embodiment 6)

FIG. 63 is a cross-sectional view illustrating a step of forming an information storing capacitor C by any one of the processes of Embodiments 1 to 5, depositing thereover a silicon oxide film 50 by CVD, and then flattening its surface by CMP. In the subsequent step, second interconnection layers are formed over the silicon oxide film 50 covering the information storing capacitor C (refer to FIG. 31).

The silicon oxide film 50 is formed by CVD using monosilane or plasma CVD using oxygen and tetraethoxysilane. The silicon oxide film 50 formed in such a manner contains a considerable amount of hydrogen. When the capacitative insulating film 47 and the upper electrode 48 of the information storing capacitor C are formed of a high dielectric film or ferroelectric film, such as BST, having a perovskite crystal structure and a platinum metal or a platinum alloy, respectively, hydrogen contained in the silicon oxide film 50 tends to reduce the capacitative insulating film 47 and deteriorate its properties, activated by the platinum metal or platinum alloy.

In this Embodiment, as illustrated in FIG. 63, a hydrogen-sparingly-permeable insulating film 65 is formed between the upper electrode 48 of the information storing capacitor C and the silicon oxide film 50 and diffusion of hydrogen, which has been contained in the silicon oxide film 50, into the upper electrode 48 is blocked by this insulating film 65. As such a hydrogen-sparingly-permeable insulating film 65, a silicon nitride film deposited by CVD can be exemplified.

The invention made by the present inventors have so far been described based on several embodiments of the present invention. It is needless to say that the present invention is not limited to these embodiments and can be modified within a range not departing from the scope of the invention.

The present invention can be applied to a logic LSI having DRAM mounted thereon or a microcomputer integrated with a DRAM or flash memory. The present invention can also be applied to Fe (Ferroelectric) RAM (ferroelectric memory) or a decoupling capacitor for countermeasures against the noise of logic LSI.

Among the features disclosed according to the present invention, effects available by representative ones will next be described simply.

According to the present invention, a lower electrode, which comprises a film composed mainly of a platinum metal, a platinum alloy or a conductive oxide of a platinum metal, can be formed with a pattern of desired accuracy so that the amount of accumulative charge of the information storing capacitor can be maintained even if the memory cell is miniaturized, making it possible to promote miniaturization of a DRAM, having a capacitor wherein the above-described material is used as an electrode material.

What is claimed is:

1. A process for manufacturing a semiconductor integrated circuit device having a memory cell which comprises a memory-cell selecting MISFET formed on the main surface of a semiconductor substrate, and a capacitor formed of a first electrode electrically connected to one of a source and a drain of the memory-cell selecting MISFET and a second electrode formed over the upper surface and side surface of the first electrode via a capacitative insulating film, which comprises:

(a) forming the memory-selecting MISFET on the main surface of the semiconductor substrate and then forming thereover a first insulating film;
   (b) forming a conductive underlying film over the first insulating film and then forming thereover a second insulating film;
   (c) forming a groove in the second insulating film and then exposing the conductive underlying film at the bottom portion of the groove;
   (d) forming a conductor film, which is comprised mainly of a platinum metal, a platinum alloy or a conductive oxide of a platinum metal, over the conductive underlying film exposed at the bottom portion of the groove by electroplating with the conductive underlying film as a cathode electrode and embedding the conductor film inside the groove,
wherein the embedding of the conductor film inside the groove further comprises (i) forming the conductor film to give a film thickness not less than the depth of the groove by electroplating with the conductive underlying film as a cathode electrode, and (ii) polishing back the conductor film by chemical mechanical polishing or etching back the conductor film by dry etching until at least the upper surface of the second insulating film is exposed; and
   (e) after the removal of the second insulating film, removing the conductive underlying film by etching with the conductor film as a mask, thereby forming the first electrode of the capacitor which is formed of the conductor film and the conductive underlying film thereunder.

2. The process according to claim 1, wherein the shoulder portion of the lower electrode is rounded upon formation of the lower electrode by removing the conductive underlying film by etching with the conductor film as a mask.

3. A process for manufacturing a semiconductor integrated circuit device having a memory cell which comprises a memory-cell selecting MISFET formed on the main surface of a semiconductor substrate, and a capacitor formed of a first electrode electrically connected to one of a source and a drain of the memory-cell selecting MISFET and a second electrode formed over the upper surface and side surface of the first electrode via a capacitative insulating film, which comprises:

(a) forming the memory-selecting MISFET on the main surface of the semiconductor substrate and then forming thereover a first insulating film;
   (b) forming a second insulating film over the first insulating film;
   (c) forming a groove in the second insulating film;
   (d) forming a conductive underlying film over the second insulating film including the inside of the groove and then forming over the conductive underlying film a conductor film comprised mainly of a platinum metal, a platinum alloy or a conductive oxide of a platinum metal,
wherein the process of forming the conductor film comprises forming the conductor film to achieve a film thickness not less than the depth of the groove by electroplating with the conductive underlying film as a cathode electrode;
   (e) removing the conductor film and conductive underlying film over the second insulating film, thereby leaving the conductor film and conductive underlying film inside the groove; and
   (f) removing the second insulating film, thereby forming the first electrode which is formed of the conductor film and the conductive underlying film.

4. The process according to claim 3, wherein the removal of the second insulating film in the step (f) is carried out without removing the second insulating film in a peripheral circuit region.

5. The process according to claim 3, wherein the second insulating film in a peripheral circuit region is removed upon removal of the second insulating film in the step (f).

6. The process according to claim 3, wherein the second insulating film is formed of a silicon nitride insulating film and a silicon oxide insulating film formed thereover and upon formation of the groove in the second insulating film, the silicon oxide insulating film is etched with the silicon nitride insulating film as a stopper for etching, followed by etching of the silicon nitride insulating film.

7. The process according to claim 3, wherein the conductor film is formed by any one of electroplating using the conductive underlying film as a cathode electrode, electroless plating using the conductive underlying film as a catalyst and selective CVD.

8. A process for manufacturing a semiconductor integrated circuit device having a memory cell which comprises a memory-cell selecting MISFET formed on the main surface of a semiconductor substrate, and a capacitor formed of a first electrode electrically connected to one of a source and a drain of the memory-cell selecting MISFET and a second electrode formed over the upper surface and the side surface of the first electrode via a capacitative insulating film, which comprises:

(a) forming the memory-selecting MISFET on the main surface of the semiconductor substrate and then forming thereover a first insulating film;
   (b) forming a first conductive underlying film over the the first insulating film;
   (c) forming a second insulating film over the first conductive underlying film;
   (d) forming a groove in the second insulating film and then forming a second conductive underlying film over the second insulating film including the inside of the groove;

(e) forming over the second conductive underlying film a conductor film comprised mainly of a platinum metal, a platinum alloy or a conductive oxide of a platinum metal;

(f) removing the conductor film and the second conductive underlying film over the second insulating film, thereby leaving the conductor film and the second conductive underlying film inside the groove; and (g) after removal of the second insulating film, etching the first conductive underlying film with the conductor film and the second conductive underlying film as a mask, thereby forming a first electrode of the capacitor which is formed of the conductor film and the first and second conductive underlying films, wherein the thickness of the conductor film is larger than the total thickness of the first and the second conductive underlying films.

9. The process according to claim 8, wherein the shoulder portion of the lower electrode is rounded in the step of etching the first conductive underlying film with the conductor film and the second conductive underlying film as a mask.

10. The process according to claim 8, wherein the conductor film is formed by electroplating using the first and second conductive underlying films as a cathode electrode.

11. The process according to claim 8, wherein the etching in the step (g) is carried out by a method which makes the etching rate of a material constituting the first conductive underlying film larger than that of a material constituting the conductor film.

12. The process according to claim 8, wherein the first conductive underlying film and the second conductive underlying film are each made of a film comprised mainly of a platinum metal, a platinum alloy or a conductive oxide of a platinum metal.

13. A process for manufacturing a semiconductor integrated circuit device having a memory cell which comprises a memory-cell selecting MISFET formed on the main surface of a semiconductor substrate, and a capacitor formed of a first electrode electrically connected to one of a source and a drain of the memory-cell selecting MISFET and a second electrode formed over the upper surface and the side surface of the first electrode via a capacitative insulating film, which comprises:

(a) forming the memory-selecting MISFET on the main surface of the semiconductor substrate and then forming thereover a first insulating film;

(b) forming a conductive underlying film over the first insulating film;

(c) forming a second insulating film over the conductive underlying film;

(d) after formation of a groove in the second insulating film, carrying out sputter etching of the conductive underlying film exposed at the bottom portion of the groove to re-precipitate a portion of the conductive underlying film on the side wall of the groove; and (e) forming, over the portions of the conductive underlying film exposed at the bottom portion of the groove and re-precipitated on the side wall of the groove, a conductor film comprised mainly of a platinum metal, a platinum alloy or a conductive oxide of a platinum metal, thereby forming a first electrode of the capacitor.

14. The process according to claim 13, wherein the conductor film is formed by the film formation method which permits a higher film growth rate over the conductive underlying film compared with that over the second insulating film.

15. The process according to claim 13, wherein the conductor film is formed by any one of electroplating using the conductive underlying film as a cathode electrode, electroless plating using the conductive underlying film as a catalyst and selective CVD.

16. A process for manufacturing a semiconductor integrated circuit device having a memory cell which comprises a memory-cell selecting MISFET formed on the main surface of a semiconductor substrate, and a capacitor formed of a first electrode electrically connected to one of a source and a drain of the memory-cell selecting MISFET and a second electrode formed over the upper surface and the side surface of the first electrode via a capacitative insulating film, which comprises:

(a) forming the memory-selecting MISFET on the main surface of the semiconductor substrate and then forming thereover a first insulating film;

(b) forming a second insulating film over the first insulating film;

(c) forming a groove in the second insulating film;

(d) forming inside the groove a conductor film comprised mainly of a platinum metal, a platinum alloy or a conductive oxide of a platinum metal by plating or selective CVD, thereby forming the first electrode of the capacitor, wherein the process of forming the conductor film inside the groove comprises forming the conductor film to achieve a film thickness of the first electrode not less than the depth of the groove; and (e) removing the second insulating film covering the side wall of the first electrode of the capacitor.

17. A process for manufacturing a semiconductor integrated circuit device having a memory cell which comprises a memory-cell selecting MISFET formed on the main surface of a semiconductor substrate, and a capacitor formed of a first electrode electrically connected to one of a source and a drain of the memory-cell selecting MISFET and a second electrode formed over the upper surface and the side surface of the first electrode through a capacitative insulating film, which comprises:

(a) forming the memory-selecting MISFET on the main surface of the semiconductor substrate and then forming thereover a first insulating film;

(b) forming a conductive underlying film over the first insulating film;

(c) forming a second insulating film over the conductive underlying film;

(d) after formation of a groove in the second insulating film, forming a conductor film, which is comprised mainly of a platinum metal, a platinum alloy or a conductive oxide of a platinum metal, over the conductive underlying film exposed at the bottom portion of the groove, thereby embedding the conductor film inside the groove so that the surface height of the conductor film becomes lower than that of the second insulating film;

(e) forming an etching barrier film over the conductor film inside the groove; and (f) by making use of the difference in an etching rate among the etching barrier film, the second insulating film, the conductor film and the conductive underlying film, selectively removing the second insulating film by etching, removing the conductive underlying film by etching with the etching barrier film as a mask and selectively removing the etching barrier film, thereby forming the first electrode of the capacitor constituted of the barrier film, the conductor film and the conductive underlying film and having a thickness not less than the depth of the groove.

18. The process according to claim 1, wherein upon formation of the conductor film by electroplating, the first insulating film is removed and a terminal on a negative electrode side is connected to a region wherein the conductive underlying film is exposed.

19. The process according to claim 1, wherein the etching in the step (e) is conducted by a method which permits an etching rate of a material constituting the conductive underlying film greater than that of a material constituting the conductor material.

20. The process according to claim 1, wherein the capacitative insulating film is formed so as to cover the side wall portion of the conductive underlying film formed by etching in the step (e).

21. The process according to claim 6, wherein upon removal of the second insulating film in the step (f), the silicon oxide insulating film is removed with the silicon nitride insulating film as an etching stopper and the silicon nitride insulating film is left without being removed.

22. The process according to claim 1, wherein the conductive underlying film is comprised mainly of a platinum metal, a platinum alloy or a conductive oxide of a platinum metal.

23. The process according to claim 3, wherein the conductive underlying film is comprised mainly of a platinum metal, a platinum alloy or a conductive oxide of a platinum metal.

24. The process according to claim 13, wherein the conductive underlying film is comprised mainly of a platinum metal, a platinum alloy or a conductive oxide of a platinum metal.

25. The process according to claim 17, wherein the conductive underlying film is comprised mainly of a platinum metal, a platinum alloy or a conductive oxide of a platinum metal.

26. The process according to claim 1, wherein the capacitative insulating film is comprised mainly of a high dielectric film or ferroelectric film having a perovskite or complex perovskite crystal structure.

27. The process according to claim 3, wherein the capacitative insulating film is comprised mainly of a high dielectric film or ferroelectric film having a perovskite or complex perovskite crystal structure.

28. The process according to claim 8, wherein the capacitative insulating film is comprised mainly of a high dielectric film or ferroelectric film having a perovskite or complex perovskite crystal structure.

29. The process according to claim 13, wherein the capacitative insulating film is comprised mainly of a high dielectric film or ferroelectric film having a perovskite or complex perovskite crystal structure.

30. The process according to claim 16, wherein the capacitative insulating film is comprised mainly of a high dielectric film or ferroelectric film having a perovskite or complex perovskite crystal structure.

31. The process according to claim 17, wherein the capacitative insulating film is comprised mainly of a high dielectric film or ferroelectric film having a perovskite or complex perovskite crystal structure.

32. The process according to claim 1, wherein the capacitative insulating film comprises a film comprised mainly of any one of PZT, PLT, PLZT, $PbTiO_3$, $SrTiO_3$, $BaTiO_3$, BST, SBT and $Ta_2O_5$.

33. The process according to claim 3, wherein the capacitative insulating film comprises a film comprised mainly of any one of PZT, PLT, PLZT, $PbTiO_3$, $SrTiO_3$, $BaTiO_3$, BST, SBT and $Ta_2O_5$.

34. The process according to claim 8, wherein the capacitative insulating film comprises a film comprised mainly of any one of PZT, PLT, PLZT, $PbTiO_3$, $SrTiO_3$, $BaTiO_3$, BST, SBT and $Ta_2O_5$.

35. The process according to claim 13, wherein the capacitative insulating film comprises a film comprised mainly of any one of PZT, PLT, PLZT, $PbTiO_3$, $SrTiO_3$, $BaTiO_3$, BST, SBT and $Ta_2O_5$.

36. The process according to claim 16, wherein the capacitative insulating film comprises a film comprised mainly of any one of PZT, PLT, PLZT, $PbTiO_3$, $SrTiO_3$, $BaTiO_3$, BST, SBT and $Ta_2O_5$.

37. The process according to claim 17, wherein the capacitative insulating film comprises a film comprised mainly of any one of PZT, PLT, PLZT, $PbTiO_3$, $SrTiO_3$, $BaTiO_3$, BST, SBT and $Ta_2O_5$.

38. A process for manufacturing a semiconductor integrated circuit device having a memory cell which comprises a memory-cell selecting MISFET formed on the main surface of a semiconductor substrate, and a capacitor formed of a first electrode electrically connected to one of a source and a drain of the memory-cell selecting MISFET and a second electrode formed over the upper surface and side surface of the first electrode via a capacitative insulating film, which comprises:

(a) forming the memory-selecting MISFET on the main surface of the semiconductor substrate and then forming thereover a first insulating film;

(b) forming a conductive underlying film over the first insulating film and then forming thereover a second insulating film;

(c) forming a groove in the second insulating film and then exposing the conductive underlying film at the bottom portion of the groove;

(d) forming a conductor film, which has a thickness larger than that of the conductive underlying film and which is comprised mainly of a platinum metal, a platinum alloy or a conductive oxide of a platinum metal, over the conductive underlying film exposed at the bottom portion of the groove by electroplating with the conductive underlying film as a cathode electrode and embedding the conductor film inside the groove; and (e) after the removal of the second insulating film, removing the conductive underlying film by etching with the conductor film as a mask, thereby forming the first electrode of the capacitor which is formed of the conductor film and the conductive underlying film thereunder.

* * * * *